United States Patent
Sakaguchi et al.

(10) Patent No.: US 11,874,602 B2
(45) Date of Patent: Jan. 16, 2024

(54) LITHOGRAPHIC PRINTING PLATE PRECURSOR, METHOD FOR PREPARING LITHOGRAPHIC PRINTING PLATE, AND LITHOGRAPHIC PRINTING METHOD

(71) Applicant: FUJIFILM Corporation, Tokyo (JP)

(72) Inventors: Akira Sakaguchi, Shizuoka (JP); Akinori Fujita, Shizuoka (JP); Taira Murakami, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/706,006

(22) Filed: Mar. 28, 2022

(65) Prior Publication Data

US 2022/0229365 A1 Jul. 21, 2022

Related U.S. Application Data

(63) Continuation of application No. PCT/JP2020/027515, filed on Jul. 15, 2020.

(30) Foreign Application Priority Data

Sep. 30, 2019 (JP) .................................. 2019-180623
Feb. 28, 2020 (JP) .................................. 2020-034239

(51) Int. Cl.
*G03F 7/004* (2006.01)
*B41C 1/10* (2006.01)
*G03F 7/029* (2006.01)

(52) U.S. Cl.
CPC .......... *G03F 7/0045* (2013.01); *B41C 1/1016* (2013.01); *B41C 1/1025* (2013.01); *G03F 7/029* (2013.01); *B41C 2210/04* (2013.01)

(58) Field of Classification Search
None
See application file for complete search history.

(56) References Cited

U.S. PATENT DOCUMENTS

| 2010/0190105 A1 | 7/2010 | Venneman et al. |
| 2017/0123315 A1 | 5/2017 | Mizuno et al. |

(Continued)

FOREIGN PATENT DOCUMENTS

| EP | 1 182 032 A2 | 2/2002 |
| EP | 3 632 695 A1 | 4/2020 |

(Continued)

OTHER PUBLICATIONS

International Search Report dated Oct. 13, 2020 in International Application No. PCT/JP2020/027515.

(Continued)

*Primary Examiner* — Joshua D Zimmerman

(74) *Attorney, Agent, or Firm* — Sughrue Mion, PLLC

(57) ABSTRACT

Provided is a lithographic printing plate precursor having a support and an image-recording layer on the support, in which the image-recording layer has an infrared absorber, a polymerization initiator, a polymerizable compound 1, a polymerizable compound 2, and a polymerizable compound 3, in which a molecular weight of the polymerizable compound 1 is less than 1,000, a weight-average molecular weight of the polymerizable compound 2 is 1,000 or more and 3,000 or less, and a weight-average molecular weight of the polymerizable compound 3 is more than 3,000 and 15,000 or less.

19 Claims, 2 Drawing Sheets

(56) References Cited

U.S. PATENT DOCUMENTS

| | | |
|---|---|---|
| 2019/0217651 A1 | 7/2019 | Ikeyama et al. |
| 2019/0225002 A1 | 7/2019 | Watanabe et al. |
| 2020/0041899 A1 | 2/2020 | Ishiji et al. |
| 2020/0164629 A1* | 5/2020 | Nakamura .............. G03F 7/029 |
| 2020/0262231 A1 | 8/2020 | Watanabe et al. |
| 2020/0276851 A1 | 9/2020 | Ikeyama et al. |
| 2020/0353741 A1 | 11/2020 | Araki |
| 2020/0353768 A1 | 11/2020 | Ikeyama et al. |

FOREIGN PATENT DOCUMENTS

| | | |
|---|---|---|
| JP | 2004-347676 A | 12/2004 |
| JP | 2012-200959 A | 10/2012 |
| JP | 2016-179592 A | 10/2016 |
| JP | 2019-064269 A | 4/2019 |
| WO | 2016/027886 A1 | 2/2016 |
| WO | 2018/181993 A1 | 10/2018 |
| WO | 2018/221618 A1 | 12/2018 |
| WO | 2019/013268 A1 | 1/2019 |
| WO | 2019/102771 A1 | 5/2019 |
| WO | 2019/150788 A1 | 8/2019 |

OTHER PUBLICATIONS

Written Opinion of the International Searching Authority dated Oct. 13, 2020 in International Application No. PCT/JP2020/027515.
International Preliminary Report on Patentability dated Apr. 5, 2022 in International Application No. PCT/JP2020/027515.
Office Action dated Nov. 29, 2022 from the Japanese Patent Office in Application No. 2021-550361.
Extended European Search Report dated Feb. 24, 2023 in Application No. 20870771.1.
Communication dated Jun. 27, 2023, issued in Japanese Application No. 2021-550361.

* cited by examiner

LITHOGRAPHIC PRINTING PLATE PRECURSOR, METHOD FOR PREPARING LITHOGRAPHIC PRINTING PLATE, AND LITHOGRAPHIC PRINTING METHOD

CROSS-REFERENCE TO RELATED APPLICATIONS

This application is a continuation application of International Application No. PCT/JP2020/027515, filed Jul. 15, 2020, which was published under PCT Article 21(2) in Japanese, and which claims priority from Japanese Patent Application No. 2019-180623, filed Sep. 30, 2019, and Japanese Patent Application No. 2020-034239, filed Feb. 28, 2020. The above applications are hereby expressly incorporated by reference, in its entirety, into the present specification.

BACKGROUND OF THE INVENTION

1. Field of the Invention

The present disclosure relates to a lithographic printing plate precursor, a method for preparing a lithographic printing plate, and a lithographic printing method.

2. Description of the Related Art

Generally, a lithographic printing plate consists of a lipophilic image area that receives ink in a printing process and a hydrophilic non-image area that receives dampening water. Lithographic printing is a method exploiting the mutual repulsion of water and oil-based ink, in which the lipophilic image area and the hydrophilic non-image area of a lithographic printing plate are used as an ink-receiving portion and a dampening water-receiving portion (non-ink-receiving portion) respectively, the adhesiveness of ink is varied within the surface of the lithographic printing plate so that only the image area receives the ink, and then printing is performed by the transfer of the ink to a printing substrate such as paper.

In the related art, in order to prepare this lithographic printing plate, a lithographic printing plate precursor (PS plate) has been widely used which is obtained by providing a lipophilic photosensitive resin layer (image-recording layer) on a hydrophilic support. Generally, a lithographic printing plate is obtained by a plate making method of exposing a lithographic printing plate precursor through an original picture such as a lith film, then keeping a portion of an image-recording layer that will be an image area while removing other unnecessary portions of the image-recording layer by dissolving such portions in an alkaline developer or an organic solvent, and forming a non-image area by exposing the hydrophilic surface of a support.

In response to the intensifying interest in the global environment, an environmental issue of waste liquid generated by wet treatments such as a development treatment has gathered more attention.

Regarding the environmental issue described above, an attempt is made to simplify development or plate making or to remove treatments. As one of simple preparation methods, a method called "on-press development" is being carried out. That is, in this method, after being exposed, a lithographic printing plate precursor is immediately mounted on a printer without being developed as in the related art, and an unnecessary portion of the image-recording layer is removed at an early stage of the ordinary printing step.

Examples of the lithographic printing plate precursors in the related art include those described in WO2018/181993A.

In addition, WO2018/181993A describes a lithographic printing plate precursor that has a water-soluble or water-dispersible negative tone image-recording layer on a hydrophilized aluminum support, in which an arithmetic mean height Sa of a surface of an outermost layer on a side provided with the image-recording layer is 0.3 μm or more and 20 μm or less.

Examples of plate surface treatment agents for lithographic printing plates in the related art include those described in JP2012-200959A.

JP2012-200959A describes a plate surface treatment agent for a lithographic printing plate, which contains a star-shaped polymer having at least one support absorptive group and at least one hydrophilic group.

SUMMARY OF THE INVENTION

An object of an embodiment of the present invention is to provide a lithographic printing plate precursor which has excellent developability and makes it possible to obtain a lithographic printing plate showing excellent printing durability even in a case where a UV ink is used.

An object of another embodiment of the present invention is to provide a method for preparing a lithographic printing plate or a lithographic printing method using the lithographic printing plate precursor.

Means for achieving the above objects include the following aspects.

<1> A lithographic printing plate precursor having a support and an image-recording layer on the support, in which the image-recording layer has an infrared absorber, a polymerization initiator, a polymerizable compound 1, a polymerizable compound 2, and a polymerizable compound 3, in which a molecular weight of the polymerizable compound 1 is less than 1,000, a weight-average molecular weight of the polymerizable compound 2 is 1,000 or more and 3,000 or less, and a weight-average molecular weight of the polymerizable compound 3 is more than 3,000 and 15,000 or less.

<2> The lithographic printing plate precursor described in <1>, in which the number of functional groups of an ethylenically unsaturated group in one molecule of at least one kind of polymerizable compound included in the polymerizable compound 2 is larger than the number of functional groups in one molecule of a polymerizable compound included in the polymerizable compound 1.

<3> The lithographic printing plate precursor described in <1> or <2>, in which a ratio of a content M3 of the polymerizable compound 3 to a total content M1+M2+M3 of the polymerizable compound 1, the polymerizable compound 2 and the polymerizable compound 3 (M3/(M1+M2+M3)) is 0.1 to 0.8.

<4> The lithographic printing plate precursor described in any one of <1> to <3>, in which a ratio of a content M2 of the polymerizable compound 2 to a total content M1+M2 of the polymerizable compound 1 and the polymerizable compound 2 (M2/(M1+M2)) is 0.05 to 0.4.

<5> The lithographic printing plate precursor described in any one of <1> to <4>, in which an ethylenically unsaturated bond valence of the polymerizable compound 3 is 3.0 mmol/g or more.

<6> The lithographic printing plate precursor described in any one of <1> to <5>, in which the polymerizable compound 3 is a compound represented by Formula (I).

$$A^P\text{-}(B^P)_{nP} \qquad \text{Formula (I)}$$

In Formula (I), $A^P$ represents an nP-valent organic group having a hydrogen bonding group, $B^P$ represents a group having two or more polymerizable groups, and nP represents an integer of two or more.

<7> The lithographic printing plate precursor described in any one of <1> to <6>, in which the polymerizable compound 3 has at least one kind of structure selected from the group consisting of an adduct structure, a biuret structure, and an isocyanurate structure.

<8> The lithographic printing plate precursor described in any one of <1> to <7>, in which the polymerizable compound 3 has a structure represented by any of Formula (A-1) to Formula (A-3).

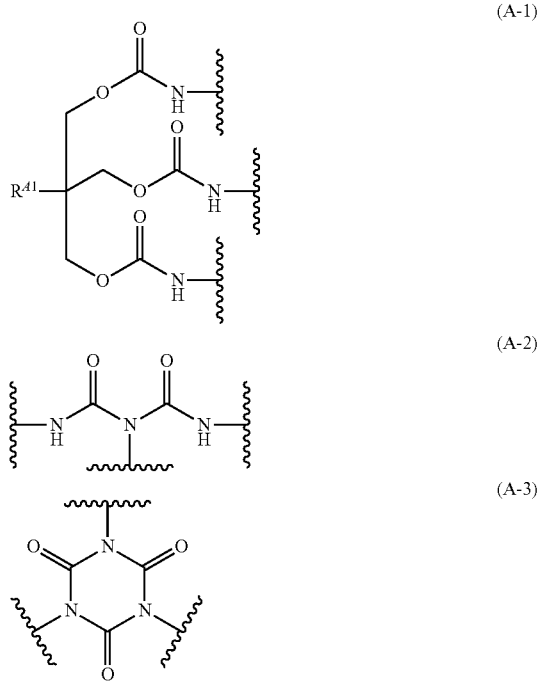

In Formula (A-1), $R^{41}$ represents a hydrogen atom or an alkyl group having 1 to 8 carbon atoms, and a portion of a wavy line represents a bonding position with other structures.

<9> The lithographic printing plate precursor described in <6>, in which the polymerizable group in $B^P$ includes a (meth)acryloxy group.

<10> The lithographic printing plate precursor described in <6> or <9>, in which the polymerizable group in $B^P$ is a group having 3 or more (meth)acryloxy groups.

<11> The lithographic printing plate precursor described in <6>, in which the hydrogen bonding group in the polymerizable compound 3 is at least one kind of group selected from the group consisting of a urethane group, a urea group, an imide group, an amide group, and a sulfonamide group.

<12> The lithographic printing plate precursor described in any one of <1> to <11>, in which the image-recording layer is an outermost layer.

<13> The lithographic printing plate precursor described in any one of <1> to <12>, in which the image-recording layer further contains polymer particles.

<14> The lithographic printing plate precursor described in <13>, in which the polymer particles have a hydrophilic group.

<15> The lithographic printing plate precursor described in <14>, in which the hydrophilic group is a hydrophilic group represented by Formula Z.

$$*-Q-W-Y \qquad \text{Formula Z}$$

In formula Z, Q represents a divalent linking group, W represents a divalent group having a hydrophilic structure or a divalent group having a hydrophobic structure, Y represents a monovalent group having a hydrophilic structure or a monovalent group having a hydrophobic structure, either W or Y has a hydrophilic structure, and * represents a bonding site with other structures.

<16> The lithographic printing plate precursor described in <14> or <15>, in which the hydrophilic group includes a polyalkylene oxide structure.

<17> The lithographic printing plate precursor described in any one of <13> to <16>, in which the polymer particles contain a constitutional unit formed of an aromatic vinyl compound.

<18> The lithographic printing plate precursor described in any one of <1> to <17>, in which the polymerization initiator includes an electron-donating polymerization initiator.

<19> The lithographic printing plate precursor described in <18>, in which HOMO of the infrared absorber—HOMO of the electron-donating polymerization initiator is 0.70 eV or less.

<20> The lithographic printing plate precursor described in any one of <1> to <19>, in which the image-recording layer further contains a color developing agent.

<21> The lithographic printing plate precursor described in any one of <1> to <20>, in which the support has an aluminum plate and an anodic oxide film of aluminum disposed on the aluminum plate, the anodic oxide film is at a position closer to a side of the image-recording layer than the aluminum plate and has micropores extending in a depth direction from a surface of the anodic oxide film on the side of the image-recording layer, an average diameter of the micropores within the surface of the anodic oxide film is more than 10 nm and 100 nm or less, and in the L*a*b* color space, a value of brightness L* of the surface of the anodic oxide film on the side of the image-recording layer is 70 to 100.

<22> The lithographic printing plate precursor described in <21>, in which the micropores are each composed of a large diameter portion that extends to a position at a depth of 10 nm to 1,000 nm from the surface of the anodic oxide film and a small diameter portion that is in communication with a bottom portion of the large diameter portion and extends to a position at a depth of 20 nm to 2,000 nm from a communication position, an average diameter of the large diameter portion within the surface of the anodic oxide film is 15 nm to 100 nm, and an average diameter of the small diameter portion at the communication position is 13 nm or less.

<23> The lithographic printing plate precursor described in any one of <1> to <22>, further having a protective layer containing a discoloring compound on the image-recording layer.

<24> The lithographic printing plate precursor described in <23>, in which in a case where the lithographic printing plate precursor is exposed to infrared having a wavelength of 830 nm at an energy density of 110 mJ/cm², a brightness change ΔL before and after the exposure is 2.0 or more.

<25> The lithographic printing plate precursor described in <23> or <24>, in which the discoloring compound includes a compound that develops color due to exposure to infrared.

<26> The lithographic printing plate precursor described in any one of <23> to <25>, in which the discoloring compound includes a decomposable compound that decomposes due to exposure to infrared.

<27> The lithographic printing plate precursor described in <26>, in which the discoloring compound includes a decomposable compound that decomposes by either or both of heat and electron transfer resulting from exposure to infrared.

<28> The lithographic printing plate precursor described in any one of <23> to <27>, in which the discoloring compound is a cyanine dye.

<29> The lithographic printing plate precursor described in any one of <23> to <28>, in which the discoloring compound is a compound represented by Formula 1-1.

Formula 1-1

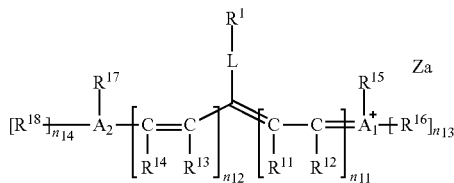

In Formula 1-1, $R^1$ represents a group represented by any of Formula 2 to Formula 4, $R^{11}$ to $R^{18}$ each independently represent a hydrogen atom, a halogen atom, $-R^a$, $-OR^b$, $-SR^c$, or $-NR^dR^e$, $R^a$ to $R^e$ each independently represent a hydrocarbon group, $A_1$, $A_2$, and a plurality of $R_{11}$ to $R_{18}$ may be linked to each other to form a monocyclic or polycyclic ring, $A_1$ and $A_2$ each independently represent an oxygen atom, a sulfur atom, or a nitrogen atom, $n_{11}$ and $n_{12}$ each independently represent an integer of 0 to 5, the sum of $n_{11}$ and $n_{12}$ is 2 or more, $n_{13}$ and $n_{14}$ each independently represent 0 or 1, L represents an oxygen atom, a sulfur atom, or $-NR^{10}-$, $R_{10}$ represents a hydrogen atom, an alkyl group, or an aryl group, and Za represents a counterion that neutralizes charge.

Formula 2

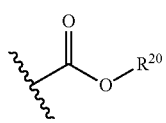

Formula 3

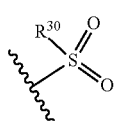

Formula 4

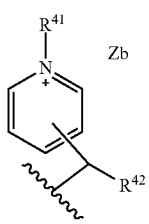

In Formula 2 to Formula 4, $R^{20}$, $R^{30}$, $R^{41}$, and $R^{42}$ each independently represent an alkyl group or an aryl group, Zb represents a counterion that neutralizes charge, a wavy line represents a bonding site with the group represented by L in Formula 1-1.

<30> The lithographic printing plate precursor described in any one of <23> to <29>, in which the discoloring compound is a compound represented by Formula 1-2.

Formula 1-2

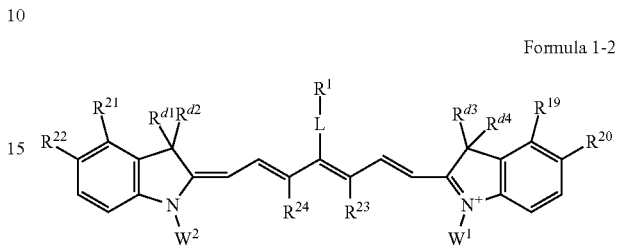

In Formula 1-2, $R^1$ represents a group represented by any of Formula 2 to Formula 4, $R^{19}$ to $R^{22}$ each independently represent a hydrogen atom, a halogen atom, $-R^a$, $-OR^b$, $-CN$, $-SR^c$, or $-NR^dR^e$, $R^{23}$ and $R^{24}$ each independently represent a hydrogen atom or $-R^a$, $R^a$ to $R^e$ each independently represent a hydrocarbon group, $R^{19}$ and $R^{20}$, $R^{21}$ and $R^{22}$, or $R^{23}$ and $R^{24}$ may be linked to each other to form a monocyclic or polycyclic ring, L represents an oxygen atom, a sulfur atom, or $-NR^{10}-$, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

<31> The lithographic printing plate precursor described in any one of <23> to <30>, in which the discoloring compound is a compound represented by any of Formula 1-3 to Formula 1-7.

Formula 1-3

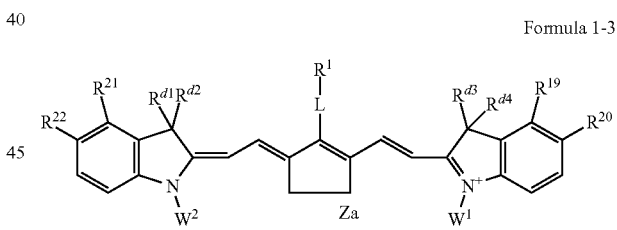

Formula 1-4

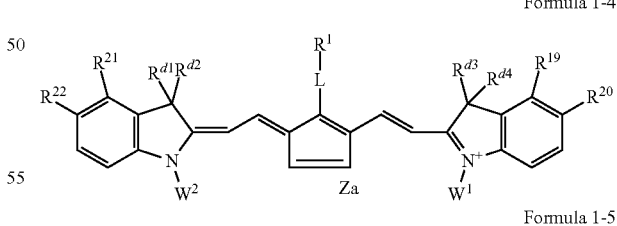

Formula 1-5

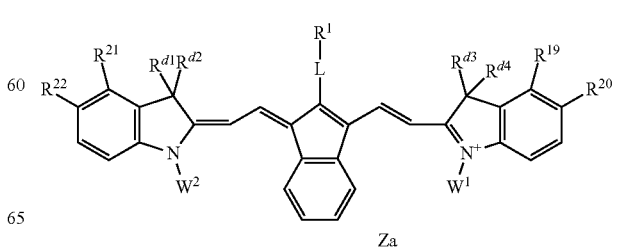

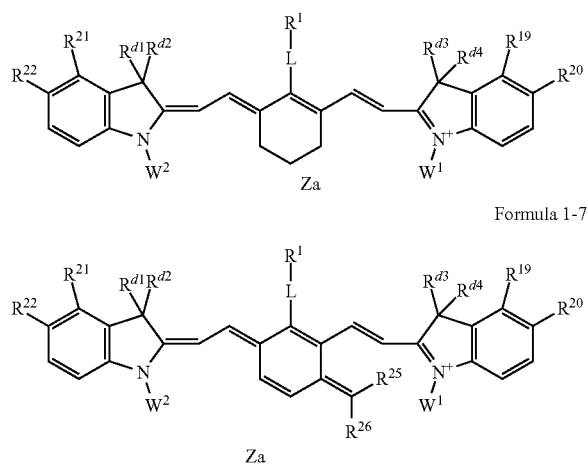

In Formula 1-3 to Formula 1-7, $R^1$ represents a group represented by any of Formula 2 to Formula 4, $R^{19}$ to $R^{22}$ each independently represent a hydrogen atom, a halogen atom, $-R^a$, $-OR^b$, $-CN$, $-SR^c$, or $-NR^dR^e$, $R^{25}$ and $R^{26}$ each independently represent a hydrogen atom, a halogen atom, or $-R^a$, $R^a$ to $R^c$ each independently represent a hydrocarbon group, $R^{19}$ and $R^{20}$, $R^{21}$ and $R^{22}$, or $R^{25}$ and $R^{26}$ may be linked to each other to form a monocyclic or polycyclic ring, L represents an oxygen atom, a sulfur atom, or $-NR^{10}-$, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

<32> The lithographic printing plate precursor described in <30> or <31>, in which $W^1$ and $W^2$ in Formula 1-2 to Formula 1-7 each independently represent an alkyl group having a substituent, and the alkyl group has at least $-(OCH_2CH_2)-$, a sulfo group, a salt of a sulfo group, a carboxy group, or a salt of a carboxy group as the substituent.

<33> The lithographic printing plate precursor described in any one of <30> to <32>, in which L in Formula 1-2 to Formula 1-7 represents an oxygen atom.

<34> The lithographic printing plate precursor described in any one of <23> to <33>, in which $M^X/M^Y$ as a ratio of a content $M^X$ of the discoloring compound in the protective layer to a content $M^Y$ of the infrared absorber in the image-recording layer is 0.2 or more.

<35> The lithographic printing plate precursor described in any one of <23> to <34>, in which the protective layer contains a water-soluble polymer.

<36> The lithographic printing plate precursor described in <35>, in which the water-soluble polymer includes polyvinyl alcohol having a saponification degree of 50% or more.

<37> The lithographic printing plate precursor described in <35> or <36>, in which the water-soluble polymer includes polyvinylpyrrolidone.

<38> The lithographic printing plate precursor described in any one of <35> to <37>, in which the protective layer contains a hydrophobic polymer.

<39> The lithographic printing plate precursor described in <38>, in which the hydrophobic polymer is hydrophobic polymer particles.

<40> The lithographic printing plate precursor described in <38> or <39>, in which the hydrophobic polymer includes a polyvinylidene chloride resin.

<41> The lithographic printing plate precursor described in any one of <38> to <40>, in which the hydrophobic polymer includes a styrene-acrylic copolymer.

<42> The lithographic printing plate precursor described in any one of <23> to <41>, in which the protective layer contains an oil sensitizing agent.

<43> The lithographic printing plate precursor described in any one of <23> to <42> in which an amount of the protective layer is 0.1 g/m² to 2.0 g/m².

<44> A method for preparing a lithographic printing plate, including a step of exposing the lithographic printing plate precursor described in any one of <1> to <43> in the shape of an image, and a step of supplying at least one material selected from the group consisting of a printing ink and dampening water on a printer so as to remove the image-recording layer in a non-image area.

<45> A lithographic printing method including a step of exposing the lithographic printing plate precursor described in any one of <1> to <43> in the shape of an image, a step of supplying at least one material selected from the group consisting of a printing ink and dampening water on a printer so as to remove the image-recording layer in a non-image area and to prepare a lithographic printing plate, and a step of performing printing by using the obtained lithographic printing plate.

According to an embodiment of the present invention, it is possible to provide a lithographic printing plate precursor which has excellent developability and makes it possible to obtain a lithographic printing plate showing excellent printing durability even in a case where a UV ink is used.

According to another embodiment of the present invention, it is possible to provide a method for preparing a lithographic printing plate or a lithographic printing method using the lithographic printing plate precursor.

DESCRIPTION OF THE PREFERRED EMBODIMENTS

Figure 1:
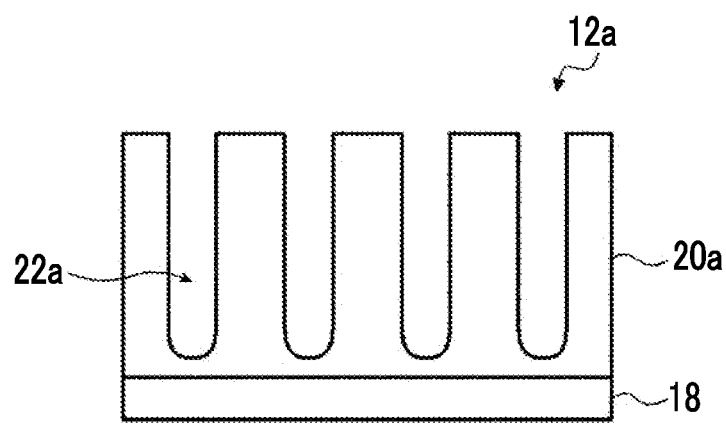
FIG. 1 is a schematic cross-sectional view of an embodiment of an aluminum support.

Hereinafter, the contents of the present disclosure will be specifically described. The following constituents will be described on the basis of typical embodiments of the present disclosure, but the present disclosure is not limited to such embodiments.

In the present specification, a numerical range expressed using "to" includes numerical values listed before and after "to" as the lower limit and the upper limit.

Regarding the numerical ranges described stepwise in the present disclosure, the upper limit or lower limit of a numerical range may be replaced with the upper limit or lower limit of another numerical range described stepwise.

Furthermore, the upper limit or lower limit of a numerical range described in the present disclosure may be replaced with the values shown in Examples.

In addition, in the present specification, in a case where there is no description regarding whether a group (atomic group) is substituted or unsubstituted, such a group includes both a group having no substituent and a group having a substituent. For example, "alkyl group" includes not only an alkyl group having no substituent (unsubstituted alkyl group) but also an alkyl group having a substituent (substituted alkyl group).

In the present specification, "(meth)acryl" is a term used to explain a concept including both the acryl and methacryl, and "(meth)acryloyl" is a term used to explain a concept including both the acryloyl and methacryloyl.

In addition, the term "step" in the present specification means not only an independent step but also a step that cannot be clearly differentiated from other steps as long as the intended goal of the step is achieved. In the present disclosure, "% by mass" has the same definition as "% by weight", and "part by mass" has the same definition as "part by weight".

In the present disclosure, a combination of two or more preferred aspects is a more preferred aspect.

In addition, in the present disclosure, unless otherwise specified, each of the weight-average molecular weight (Mw) and number-average molecular weight (Mn) is a molecular weight that is detected using a gel permeation chromatography (GPC) analysis device using TSKgel GMHxL, TSKgel G4000HxL, and TSKgel G2000HxL (trade names, manufactured by Tosoh Corporation) as columns, tetrahydrofuran (THF) as a solvent, and a differential refractometer, and expressed in terms of polystyrene as a standard substance.

In the present specification, the term "lithographic printing plate precursor" refers not only to a lithographic printing plate precursor but also to a key plate precursor. In addition, the term "lithographic printing plate" refers not only to a lithographic printing plate prepared by performing operations such as exposure and development as necessary on a lithographic printing plate precursor but also to a key plate. The key plate precursor is not necessarily subjected to the operations such as exposure and development. The key plate refers to a lithographic printing plate precursor to be mounted on a plate cylinder that is not used, in a case where monochromatic or dichromatic printing is carried out on a part of paper during, for example, color newspaper printing.

Hereinafter, the present disclosure will be specifically described.

(Lithographic Printing Plate Precursor)

The lithographic printing plate precursor according to the present disclosure has a support and an image-recording layer on the support, in which the image-recording layer has an infrared absorber, a polymerization initiator, a polymerizable compound 1, a polymerizable compound 2, and a polymerizable compound 3, in which a molecular weight of the polymerizable compound 1 is less than 1,000, a weight-average molecular weight of the polymerizable compound 2 is 1,000 or more and 3,000 or less, and a weight-average molecular weight of the polymerizable compound 3 is more than 3,000 and 15,000 or less.

In addition, the lithographic printing plate precursor according to the present disclosure is a negative tone lithographic printing plate precursor and can be suitably used as an on-press development type lithographic printing plate precursor.

As a result of intensive studies, the inventors of the present invention have found that in a case where the above configuration is adopted, it is possible to provide a lithographic printing plate precursor which has excellent developability and makes it possible to obtain a lithographic printing plate showing excellent printing durability even in a case where a UV ink is used.

The detailed mechanism that brings about the aforementioned effect is unclear, but is assumed to be as below.

Having a weight-average molecular weight smaller than that of the polymerizable compound 3, the polymerizable compounds 1 and 2 have a high degree of freedom in the image-recording layer and come in between the molecules of the polymerizable compound 3 in the image-recording layer. Presumably, as a result, the crosslink density in the image-recording layer may be increased, the image-recording layer in a non-exposed portion may be more effectively removed due to the polymerizable compounds 1 and 2 acting as a plasticizer, on-press developability may be maintained as well, and excellent developability (especially, on-press developability) and printing durability (especially UV printing durability) may be obtained accordingly.

The lithographic printing plate precursor according to the present disclosure has the polymerizable compounds 1 to 3 each having a weight-average molecular weight in a specific range. Therefore, the cured image area is prevented from experiencing loss in weight caused by the permeation of ink, dissolution by ink, abrasion by printing, and the like. Consequently, even in a case where a UV ink is used, plate missing is excellently suppressed.

"Plate missing" refers to a phenomenon where the film thickness of the image-recording layer in the lithographic printing plate is reduced, so ink is not applied to some parts of the image-recording layer. The number of sheets printed from the lithographic printing plate until "plate missing" occurs is an indicator showing "plate missing is unlikely to occur".

<Image-Recording Layer>

The image-recording layer in the lithographic printing plate precursor according to the present disclosure contains an infrared absorber, a polymerization initiator, a polymerizable compound 1, a polymerizable compound 2, and a polymerizable compound 3, in which a molecular weight of the polymerizable compound 1 is less than 1,000, a weight-average molecular weight of the polymerizable compound 2 is 1,000 or more and 3,000 or less, and a weight-average molecular weight of the polymerizable compound 3 is more than 3,000 and 15,000 or less.

The image-recording layer in the present disclosure is a negative tone image-recording layer, and is preferably a water-soluble or water-dispersible negative tone image-recording layer.

The image-recording layer in the present disclosure is preferably an on-press development type image-recording layer.

From the viewpoint of developability and UV printing durability, the image-recording layer in the present disclosure is preferably the outermost layer.

Hereinafter, each of the components contained in the image-recording layer will be specifically described.

—Polymerizable Compound 3—

The image-recording layer contains a polymerizable compound 3. The weight-average molecular weight of the polymerizable compound 3 is more than 3,000 and 15,000 or less.

From the viewpoint of developability, UV printing durability, and suppressing UV plate missing, the weight-average molecular weight (Mw) of the polymerizable compound 3 is preferably 5,000 or more and 15,000 or less, more preferably 6,000 or more and 12,000 or less, and particularly preferable 7,000 or more and 13,000 or less.

The weight-average molecular weight Mw of the polymerizable compound 3 and the polymerizable compounds 1 and 2, which will be described later, is measured by the following measurement instrument and method.

GPC measurement instrument: TOSOH HLC-8320GPC (manufactured by Tosoh Corporation)
GPC mobile phase: tetrahydrofuran (THF)
Inspector differential Refractometer (RI)
Flow rate: 0.35 mL/min
Columns: TSKgel SuperHZM-M, TSKgel SuperHZ4000, TSKgel SuperHZ3000, and TSKgel SuperHZ2000 (all of these are manufactured by Tosoh Corporation) are connected and used.
Column temperature: 40° C.
Standard sample for molecular weight calibration curve: polystyrene (PS)

The ethylenically unsaturated bond valence (also called "C=C valence") of the polymerizable compound 3 is preferably 3.0 mmol/g or more. From the viewpoint of developability, UV printing durability, and suppressing UV plate missing, the ethylenically unsaturated bond valence is more preferably 4.0 mmol/g or more, even more preferably 5.0 mmol/g or more, still more preferably 4.5 mmol/g to 12.0 mmol/g, particularly preferably 5.0 mmol/g to 10.0 mmol/g, and most preferably 5.5 mmol/g to 8.5 mmol/g.

The structure of the polymerizable compound 3 is not particularly limited, and may be, for example, a graft polymer, a star-shaped polymer, a hyperbranched polymer, a dendrimer, or the like. Preferable examples thereof include a polymer composed of a multimer (including an adduct) of a polyfunctional isocyanate compound and a compound having an ethylenically unsaturated group that seals the terminal isocyanate group of the multimer as will be described later.

Known star-shaped polymers can be used as the star-shaped polymer. This polymer is preferably a star-shaped polymer having a sulfide bond, and more preferably a star-shaped polymer having a constitutional unit derived from a polyfunctional thiol compound having 3 or more and 10 or less functional groups.

It is preferable that the star-shaped polymer have a polymer chain bonded to a sulfide bond derived from the aforementioned thiol group. The polymer chain preferably has an ethylenically unsaturated group, and more preferably has an ethylenically unsaturated group-containing constitutional unit.

It is preferable that the star-shaped polymer have only one constitutional unit derived from a polyfunctional thiol compound having 3 or more and 10 or less functional groups.

In a case where the star-shaped polymer is a star-shaped macromolecule, the star-shaped macromolecule is preferably an n-star macromolecule, and n is preferably an integer of 3 to 10.

The star-shaped polymer may be a regular star macromolecule or a variegated star macromolecule.

The star-shaped polymer can be manufactured by a known method such as a method of copolymerizing monomers in the presence of a polyfunctional thiol compound having 3 or more and 10 or less functional groups. For details of the manufacturing methods of the star-shaped polymer and polyfunctional thiol compound described above, what is described in JP2012-148555A can be referred to.

The polyfunctional thiol compound having 3 or more and 10 or less functional groups used in the present disclosure is not particularly limited, and is preferably a polyfunctional thiol compound having 3 or more and 8 or less functional groups and more preferably a polyfunctional thiol compound having 3 or more and 6 or less functional groups.

Furthermore, the polyfunctional thiol compound having 3 or more and 10 or less functional groups used in the present disclosure is preferably a compound represented by Formula S-1.

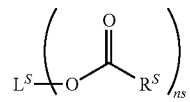

Formula S-1

In Formula S-1, $L^S$ represents an ns-valent hydrocarbon group which may contain an ether bond, $R^S$ represents a monovalent hydrocarbon group having a thiol group as a substituent, and ns represents an integer of 3 to 10.

In Formula S-1, $L^S$ is preferably an ns-valent aliphatic hydrocarbon group which may contain an ether bond, and more preferably an ns-valent unsaturated aliphatic hydrocarbon group which may contain an ether bond.

Specific examples of $L^S$ include a structure established by removing all the hydroxy groups contained in a polyhydric alcohol compound such as pentaerythritol, dipentaerythritol, sorbitol, mannitol, iditol, dulcitol, or inositol. However, $L^S$ is not limited to this.

In Formula S-1, $R^S$ is preferably a monovalent aliphatic hydrocarbon group having a thiol group as a substituent, and more preferably a monovalent unsaturated aliphatic hydrocarbon group having a thiol group as a substituent.

Specific examples of $R^S$ include a mercaptomethyl group, a 2-mercaptoethyl group, a 2-mercaptopropyl group, and the like, but $R^S$ is not limited to these.

In Formula S-1, ns represents an integer of 3 to 10. ns is preferably an integer of 3 to 8, and more preferably an integer of 3 to 6.

As the polyfunctional thiol compound, the compounds A to F described in JP2012-148555A can also be suitably used.

How to introduce a polymerizable group into the star-shaped polymer is not particularly limited. The introduction of a polymerizable group may be performed by a polymer reaction or by the introduction of a polymer chain or the like having an ethylenically unsaturated group.

Examples of the star-shaped polymer include those described WO2019/151361A.

The ethylenically unsaturated bond valence of the polymerizable compound 3 and the polymerizable compounds 1 and 2, which will be described later, can be determined by the following method.

First, for a predetermined amount (for example, 0.2 g) of sample compound, the structure of the compound is specified using, for example, pyrolysis GC/MS, FT-IR, NMR, TOF-SIMS, and the like, and the total amount (mmol) of ethylenically unsaturated groups is determined. The determined total amount (mmol) of ethylenically unsaturated groups is divided by the amount (g) of the sample compound, thereby calculating the ethylenically unsaturated bond valence of the compound.

From the viewpoint of developability and UV printing durability, the polymerizable compound 3 preferably has a hydrogen bonding group and more preferably has 3 or more hydrogen bonding groups.

The hydrogen bonding group may be a group capable of forming a hydrogen bond. The hydrogen bonding group may be either or both of a hydrogen bond donating group and a hydrogen bond accepting group.

Examples of the hydrogen bonding group include a hydroxy group, a carboxy group, an amino group, a carbonyl group, a sulfonyl group, a urethane group, a urea group, an imide group, an amide group, a sulfonamide group, and the like.

Particularly, from the viewpoint of UV printing durability and suppressing UV plate missing, the hydrogen bonding group is preferably at least one kind of group selected from the group consisting of a urethane group, a urea group, an imide group, an amide group, and a sulfonamide group, more preferably at least one kind of group selected from the group consisting of a urethane group, a urea group, an imide group, and an amide group, even more preferably at least one kind of group selected from the group consisting of a urethane group, a urea group, and an imide group, and particularly preferably at least one kind of group selected from the group consisting of a urethane group and a urea group.

From the viewpoint of developability and UV printing durability, the polymerizable compound 3 preferably has a polymerizable group.

The polymerizable group may be, for example, a cationically polymerizable group or a radically polymerizable group. From the viewpoint of reactivity, the polymerizable group is preferably a radically polymerizable group.

The polymerizable group is not particularly limited. From the viewpoint of reactivity, UV printing durability, and suppressing UV plate missing, the polymerizable group is preferably an ethylenically unsaturated group, more preferably at least one kind of group selected from the group consisting of a vinylphenyl group (styryl group), a vinyl ester group, a vinyl ether group, an allyl group, a (meth)acryloxy group, and a (meth)acrylamide group, even more preferably at least one kind of group selected from the group consisting of a vinylphenyl group (styryl group), a (meth)acryloxy group, and a (meth)acrylamide group, and particularly preferably a (meth)acryloxy group.

From the viewpoint of developability and UV printing durability, the polymerizable compound 3 preferably has a structure represented by Formula (Po-1) or Formula (Po-2) as the aforementioned polymerizable group, and more preferably has a structure represented by Formula (Po-1) as the polymerizable group.

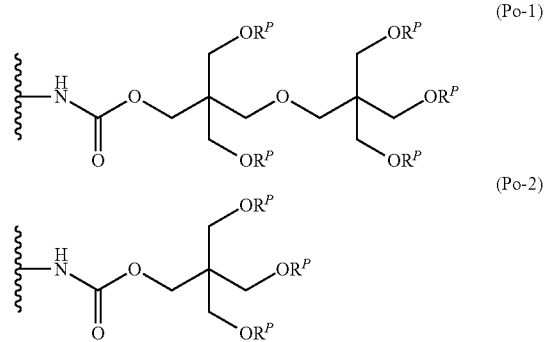

In Formula (Po-1) and Formula (Po-2), $R^P$ each independently represents an acryloyl group or a methacryloyl group, and the portion of the wavy line represents a bonding position with other structures.

It is preferable that all R's in Formula (Po-1) or Formula (Po-2) be the same group. Furthermore, it is preferable that all $R^P$s in Formula (Po-1) or Formula (Po-2) be an acryloyl group.

From the viewpoint of developability and UV printing durability, the polymerizable compound 3 is preferably a (meth)acrylate compound having a urethane group, that is, urethane (meth)acrylate.

Furthermore, from the viewpoint of developability and UV printing durability, the polymerizable compound 3 preferably has a structure established by multimerizing a polyfunctional isocyanate compound, and more preferably has a structure established by multimerizing a difunctional isocyanate compound.

From the viewpoint of developability and UV printing durability, the polymerizable compound 3 is preferably a polymer obtained by reacting a terminal hydroxy group (also called "hydroxyl group")-containing polyfunctional ethylenically unsaturated compound with a terminal of a multimer (including an adduct of a polyfunctional alcohol compound such as a trimethylolpropane adduct) prepared by multimerizing a polyfunctional isocyanate compound, more preferably a polymer obtained by reacting a hydroxy group-containing polyfunctional ethylenically unsaturated compound with a terminal of a multimer (including an adduct of a polyfunctional alcohol compound) prepared by multimerizing a difunctional isocyanate compound, and particularly preferably a polymer obtained by reacting a hydroxy group-containing polyfunctional ethylenically unsaturated compound with a terminal of a multimer (including an adduct of a polyfunctional alcohol compound) prepared by multimerizing hexamethylene diisocyanate.

As the polyfunctional isocyanate compound, known compounds can be used without particular limitation. This compound may be an aliphatic polyfunctional isocyanate compound or an aromatic polyfunctional isocyanate compound.

As the polyfunctional isocyanate compound, specifically, for example, 1,3-bis(isocyanatomethyl) cyclohexane, isophorone diisocyanate, trimethylene diisocyanate, tetramethylene diisocyanate, pentamethylene diisocyanate, hexamethylene diisocyanate, 1,3-cyclopentane diisocyanate, 9H-fluorene-2,7-diisocyanate, 9H-fluoren-9-on-2,7-diisocyanate, 4,4'-diphenylmethane diisocyanate, 1,3-phenylene diisocyanate, tolylene-2,4-diisocyanate, tolylene-2,6-diisocyanate, 1,3-bis(isocyanatomethyl) cyclohexane, 2,2-bis(4-isocyanatophenyl) hexafluoropropane, 1,5-diisocyanatonaphthalene, a dimer or trimer (isocyanurate bond) of these polyisocyanates, and the like are preferable. Furthermore, a biuret compound obtained by reacting the above polyisocyanate compound with a known amine compound may also be used.

Furthermore, the polyfunctional ethylenically unsaturated compound having a hydroxy group is preferably a hydroxy group-containing ethylenically unsaturated compound having 3 or more functional groups, and more preferably a hydroxy group-containing ethylenically unsaturated compound having 5 or more functional groups.

The aforementioned hydroxy group-containing polyfunctional ethylenically unsaturated compound is preferably a polyfunctional (meth)acrylate compound having a hydroxy group.

From the viewpoint of developability and UV printing durability, the polymerizable compound 3 preferably has at least one kind of structure selected from the group consisting of an adduct structure, a biuret structure, and an isocyanurate structure, more preferably has at least one kind of structure selected from the group consisting of a trimethylolpropane adduct structure, a biuret structure, and an isocyanurate structure, and particularly preferably has a trimethylolpropane adduct structure.

From the viewpoint of developability and UV printing durability, the polymer A preferably has a structure represented by any of Formula (A-1) to Formula (A-3), and more preferably has a structure represented by Formula (A-1).

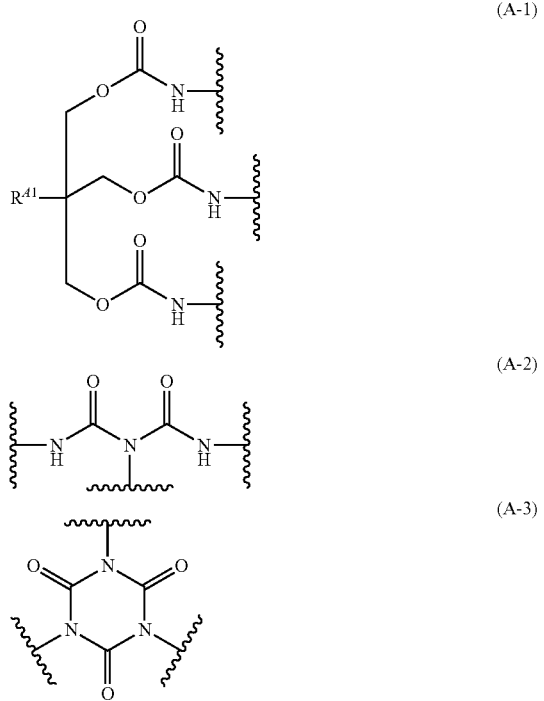

In Formula (A-1), $R^{41}$ represents a hydrogen atom or an alkyl group having 1 to 8 carbon atoms.

In Formula (A-1) to Formula (A-3), the portion of the wavy line represents a bonding position with other structures.

From the viewpoint of developability and UV printing durability $R^{41}$ in Formula (A-1) is preferably a hydrogen atom or an alkyl group having 1 to 4 carbon atoms, more preferably an alkyl group having 1 to 3 carbon atoms, even more preferably a methyl group or an ethyl group, and particularly preferably an ethyl group.

The polymerizable compound 3 is preferably a polymer represented by Formula (I).

 Formula (I)

In Formula (I), $A^P$ represents an nP-valent organic group having a hydrogen bonding group, $B^P$ represents a group having two or more polymerizable groups, and nP represents an integer of two or more.

As the structure of the polymerizable compound 3, for example, a structure is preferable which is established by sealing a terminal isocyanate group of a multimer (including an adduct) of a polyfunctional isocyanate compound with a compound having an ethylenically unsaturated group as described above.

The preferred aspect of the hydrogen bonding group in $A^P$ of Formula (I) is the same as the preferred aspect of the hydrogen bonding group in the polymerizable compound 3 described above.

$A^P$ in Formula (I) is preferably an organic group that does not have an ethylenically unsaturated bond.

Furthermore, from the viewpoint of developability and UV printing durability, $A^P$ in Formula (I) is preferably a group obtained by combining two or more kinds of structures selected from the group consisting of a mono- to nP-valent aliphatic hydrocarbon group, a mono- to nP-valent aromatic hydrocarbon group, a urethane bond, a urea bond, a biuret bond, and an allophanate bond, and more preferably a group obtained by combining two or more kinds of structures selected from the group consisting of a mono- to nP-valent aliphatic hydrocarbon group, a mono- to nP-valent aromatic hydrocarbon group, a urethane bond, a urea bond, and a biuret bond.

In addition, from the viewpoint of on-press developability and UV printing durability, $A^P$ in Formula (I) is preferably a group obtained by removing a terminal isocyanate group from a multimer prepared by multimerization of a polyfunctional isocyanate compound (including an adduct of a polyfunctional alcohol compound such as trimethylolpropane adduct), more preferably a group obtained by removing a terminal isocyanate group from a multimer prepared by multimerization of a difunctional isocyanate compound (including an adduct of a polyfunctional alcohol compound), and particularly preferably a group obtained by removing a terminal isocyanate group from a multimer prepared by multimerization of hexamethylene diisocyanate (including an adduct of a polyfunctional alcohol compound).

Furthermore, from the viewpoint of developability and UV printing durability, the weight-average molecular weight (Mw) of $A^P$ in Formula (I) is preferably 2,500 or more and 14,500 or less, more preferably 3,000 or more and 114,000 or less, and particularly preferable 4,000 or more and 13,000 or less.

The preferred aspect of the polymerizable group in $B^P$ of Formula (I) is the same as the preferred aspect of the polymerizable group in the polymerizable compound 3 described above.

Among these, from the viewpoint of developability and UV printing durability, the polymerizable group represented by $B^P$ in Formula (I) preferably includes a (meth)acryloxy group. $B^P$ in Formula (I) is more preferably a group having 3 or more (meth)acryloxy groups, even more preferably a group having 5 or more (meth)acryloxy groups, and particularly preferably a group having 5 or more and 12 or less (meth)acryloxy groups.

Furthermore, from the viewpoint of developability and UV printing durability, $B^P$ in Formula (I) preferably each independently represents a structure represented by Formula (Po-1) or Formula (Po-2), and more preferably each independently represents a structure represented by Formula (Po-1).

It is preferable that all B's in Formula (I) be the same group.

One kind of the polymerizable compound 3 may be used alone, or two or more kinds of the polymerizable compound 3 may be used.

Furthermore, the polymerizable compound 3 in the image-recording layer may be a binder polymer or polymer particles having a particle shape.

From the viewpoint of developability and UV printing durability, the content of the polymerizable compound 3 in the image-recording layer with respect to the total mass of the image-recording layer is preferably 5% by mass to 95% by mass, more preferably 10% by mass to 90% by mass, even more preferably 15% by mass to 80% by mass, and particularly preferably 15% by mass to 75% by mass.

—Polymerizable Compound 2—

The image-recording layer contains a polymerizable compound 2 having a weight-average molecular weight of 1,000 or more and 3,000 or less. Because the image-recording layer contains the polymerizable compound 2, developability and UV printing durability are excellent, and UV plate missing is excellently suppressed.

The polymerizable compound 2 may be, for example, a radically polymerizable compound or a cationically polymerizable compound. The polymerizable compound 2 is preferably a radically polymerizable compound, and more preferably an ethylenically unsaturated compound.

The structure of the polymerizable compound 2 is not particularly limited, and known oligomers can be used. Preferable examples thereof include a urethane (meth)acrylate compound.

Furthermore, the polymerizable compound 2 is preferably a polyfunctional polymerizable compound.

The polymerizable compound 2 preferably includes a polyfunctional polymerizable compound having 3 to 40 functional groups, more preferably includes a polyfunctional polymerizable compound having 5 to 30 functional groups, particularly preferably includes a polyfunctional polymerizable compound having 10 to 20 functional groups, and most preferably includes a polyfunctional polymerizable compound having 12 to 18 functional groups.

The preferred aspect of the polymerizable group of the polymerizable compound 2 is the same as the preferred aspect of the polymerizable group in the polymerizable compound 3 described above.

From the viewpoint of developability, UV printing durability, and suppressing UV plate missing, the number of functional groups of the ethylenically unsaturated group in 1 molecule of at least one kind of polymerizable compound included in the polymerizable compound 2 is preferably larger than the number of functional groups in 1 molecule of any of polymerizable compounds included in the polymerizable compound 1 which will be described later.

From the viewpoint of developability, UV printing durability, and suppressing UV plate missing, the polymerizable compound 2 preferably includes a compound having an ethylenically unsaturated bond valence of 1.0 mmol/g or more, more preferably includes a compound having an ethylenically unsaturated bond valence of 2.0 mmol/g to 12.0 mmol/g, and particularly preferably includes a compound having an ethylenically unsaturated bond valence of 5.0 mmol/g to 10.0 mmol/g.

The weight-average molecular weight (Mw) of the polymerizable compound 2 is 1,000 or more and 3,000 or less. From the viewpoint of developability, UV printing durability, and suppressing UV plate missing, the weight-average molecular weight of the polymerizable compound 2 is preferably 1,100 or more and 2,500 or less, more preferably 1,300 or more and 2,200 or less, and even more preferably 1,300 or more and 1,600 or less.

The aforementioned urethane (meth)acrylate compound is not particularly limited. Examples thereof include a compound obtained by a reaction between a polyisocyanate compound and a compound having a hydroxy group and a (meth)acryloxy group.

Examples of the polyisocyanate compound include polyisocyanate compounds having 2 to 5 functional groups. Among these, a polyisocyanate compound having 2 or 3 functional groups is preferable.

Examples of the polyisocyanate compound include the polyisocyanate compound described above regarding the polymer A.

As the compound having a hydroxy group and a (meth)acryloxy group, a compound having one hydroxy group and one or more (meth)acryloxy groups is preferable, and a compound having one hydroxy group and two or more (meth)acryloxy groups is more preferable.

Examples of the compound having a hydroxy group and a (meth)acryloxy group include hydroxyethyl (meth)acrylate, glycerin di(meth)acrylate, trimethylolpropane di(meth)acrylate, pentaerythritol tri(meth)acrylate, dipentaerythritol penta(meth)acrylate, and the like.

As the urethane (meth)acrylate compound, for example, a compound having at least a group represented by Formula (Ac-1) or Formula (Ac-2) is preferable, and a compound having at least a group represented by Formula (Ac-1) is more preferable.

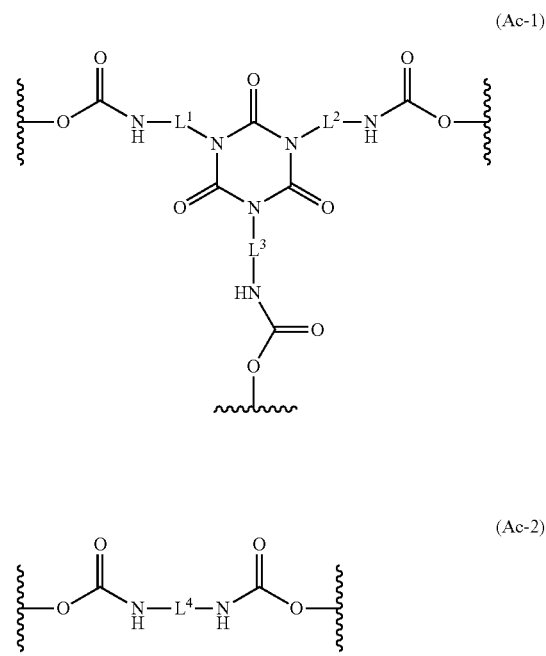

In Formula (Ac-1) and Formula (Ac-2), $L^1$ to $L^4$ each independently represent a divalent hydrocarbon group having 2 to 20 carbon atoms, and the portion of the wavy line represents a bonding position with other structures.

$L^1$ to $L^4$ preferably each independently represent an alkylene group having 2 to 20 carbon atoms, more preferably each independently represent an alkylene group having 2 to 10 carbon atoms, and even more preferably each independently represent an alkylene group having 4 to 8 carbon atoms. The alkylene group may have a branched structure or a ring structure. The alkylene group is preferably a linear alkylene group.

The portion of the wavy line in Formula (Ac-1) or Formula (Ac-2) is preferably each independently directly bonded to the portion of the wavy line in a group represented by Formula (Ae-1) or Formula (Ae-2).

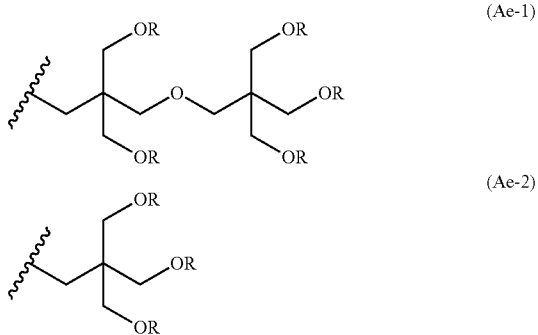

(Ae-1)

(Ae-2)

In Formula (Ae-1) and Formula (Ae-2), R each independently represents an acryloyloxy group or a methacryloyloxy group, and the portion of the wavy line represents a bonding position with the portion of the wavy line in Formula (Ac-1) and Formula (Ac-2).

As the urethane (meth)acrylate compound, a compound may also be used which is prepared by obtaining polyurethane by a reaction between a polyisocyanate compound and a polyol compound and introducing a (meth)acryloxy group into the polyurethane by a polymer reaction. For example, the urethane (meth)acrylate compound may be obtained by reacting a polyol compound having an acid group with a polyisocyanate compound so as to obtain a polyurethane oligomer and reacting this polyurethane oligomer with a compound having an epoxy group and a (meth)acryloxy group.

The polymerizable compound 2 may include a star-shaped polymer.

Examples of the star-shaped polymer include the star-shaped polymer in the polymerizable compound 3 described above.

One kind of the polymerizable compound 2 may be used alone, or two or more kinds of the polymerizable compound 2 may be used.

From the viewpoint of developability and UV printing durability, the content of the polymerizable compound 2 in the image-recording layer with respect to the total mass of the image-recording layer is preferably 0.1% by mass to 50% by mass, more preferably 1% by mass to 40% by mass, and particularly preferably 5% by mass to 30% by mass.

—Polymerizable Compound 1—

From the viewpoint of developability, UV printing durability, and suppressing UV plate missing, the image-recording layer contains a polymerizable compound 1 having a molecular weight less than 1,000.

The polymerizable compound 1 used in the present disclosure may be, for example, a radically polymerizable compound or a cationically polymerizable compound. The polymerizable compound 1 is preferably a radically polymerizable compound, and more preferably a compound having an ethylenically unsaturated group (ethylenically unsaturated compound). The ethylenically unsaturated compound is preferably a compound having at least one terminal ethylenically unsaturated bond, more preferably a compound having two or more terminal ethylenically unsaturated bonds, even more preferably a compound having two or more and 10 or less terminal ethylenically unsaturated bonds, particularly preferably a compound having 3 or more and 8 or less terminal ethylenically unsaturated bonds, and most preferably a compound having 3 or more and 7 or less terminal ethylenically unsaturated bonds.

Examples of the monomer include unsaturated carboxylic acids (for example, acrylic acid, methacrylic acid, itaconic acid, crotonic acid, isocrotonic acid, maleic acid, and the like), and esters and amides thereof. Among these, esters of unsaturated carboxylic acids and polyhydric alcohol compounds and amides of unsaturated carboxylic acids and polyvalent amine compounds are preferably used. In addition, products of an addition reaction between unsaturated carboxylic acid esters or amides having a nucleophilic substituent such as a hydroxy group, an amino group, or a mercapto group and monofunctional or polyfunctional isocyanates or epoxies, products of a dehydrocondensation reaction between the aforementioned unsaturated carboxylic acid esters or amides and a monofunctional or polyfunctional carboxylic acid, and the like are also suitably used. Furthermore, products of an addition reaction between unsaturated carboxylic acid esters or amides having an electrophilic substituent such as an isocyanate groups or an epoxy group and monofunctional or polyfunctional alcohols, amines, or thiols, and products of a substitution reaction between unsaturated carboxylic acid esters or amides having a dissociable substituent such as a halogen atom or a tosyloxy group and monofunctional or polyfunctional alcohols, amines, or thiols are also suitable. Moreover, for example, it is also possible to use a group of compounds obtained by substituting the unsaturated carboxylic acid with an unsaturated phosphonic acid, styrene, a vinyl ether, or the like. These compounds are described in JP2006-508380A, JP2002-287344A, JP2008-256850A, JP2001-342222A, JP1997-179296A (JP-H09-1792%A), JP1997-179297A (JP-H09-179297A), JP1997-179298A (JP-H09-179298A), JP2004-294935A, JP2006-243493A, JP2002-275129A, JP2003-64130A, JP2003-280187A, JP1998-333321A (JP-H10-333321A), and the like.

Specific examples of monomers of esters of polyhydric alcohol compounds and unsaturated carboxylic acids include acrylic acid esters such as ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, and polyester acrylate oligomers, and methacrylic acid esters such as tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethyl methane, and bis[p-(methacryloxyethoxy)phenyl] dimethyl methane.

In addition, specific examples of monomers of amides of polyvalent amine compounds and unsaturated carboxylic acids include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, and the like.

In addition, urethane-based addition polymerizable compounds produced using an addition reaction between an isocyanate and a hydroxy group are also suitable, and specific examples thereof include vinyl urethane compounds having two or more polymerizable vinyl groups in one molecule obtained by adding vinyl monomers having a hydroxy group represented by Formula (M) to a polyisocyanate compound having two or more isocyanate groups in one molecule which is described in, for example, JP1973-41708B (JP-S48-41708B).

$$CH_2=C(R^{M4})COOCH_2CH(R^{M5})OH \qquad (M)$$

In Formula (M), $R^{M4}$ and $R^{M5}$ each independently represent a hydrogen atom or a methyl group.

Furthermore, urethane acrylates described in JP1976-37193A (JP-S51-37193A), JP1990-32293B (JP-H02-32293B), JP1990-16765B (JP-H02-16765B), JP2003-344997A, and JP2006-65210A; urethane compounds having an ethylene oxide-based skeleton described in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-94138A; and urethane compounds having a hydrophilic group described in U.S. Pat. No. 7,153,632B, JP1996-505958A (JP-H08-505958A), JP2007-293221A, and JP2007-293223A are also suitable.

From the viewpoint of developability and UV printing durability, the molecular weight of the polymerizable compound 1 is preferably 100 or more and less than 800, more preferably 300 or more and less than 600, and even more preferably 400 or more and less than 600.

One kind of the polymerizable compound 1 may be used alone, or two or more kinds of the polymerizable compound 1 may be used.

From the viewpoint of developability, UV printing durability, and suppressing UV plate missing, the content of the polymerizable compound 1 in the image-recording layer with respect to the total mass of the image-recording layer is preferably 1% by mass to 75% by mass, more preferably 5% by mass to 70% by mass, and particularly preferably 10% by mass to 60% by mass.

—M3/(M1+M2+M3)—

From the viewpoint of developability, UV printing durability, and suppressing UV plate missing, a ratio of a content M3 of the polymerizable compound 3 to a total content M1+M2+M3 of the polymerizable compound 1, the polymerizable compound 2, and the polymerizable compound 3 (M3/(M1+M2+M3)) is preferably 0.1 to 0.8, more preferably 0.15 to 0.7, even more preferably 0.15 to 0.6, and particularly preferably 0.15 to 0.3.

In a case where each of the polymerizable compound 1, the polymerizable compound 2, and the polymerizable compound 3 includes 2 or more kinds of polymerizable compounds, M3/(M1+M2+M3) represents the ratio of total content of the polymerizable compounds.

—M2/(M1+M2)—

From the viewpoint of developability, UV printing durability, and suppressing UV plate missing, a ratio of a content M2 of the polymerizable compound 2 to a total content M1+M2 of the polymerizable compound 1 and the polymerizable compound 2 (M2/(M1+M2)) is preferably 0.05 to 0.4, more preferably 0.08 to 0.3, and even more preferably 0.08 to 0.25.

In a case where each of the polymerizable compounds 1 and 2 includes 2 or more kinds of compounds, M2/(M1+M2) represents the ratio of total content of the compounds.

—Infrared Absorber—

The image-recording layer contains an infrared absorber.

The infrared absorber is not particularly limited, and examples thereof include pigments and dyes.

As the dye that is used as the infrared absorber, it is possible to use commercially available dyes and known dyes described in publications, for example, "Dye Handbooks" (edited by the Society of Synthetic Organic Chemistry, Japan, 1970). Specific examples thereof include dyes such as an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium colorant, a pyrylium salt, and a metal thiolate complex.

Among these dyes, for example, a cyanine dye, a squarylium colorant, a pyrylium salt, a nickel thiolate complex, and an indolenine cyanine dye are particularly preferable. Furthermore, for example, a cyanine dye or an indolenine cyanine dye is preferable. Among these, a cyanine dye is particularly preferable.

The infrared absorber is preferably a cationic polymethine colorant having an oxygen or nitrogen atom at the meso-position. As the cationic polymethine colorant, for example, a cyanine dye, a pyrylium colorant, a thiopyrylium colorant, an azulenium colorant, and the like are preferable. From the viewpoint of ease of availability, solubility in a solvent during an introduction reaction, and the like, a cyanine dye is preferable.

Specific examples of the cyanine dye include the compounds described in paragraphs "0017" to "0019" of JP2001-133969A and the compounds described in paragraphs "0016" to "0021" of JP2002-023360A and paragraphs "0012" to "0037" of JP2002-040638A. As the cyanine dye, for example, the compounds described in paragraphs "0034" to "0041" of JP2002-278057A and paragraphs "0080" to "0086" of JP2008-195018A are preferable, and the compounds described in paragraphs "0035" to "0043" of JP2007-90850A and the compounds described in paragraphs "0105" to "0113" of JP2012-206495A are particularly preferable.

Furthermore, the compounds described in paragraphs "0008" and "0009" of JP1993-5005A (JP-H05-5005A) and paragraphs "0022" to "0025" of JP2001-222101A can also be preferably used.

As pigments, the compounds described in paragraphs "0072" to "0076" of JP2008-195018A are preferable.

One kind of infrared absorber may be used alone, or two or more kinds of infrared absorbers may be used in combination. In addition, as the infrared absorber, a pigment and a dye may be used in combination.

The content of the infrared absorber in the image-recording layer with respect to the total mass of the image-recording layer is preferably 0.1% by mass to 10.0% by mass, and more preferably 0.5% by mass to 5.0% by mass.

—Polymerization Initiator—

The image-recording layer in the lithographic printing plate precursor according to the present disclosure contains a polymerization initiator.

The polymerization initiator preferably includes an electron-accepting polymerization initiator, and more preferably includes an electron-accepting polymerization initiator and an electron-donating polymerization initiator.

<<Electron-Accepting Polymerization Initiator>>

It is preferable that the image-recording layer contain an electron-accepting polymerization initiator as a polymerization initiator.

The electron-accepting polymerization initiator is a compound which accepts an electron by intermolecular electron transfer in a case where electrons of an infrared absorber are excited by exposure to infrared, and generates a polymerization initiation species such as radicals.

The electron-accepting polymerization initiator used in the present disclosure is a compound that generates a polymerization initiation species such as a radical or a cation by either or both of light energy and heat energy, and can be appropriately selected from known thermal polymerization initiators, compounds having a bond that can be dissociated by little energy, photopolymerization initiators, and the like.

The electron-accepting polymerization initiator is preferably a radical polymerization initiator and more preferably an onium salt compound.

In addition, as the electron-accepting polymerization initiator, an infrared-ray-sensitive polymerization initiator is preferable.

Examples of the electron-accepting radical polymerization initiator include (a) organic halide, (b) carbonyl compound, (c) azo compound, (d) organic peroxide, (e) metallocene compound, (f) azide compound, (g) hexaarylbiimidazole compound, (i) disulfone compound, (j) oxime ester compound, and (k) onium salt compound.

As (a) organic halide, for example, the compounds described in paragraphs "0022" and "0023" of JP2008-195018A are preferable.

As (b) carbonyl compound, for example, the compounds described in paragraph "0024" of JP2008-195018A are preferable.

As (c) azo compound, for example, the azo compounds described in JP1996-108621A (JP-H08-108621A) and the like can be used.

As (d) organic peroxide, for example, the compounds described in paragraph "0025" of JP2008-195018A are preferable.

As (e) metallocene compound, for example, the compounds described in paragraph "0026" of JP2008-195018A are preferable.

Examples of (f) azide compound include compounds such as 2,6-bis(4-azidobenzylidene)-4-methylcyclohexanone.

As (g) hexaarylbiimidazole compound, for example, the compounds described in paragraph "0027" of JP2008-195018A are preferable.

Examples of (i) disulfone compound include the compounds described in JP1986-166544A (JP-S61-166544A) and JP2002-328465A.

As (j) oxime ester compound, for example, the compounds described in paragraphs "0028" to "0030" of JP2008-195018A are preferable.

Among the above electron-accepting polymerization initiators, from the viewpoint of curing properties, an oxime ester compound and an onium salt compound are preferable. Particularly, from the viewpoint of printing durability, an iodonium salt compound, a sulfonium salt compound, or an azinium salt compound is preferable, an iodonium salt compound or a sulfonium salt compound is more preferable, and an iodonium salt compound is particularly preferable.

Specific examples of these compounds will be shown below, but the present disclosure is not limited thereto.

As the iodonium salt compound, for example, a diaryl iodonium salt compound is preferable. Particularly, a diphenyl iodonium salt compound substituted with an electron donating group such as an alkyl group or an alkoxyl group is more preferable. Furthermore, an asymmetric diphenyl iodonium salt compound is preferable. Specific examples thereof include diphenyliodonium=hexafluorophosphate, 4-methoxyphenyl-4-(2-methylpropyl)phenyliodonium=hexafluorophosphate, 4-(2-methylpropyl)phenyl-p-tolyliodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, and bis(4-t-butylphenyl)iodonium=hexafluorophosphate.

As the sulfonium salt compound, for example, a triarylsulfonium salt compound is preferable. Particularly, a triarylsulfonium salt compound is preferable in which at least some of electron-withdrawing groups such as groups on an aromatic ring are substituted with halogen atoms, and a triarylsulfonium salt compound is more preferable in which the total number of halogen atoms as substituents on an aromatic ring is 4 or more. Specific examples thereof include triphenylsulfonium=hexafluorophosphate, triphenylsulfonium=benzoyl formate, bis(4-chlorophenyl)phenylsulfonium=benzoyl formate, bis(4-chlorophenyl)-4-methylphenylsulfonium=tetrafluoroborate, tris(4-chlorophenyl)sulfonium=3,5-bis(methoxycarbonyl)benzenesulfonate, tris(4-chlorophenyl)sulfonium=hexafluorophosphate, and tris(2,4-dichlorophenyl)sulfonium=hexafluorophosphate.

Examples of counteranions of the iodonium salt compound and the sulfonium salt compound include a sulfonate anion, a carboxylate anion, a tetrafluoroborate anion, a hexafluorophosphate anion, a p-toluene sulfonate anion, a tosylate anion, a sulfonamide anion, and a sulfonimide anion. Among the above, a sulfonamide anion or a sulfonimide anion is preferable, and a sulfonimide anion is more preferable.

As the sulfonamide anion, an aryl sulfonamide anion is preferable.

As the sulfonimide anion, a bisaryl sulfonimide anion is preferable.

Specific examples of the sulfonamide anion or the sulfonimide anion will be shown below, but the present disclosure is not limited thereto. In the following specific examples, Ph represents a phenyl group, Me represents a methyl group, and Et represents an ethyl group.

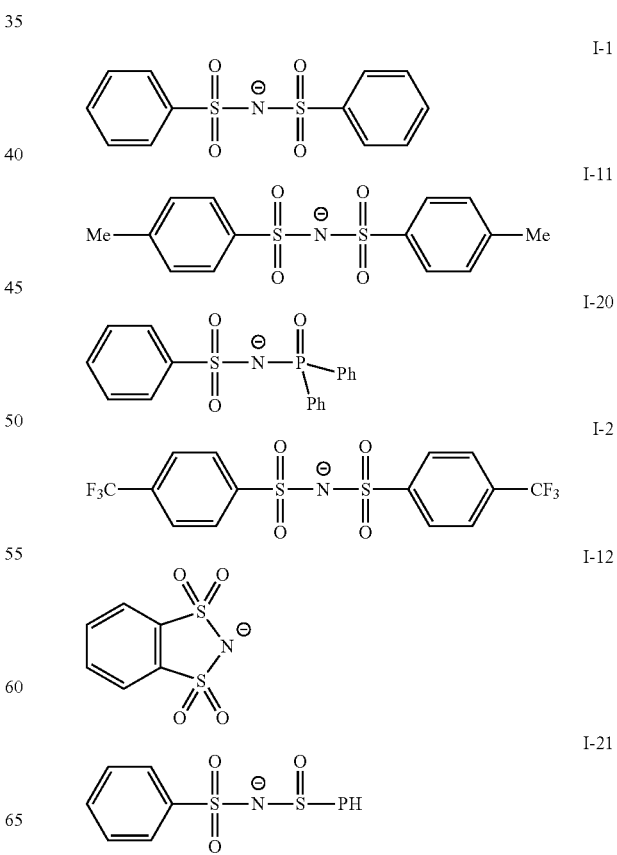

-continued

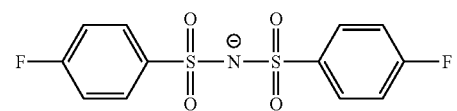
I-3

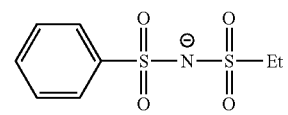
I-13

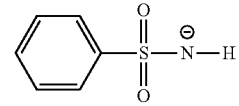
I-22

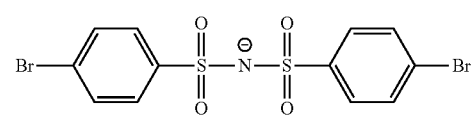
I-4

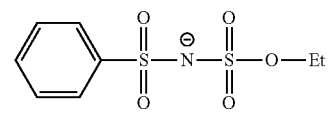
I-14

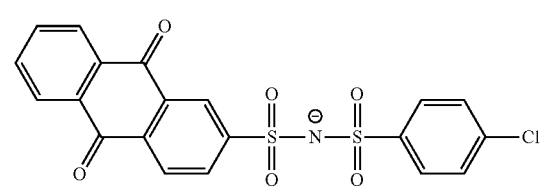
I-23

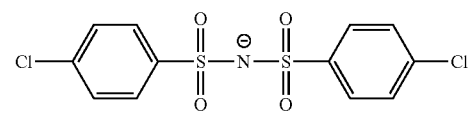
I-5

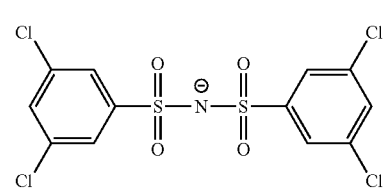
I-6

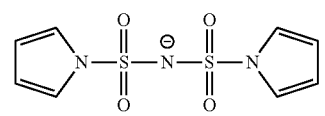
I-15

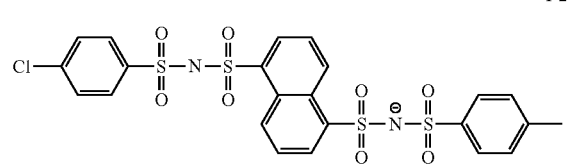
I-24

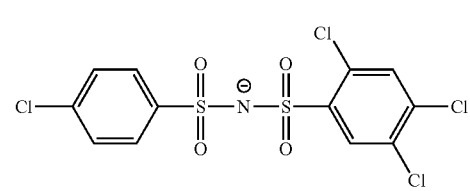
I-7

-continued

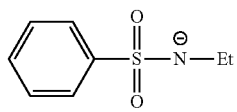
I-16

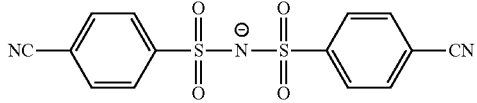
I-8

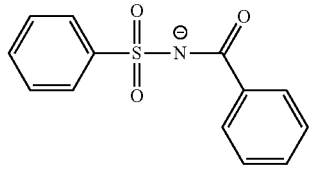
I-17

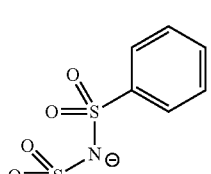
I-25

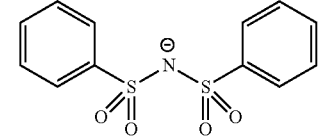
I-9

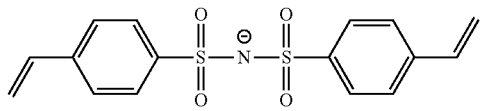
I-18

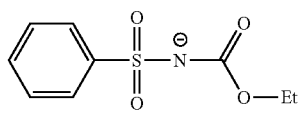
I-10

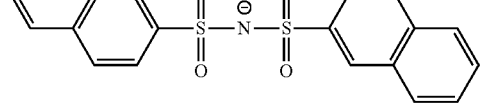
I-19

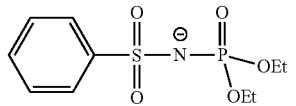
I-26

From the viewpoint of improving sensitivity and suppressing the occurrence of plate missing, the lowest unoccupied molecular orbital (LUMO) of the electron-accepting polymerization initiator is preferably −3.00 eV or less, and more preferably −3.02 eV or less.

The lower limit of LUMO is preferably −3.80 eV or more, and more preferably −3.60 eV or more.

In the present disclosure, the molecular orbital (MO) energy of the highest occupied molecular orbital (HOMO) and the lowest unoccupied molecular orbital (LUMO) is calculated by the following methods.

First, free counterions in the compound as a calculation object are excluded from the calculation object. For example, for a cationic electron-accepting polymerization initiator and a cationic infrared absorber, counteranions are excluded from the calculation object, and for an anionic electron-donating polymerization initiator, countercations are excluded from the calculation object. "Free" mentioned herein means that the compound as an object and the counterions thereof are not covalently linked to each other.

The structural optimization is carried out by DFT (B3LYP/6-31G(d)) using quantum chemical calculation software Gaussian 09.

The molecular orbital (MO) energy is calculated by DFT (B3LYP/6-31+G(d,p)/CPCM (solvent=methanol)) using the structure obtained by the structural optimization.

By the following formula, the MO energy Ebare (unit: hartree) obtained by the above MO energy calculation is converted into Escaled (unit: eV) used as the values of HOMO and LUMO in the present disclosure.

Escaled=0.823168×27.2114×Ebare−1.07634

27.2114 is simply a coefficient for converting hartree into eV, and 0.823168 and −1.07634 are adjustment coefficients. These are determined such that the calculated values of HOMO and LUMO of the compound as a calculation object match the measured values.

One kind of electron-accepting polymerization initiator may be used alone, or two or more kinds of electron-accepting polymerization initiators may be used in combination.

The content of the electron-accepting polymerization initiator with respect to the total mass of the image-recording layer is preferably 0.1% by mass to 50% by mass, more preferably 0.5% by mass to 30% by mass, and particularly preferably 0.8% by mass to 20% by mass.

<<Electron-Donating Polymerization Initiator (Polymerization Aid)>>

The image-recording layer preferably contains, as a polymerization initiator, an electron-donating polymerization initiator (also called "polymerization aid"), and more preferably contains an electron-accepting polymerization initiator and an electron-donating polymerization initiator.

The electron-donating polymerization initiator in the present disclosure is a compound which donates one electron by intermolecular electron transfer to an orbit of an infrared absorber that has lost one electron in a case where electrons of the infrared absorber are excited or perform intramolecular transfer by exposure to infrared, and thus generates polymerization initiation species such as radicals.

The electron-donating polymerization initiator is preferably an electron-donating radical polymerization initiator.

From the viewpoint of improving the printing durability of the lithographic printing plate, the image-recording layer more preferably contains the electron-donating polymerization initiator that will be described below. Examples thereof include the following 5 initiators.

(i) Alkyl or arylate complex: considered to generate active radicals by oxidative cleavage of carbon-hetero bond. Specifically, a borate compound is preferable.
(ii) N-arylalkylamine compound: considered to generate active radicals by oxidation-induced cleavage of C—X bond on carbon adjacent to nitrogen. X is preferably a hydrogen atom, a carboxyl group, a trimethylsilyl group, or a benzyl group. Specifically, examples thereof include N-phenylglycines (which may or may not have a substituent on a phenyl group) and N-phenyl iminodiacetic acids (which may or may not have a substituent on a phenyl group).
(iii) Sulfur-containing compound: compound obtained by substituting nitrogen atoms of the aforementioned amines with sulfur atoms and capable of generating active radicals by the same action as that of the amines. Examples thereof include phenylthioacetic acids (which may or may not have a substituent on a phenyl group).
(iv) Tin-containing compound: compound obtained by substituting nitrogen atoms of the aforementioned amines with tin atoms and capable of generating active radicals by the same action as that of the amines.
(v) Sulfinates: capable of generating active radicals by oxidation. Specifically, examples thereof include sodium aryl sulfinate and the like.

From the viewpoint of printing durability, the image-recording layer preferably contains a borate compound among the above.

From the viewpoint of printing durability and color developability, the borate compound is preferably a tetraaryl borate compound or a monoalkyl triaryl borate compound, and more preferably a tetraaryl borate compound.

A countercation that the borate compound has is not particularly limited, but is preferably an alkali metal ion or a tetraalkyl ammonium ion and more preferably a sodium ion, a potassium ion, or a tetrabutylammonium ion.

Specifically, preferable examples of the borate compound include sodium tetraphenyl borate.

Specifically, as the electron-donating polymerization initiator, for example, the following B-1 to B-9 are preferable. It goes without saying that the present disclosure is not limited thereto. In the following chemical formulas, Ph represents a phenyl group, and Bu represents a n-butyl group.

B-1

B-2

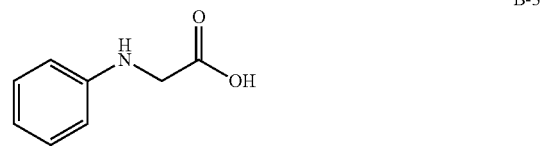

B-3

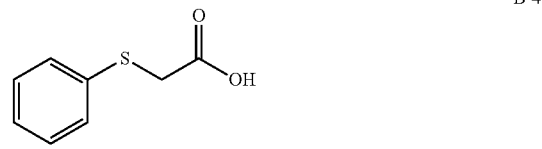

B-4

-continued

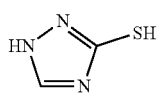
B-5

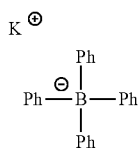
B-6

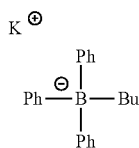
B-7

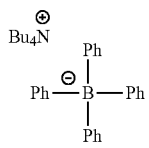
B-8

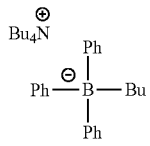
B-9

From the viewpoint of improving sensitivity and suppressing the occurrence of plate missing, the highest occupied molecular orbital (HOMO) of the electron-donating polymerization initiator used in the present disclosure is preferably −6.00 eV or more, more preferably −5.95 eV or more, and even more preferably −5.93 eV or more.

The upper limit of HOMO is preferably −5.00 eV or less, and more preferably −5.40 eV or less.

Only one kind of electron-donating polymerization initiator may be added to the image-recording layer, or two or more kinds of electron-donating polymerization initiators may be used in combination.

From the viewpoint of sensitivity and printing durability, the content of the electron-donating polymerization initiator with respect to the total mass of the image-recording layer is preferably 0.01% by mass to 30% by mass, more preferably 0.05% by mass to 25% by mass, and even more preferably 0.1% by mass to 20% by mass.

In the present disclosure, in a case where the image-recording layer contains an onium ion and an anion of the aforementioned electron-donating polymerization initiator, the image-recording layer is regarded as containing an electron-accepting polymerization initiator and the electron-donating polymerization initiator described above.

—Relationship Between Electron-Donating Polymerization Initiator and Infrared Absorber—

From the viewpoint of improving sensitivity and UV printing durability, the image-recording layer in the present disclosure contains the electron-donating polymerization initiator and the infrared absorber described above. HOMO of the infrared absorber—HOMO of the electron-donating polymerization initiator is preferably 0.70 eV or less, and more preferably −0.10 eV to 0.70 eV.

The negative sign means that HOMO of the electron-donating polymerization initiator is higher than HOMO of the infrared absorber.

—Preferred Aspects of Infrared Absorber and Electron-Accepting Polymerization Initiator—

From the viewpoint of improving sensitivity and suppressing the occurrence of plate missing, in a preferred aspect, the infrared absorber in the present disclosure has an organic anion that satisfies $\delta d \geq 16$, $\delta p = 16$ to 32, and $\delta h \leq \delta p \times 0.6$ in the Hansen solubility parameters.

From the viewpoint of improving sensitivity and further suppressing the occurrence of plate missing, in a preferred aspect, the electron-accepting polymerization initiator in the present disclosure has an organic anion that satisfies $\delta d \geq 16$, $\delta p = 16$ to 32, and $\delta h \leq \delta p \times 0.6$ in the Hansen solubility parameters.

In the present disclosure, as $\delta d$, $\delta p$, and $\delta h$ in the Hansen solubility parameters, the dispersion element $\delta d$ [unit: $MPa^{0.5}$] and the polarity element $\delta p$ [unit: $MPa^{0.5}$] in the Hansen solubility parameters are used. The Hansen solubility parameters are obtained by dividing the solubility parameters introduced by Hildebrand into three components, a dispersion element $\delta d$, a polarity element $\delta p$, and a hydrogen bond element $\delta h$, and expressing the parameters in a three-dimensional space.

Details of the Hansen solubility parameters are described in the document "Hansen Solubility Parameters; A Users Handbook (CRC Press, 2007)" written by Charles M. Hansen.

In the present disclosure, $\delta d$, $\delta p$, and $\delta h$ of the organic anion in the Hansen solubility parameters are values estimated from the chemical structure by using the computer software "Hansen Solubility Parameters in Practice (HSPiP ver. 4.1.07)".

Specifically, suitable examples of the organic anions that satisfy $\delta d \geq 16$, $\delta p = 16$ to 32, and $\delta h \leq \delta p \times 0.6$ in the Hansen solubility parameters include I-1 to I-15, I-17 to I-21, and I-23 to I-25 described above and the following anions. It goes without saying that the present disclosure is not limited thereto. Among these, for example, a bis(halogen-substituted benzenesulfonyl)imide anion is more suitable, and I-5 described above is particularly suitable.

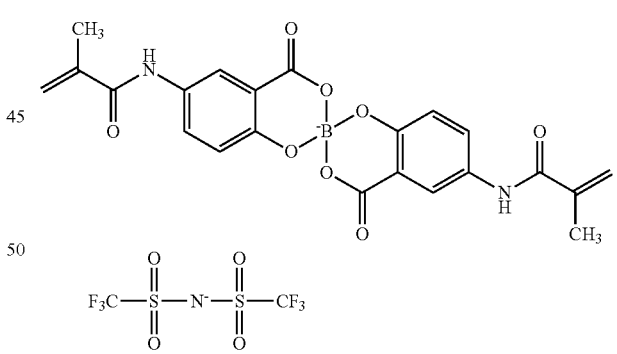

—Particles—

From the viewpoint of UV printing durability and suppressing UV plate missing, it is preferable that the image-recording layer contain polymer particles.

The particles may be organic particles or inorganic particles. From the viewpoint of UV printing durability and suppressing UV plate missing, the image-recording layer preferably contains organic particles, and more preferably contains polymer particles other than the polymer A.

Known inorganic particles can be used as inorganic particles, and metal oxide particles such as silica particles and titania particles can be suitably used.

The polymer particles are preferably selected from the group consisting of thermoplastic polymer particles, thermally reactive polymer particles, polymer particles having a polymerizable group, microcapsules encapsulating a hydrophobic compound, and microgel (crosslinked polymer particles). Among these, polymer particles having a polymerizable group or microgel are preferable. In a particularly preferable embodiment, the polymer particles have at least one ethylenically unsaturated polymerizable group. The presence of such polymer particles brings about effects of improving the printing durability of an exposed portion and improving the developability of a non-exposed portion.

Furthermore, the polymer particles are preferably thermoplastic polymer particles.

As the thermoplastic polymer particles, the thermoplastic polymer particles described in Research Disclosure No. 33303 published in January 1992, JP1997-123387A (JP-H09-123387A), JP1997-131850A (JP-H09-131850A), JP1997-171249A (JP-H09-171249A), JP1997-171250A (JP-H09-171250A), EP931647B, and the like are preferable.

Specific examples of polymers constituting the thermoplastic polymer particles include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures of these. For example, copolymers having polystyrene, styrene, and acrylonitrile or polymethyl methacrylate are preferable. The average particle diameter of the thermoplastic polymer particle is preferably 0.01 μm to 3.0 μm.

Examples of the thermally reactive polymer particles include polymer particles having a thermally reactive group. The thermally reactive polymer particles form a hydrophobilized region through crosslinking by a thermal reaction and the accompanying change in functional groups.

The thermally reactive group in the polymer particles having a thermally reactive group may be a functional group that causes any reaction as long as chemical bonds are formed. The thermally reactive group is preferably a polymerizable group. As the polymerizable group, for example, an ethylenically unsaturated group that causes a radical polymerization reaction (for example, an acryloyl group, a methacryloyl group, a vinyl group, an allyl groups, and the like), a cationically polymerizable group (for example, a vinyl group, a vinyloxy group, an epoxy group, an oxetanyl group, and the like), an isocyanate group or a blocked isocyanate group that causes an addition reaction, an epoxy group, a vinyloxy group, an active hydrogen atom-containing functional group that is a reaction partner thereof (for example, an amino group, a hydroxy group, a carboxy group, and the like), a carboxy group that causes a condensation reaction, a hydroxy group or an amino group that is a reaction partner of the carboxy group, an acid anhydride that causes a ring-opening addition reaction, an amino group or a hydroxy group which is a reaction partner of the acid anhydride, and the like are preferable.

Examples of the microcapsules include microcapsules encapsulating at least some of the constituent components of the image-recording layer as described in JP2001-277740A and JP2001-277742A. The constituent components of the image-recording layer can also be incorporated into the exterior of the microcapsules. In a preferred aspect, the image-recording layer containing microcapsules is composed so that hydrophobic constituent components are encapsulated in the microcapsules and hydrophilic constituent components are incorporated into the exterior of the microcapsules.

The microgel (crosslinked polymer particles) can contain some of the constituent components of the image-recording layer, in at least one of the surface or the interior of the microgel. From the viewpoint of sensitivity of the lithographic printing plate precursor to be obtained and printing durability of the lithographic printing plate to be obtained, reactive microgel having a radically polymerizable group on the surface thereof is particularly preferable.

In order to encapsulate the constituent components of the image-recording layer in microcapsules or microgel, known methods can be used.

As the polymer particles, from the viewpoint of printing durability, antifouling properties, and storage stability of the lithographic printing plate to be obtained, polymer particles are preferable which are obtained by a reaction between a polyvalent isocyanate compound that is an adduct of a polyhydric phenol compound having two or more hydroxy groups in a molecule and isophorone diisocyanate and a compound having active hydrogen.

As the polyhydric phenol compound, a compound having a plurality of benzene rings having a phenolic hydroxy group is preferable.

As the compound having active hydrogen, a polyol compound or a polyamine compound is preferable, a polyol compound is more preferable, and at least one kind of compound selected from the group consisting of propylene glycol, glycerin, and trimethylolpropane is even more preferable.

As resin particles obtained by the reaction between a polyvalent isocyanate compound that is an adduct of a polyhydric phenol compound having two or more hydroxy groups in a molecule and isophorone diisocyanate and a compound having active hydrogen, for example, the polymer particles described in paragraphs "0032" to "0095" of JP2012-206495A are preferable.

Furthermore, from the viewpoint of printing durability and solvent resistance of the lithographic printing plate to be obtained, the polymer particles preferably have a hydrophobic main chain and include both i) constitutional unit having a pendant cyano group directly bonded to the hydrophobic main chain and ii) constitutional unit having a pendant group including a hydrophilic polyalkylene oxide segment.

As the hydrophobic main chain, for example, an acrylic resin chain is preferable.

As the pendant cyano group, for example, —[CH$_2$CH(C≡N)—] or —[CH$_2$C(CH$_3$)(C≡N)—] is preferable.

In addition, the constitutional unit having the pendant cyano group can be easily derived from an ethylenically unsaturated monomer, for example, acrylonitrile, or methacrylonitrile, or a combination of these.

Furthermore, as an alkylene oxide in the hydrophilic polyalkylene oxide segment, ethylene oxide or a propylene oxide is preferable, and ethylene oxide is more preferable.

The number of repeating alkylene oxide structures in the hydrophilic polyalkylene oxide segment is preferably 10 to 100, more preferably 25 to 75, and even more preferably 40 to 50.

As the resin particles having a hydrophobic main chain and including both i) constitutional unit having the pendant cyano group directly bonded to the hydrophobic main chain and ii) constitutional unit having a pendant group including the hydrophilic polyalkylene oxide segment, for example, the particles described in paragraphs "0039" to "0068" of JP2008-503365A are preferable.

From the viewpoint of UV printing durability and developability, the polymer particles preferably have a hydrophilic group.

The hydrophilic group is not particularly limited as long as it has a hydrophilic structure, and examples thereof include an acid group such as a carboxy group, a hydroxy group, an amino group, a cyano group, a polyalkylene oxide structure, and the like.

Among these, from the viewpoint of developability and UV printing durability, a polyalkylene oxide structure is preferable, and a polyethylene oxide structure, a polypropylene oxide structure, or a polyethylene/propylene oxide structure is more preferable.

Furthermore, from the viewpoint of developability and suppressing the occurrence of development residues during on-press development, the polyalkylene oxide structure preferably has a polypropylene oxide structure, and more preferably has a polyethylene oxide structure and a polypropylene oxide structure.

From the viewpoint of printing durability, receptivity, and developability, the hydrophilic group preferably has a cyano group-containing constitutional unit or a group represented by Formula Z, more preferably has a constitutional unit represented by Formula (AN) or a group represented by Formula Z, and particularly preferably has a group represented by Formula Z.

*-Q-W—Y    Formula Z

In Formula Z, Q represents a divalent linking group, W represents a divalent group having a hydrophilic structure or a divalent group having a hydrophobic structure, Y represents a monovalent group having a hydrophilic structure or a monovalent group having a hydrophobic structure, either W or Y has a hydrophilic structure, and * represents a bonding site with other structures.

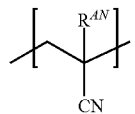

(AN)

In Formula (AN), $R^{AN}$ represents a hydrogen atom or a methyl group.

From the viewpoint of UV printing durability, the polymer contained in the aforementioned polymer particles preferably has a constitutional unit formed of a cyano group-containing compound.

Generally, it is preferable that a cyano group be introduced as a cyano group-containing constitutional unit by using a cyano group-containing compound (monomer). Examples of the cyano group-containing compound include acrylonitrile compounds. Among these, for example, (meth)acrylonitrile is suitable.

The cyano group-containing constitutional unit is preferably a constitutional unit formed of an acrylonitrile compound, and more preferably a constitutional unit formed of (meth)acrylonitrile, that is, a constitutional unit represented by Formula (AN).

In a case where the aforementioned polymer includes a polymer having a cyano group-containing constitutional unit, from the viewpoint of UV printing durability, the content of the cyano group-containing constitutional unit which is preferably a constitutional unit represented by Formula (AN) in the polymer having the cyano group-containing constitutional unit with respect to the total mass of the polymer having the cyano group-containing constitutional unit is preferably 5% by mass to 90% by mass, more preferably 20% by mass to 80% by mass, and particularly preferably 30% by mass to 60% by mass.

From the viewpoint of UV printing durability, the polymer particles preferably contain a constitutional unit formed of an aromatic vinyl compound.

The aromatic vinyl compound may have a structure composed of an aromatic ring and a vinyl group bonded thereto. Examples of the compound include a styrene compound, a vinylnaphthalene compound, and the like. Among these, a styrene compound is preferable, and styrene is more preferable.

Examples of the styrene compound include styrene, p-methylstyrene, p-methoxystyrene, β-methylstyrene, p-methyl-β-methylstyrene, α-methylstyrene, p-methoxy-β-methylstyrene, and the like. Among these, for example, styrene is preferable. Examples of the vinylnaphthalene compound include 1-vinylnaphthalene, methyl-1-vinylnaphthalene, β-methyl-1-vinylnaphthalene, 4-methyl-1-vinylnaphthalene, 4-methoxy-1-vinylnaphthalene, and the like. Among these, for example, 1-vinylnaphthalene is preferable.

Preferable examples of the constitutional unit formed of an aromatic vinyl compound include a constitutional unit represented by Formula Z1.

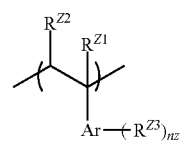

Formula Z1

In Formula Z1, $R^{Z1}$ and $R^{Z2}$ each independently represent a hydrogen atom or an alkyl group, Ar represents an aromatic ring group, Rz represents a substituent, and nz represents an integer of 0 or more and equal to or less than the maximum number of substituents of Ar.

In Formula Z1, $RZ^1$ and $R^1$ preferably each independently represent a hydrogen atom or an alkyl group having 1 to 4 carbon atoms, more preferably each independently represent a hydrogen atom or a methyl group, and even more preferably both represent a hydrogen atom.

In Formula Z1, Ar is preferably a benzene ring or a naphthalene ring, and more preferably a benzene ring.

In Formula Z1, $R^{Z3}$ is preferably an alkyl group or an alkoxy group, more preferably an alkyl group having 1 to 4 carbon atoms or an alkoxy group having 1 to 4 carbon atoms, and even more preferably a methyl group or a methoxy group.

In a case where there is a plurality of $R^{Z3}$'s in Formula $Z^1$, the plurality of $R^{Z3}$'s may be the same as or different from each other.

In Formula Z1, nz is preferably an integer of 0 to 2, more preferably 0 or 1, and even more preferably 0.

The polymer particles may contain only one kind of constitutional unit formed of an aromatic vinyl compound or contain two or more kinds of constitutional units formed of an aromatic vinyl compound.

In the polymer particles, from the viewpoint of ink receptivity, the content of the constitutional unit formed of an aromatic vinyl compound with respect to the total mass of the polymer particles is preferably 0.1% by mass to 20% by mass, more preferably 0.5% by mass to 15% by mass, and particularly preferably 1% by mass to 10% by mass.

From the viewpoint of UV printing durability, the polymer particles preferably have a crosslinking structure, and more preferably contain a constitutional unit having a crosslinking structure.

In a case where the polymer particles have a crosslinking structure, the hardness of the polymer particles is improved, and the hardness of the image area is improved accordingly. It is considered that as a result, even though an ultraviolet-curable ink that is more likely to deteriorate the plate compared to other inks is used, printing durability (UV printing durability) may be further improved.

The crosslinking structure is not particularly limited, but is preferably a constitutional unit which is formed by polymerizing a polyfunctional ethylenically unsaturated compound or a constitutional unit in which one or more kinds of reactive groups form a covalent bond in the particles. From the viewpoint of UV printing durability and developability, the number of functional groups in the polyfunctional ethylenically unsaturated compound is preferably 2 to 15, more preferably 3 to 10, even more preferably 4 to 10, and particularly preferably 5 to 10.

In other words, from the viewpoint of UV printing durability and developability, the constitutional unit having a crosslinking structure is preferably a branched unit having 2 to 15 functional groups.

The branched unit having n functional groups refers to a branched unit from which n molecular chains branch off. In other words, it is a constitutional unit having an n functional branch point (crosslinking structure).

In addition, for example, it is also preferable that the crosslinking structure be formed of a polyfunctional mercapto compound.

The ethylenically unsaturated group in the polyfunctional ethylenically unsaturated compound is not particularly limited, and examples thereof include a (meth)acryloxy group, a (meth)acrylamide group, an aromatic vinyl group, a maleimide group, and the like.

The polyfunctional ethylenically unsaturated compound is preferably a polyfunctional (meth)acrylate compound, a polyfunctional (meth)acrylamide compound, or a polyfunctional aromatic vinyl compound.

Examples of the polyfunctional (meth)acrylate compound include diethylene glycol diacrylate, triethylene glycol diacrylate, tetraethylene glycol diacrylate, trimethylolpropane diacrylate, trimethylolpropane triacrylate, 1,4-butanediol diacrylate, 1,6-hexanediol diacrylate, polyethylene glycol diacrylate, polypropylene glycol diacrylate, tricyclodecanedimethylol diacrylate, ditrimethylolpropane tetraacrylate, pentaerythritol triacrylate, pentaerythritol tetraacrylate, dipentaerythritol triacrylate, dipentaerythritol hexaacrylate, triacrylate of tris(β-hydroxyethyl)isocyanurate, and the like.

Examples of the polyfunctional (meth)acrylate compound include N,N'-methylenebisacrylamide, N-[tris(3-acrylamidepropoxymethyl)methyl]acrylamide, and the like.

Examples of the polyfunctional aromatic vinyl compound include divinyl benzene and the like.

The number of carbon atoms in the branched unit is not particularly limited, but is preferably 8 to 100, and more preferably 8 to 70.

The polymer particles may contain only one kind of constitutional unit having a crosslinking structure or contain two or more kinds of constitutional units having a crosslinking structure.

In the polymer particles, from the viewpoint of UV printing durability and developability, the content of the constitutional unit having a crosslinking structure with respect to the total mass of the polymer particles is preferably 0.1% by mass to 20% by mass, more preferably 0.5% by mass to 15% by mass, and particularly preferably 1% by mass to 10% by mass.

Furthermore, from the viewpoint of printing durability, receptivity, and developability, the polymer particles preferably include polymer particles having a group represented by Formula Z.

Q in Formula Z is preferably a divalent linking group having 1 to 20 carbon atoms, and more preferably a divalent linking group having 1 to 10 carbon atoms.

Furthermore, Q in Formula Z is preferably an alkylene group, an arylene group, an ester bond, an amide bond, or a group formed by combining two or more of these, and more preferably a phenylene group, an ester bond, or an amide bond.

The divalent group having a hydrophilic structure represented by W in Formula Z is preferably a polyalkyleneoxy group or a group in which $-CH_2CH_2NR^W-$ is bonded to one end of a polyalkyleneoxy group. $R^W$ represents a hydrogen atom or an alkyl group.

The divalent group having a hydrophobic structure represented by W in Formula Z is preferably $-R^{WA}-$, $-O-R^{WA}-O-$, $-R^WN-R^{WA}-NR^W-$, $-OC(=O)-R^{WA}-O-$, or $-OC(=O)-R^{WA}-O-$. $R^{WA}$ each independently represents a linear, branched, or cyclic alkylene group having 6 to 120 carbon atoms, a haloalkylene group having 6 to 120 carbon atoms, an arylene group having 6 to 120 carbon atoms, an alkarylene group having 6 to 120 carbon atoms (divalent group formed by removing one hydrogen atom from an alkylaryl group), or an aralkylene group having 6 to 120 carbon atoms.

The monovalent group having a hydrophilic structure represented by Y in Formula Z is preferably $-OH$, $-C(=O)OH$, a polyalkyleneoxy group having a hydrogen atom or an alkyl group on a terminal, or a group in which $-CH_2CH_2N(R^W)-$ is bonded to one terminal of a polyalkyleneoxy group having a hydrogen atom or an alkyl group on the other terminal.

The monovalent group having a hydrophobic structure represented by Y in Formula Z is preferably a linear, branched, or cyclic alkyl group having 6 to 120 carbon atoms, a haloalkyl group having 6 to 120 carbon atoms, an aryl group having 6 to 120 carbon atoms, an alkaryl group having 6 to 120 carbon atoms (alkylaryl group), an aralkyl group having 6 to 120 carbon atoms, $-OR^{WB}$, $-C(=O)OR^{WB}$, or $-OC(=O)R^{WB}$. $R^{WB}$ represents an alkyl group having 6 to 20 carbon atoms.

From the viewpoint of printing durability, receptivity, and developability, in the polymer particles having a group represented by formula Z, W is more preferably a divalent group having a hydrophilic structure, Q is more preferably a phenylene group, an ester bond, or an amide bond, W is more preferably a polyalkyleneoxy group, and Y is more preferably a polyalkyleneoxy group having a hydrogen atom or an alkyl group on a terminal.

From the viewpoint of printing durability, receptivity, suppressing UV plate missing, and developability, the aforementioned polymer particles preferably include polymer particles having a polymerizable group, and more preferably include polymer particles having a polymerizable group on the particle surface.

Furthermore, from the viewpoint of printing durability, the polymer particles preferably include polymer particles having a hydrophilic group and a polymerizable group.

The polymerizable group may be a cationically polymerizable group or a radically polymerizable group. From the viewpoint of reactivity, the polymerizable group is preferably a radically polymerizable group.

The aforementioned polymerizable group is not particularly limited as long as it is a polymerizable group. From the viewpoint of reactivity, an ethylenically unsaturated group is preferable, a vinylphenyl group (styryl group), a (meth)acryloxy group, or a (meth)acrylamide group is more preferable, and a (meth)acryloxy group is particularly preferable.

In addition, the polymer in the polymer particles having a polymerizable group preferably has a constitutional unit having a polymerizable group.

The polymerizable group may be introduced into the surface of the polymer particles by a polymer reaction.

Furthermore, from the viewpoint of printing durability, receptivity, developability, and suppressing the occurrence of development residues during on-press development, the polymer particles preferably contain a resin having a urea bond, more preferably contain a resin having a structure obtained by reacting at least an isocyanate compound represented by Formula (Iso) with water, and particularly preferably contain a resin that has a structure obtained by reacting at least an isocyanate compound represented by Formula (Iso) with water and has a polyethylene oxide structure and a polypropylene oxide structure as polyoxyalkylene structures. Furthermore, the particles containing the resin having a urea bond are preferably microgel.

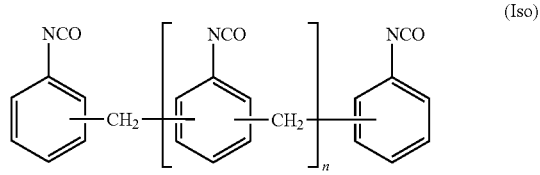

(Iso)

In Formula (Iso), n represents an integer of 0 to 10.

An example of the reaction between the isocyanate compound represented by Formula (Iso) and water is the reaction shown below. In the following example, a 4,4-isomer in which n=0 is used.

As shown below, in a case where the isocyanate compound represented by Formula (Iso) is reacted with water, the isocyanate group is partially hydrolyzed by water and generates an amino group. The generated amino group reacts with the isocyanate group and generates a urea bond, and a dimer is consequently formed. Furthermore, the following reaction is repeated to form a resin having a urea bond.

In the following reaction, by adding a compound (compound having active hydrogen) such as an alcohol compound or an amine compound reactive with an isocyanate group, it is possible to introduce the structure of an alcohol compound, an amine compound, or the like to the resin having a urea bond.

As the compound having active hydrogen, for example, the compounds described above regarding the microgel are preferable.

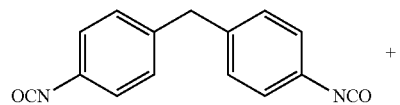

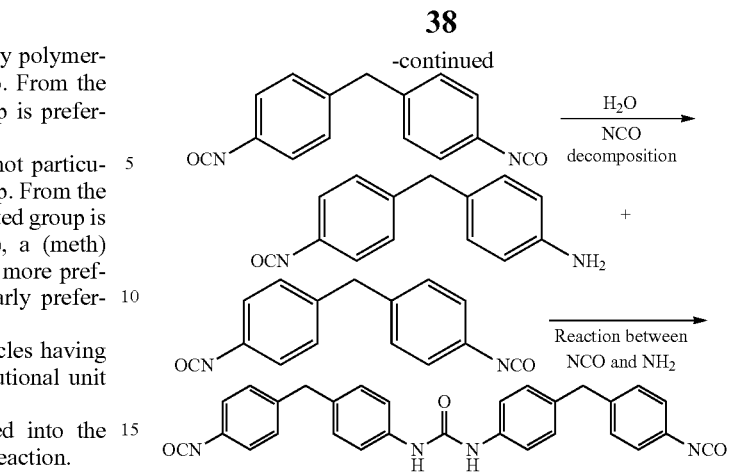

The resin having a urea bond preferably has an ethylenically unsaturated group, and more preferably has a group represented by Formula (PETA).

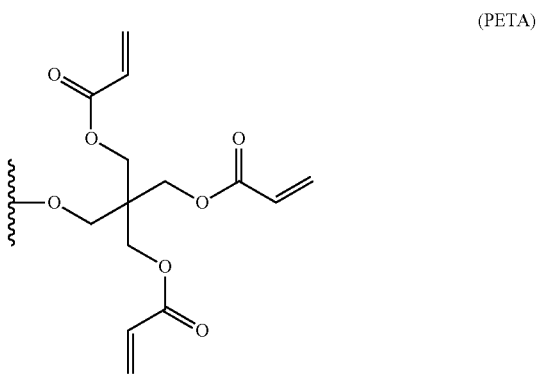 [SMILES: *OCC(COC(=O)C=C)(COC(=O)C=C)COC(=O)C=C]

(PETA)

In Formula (PETA), the portion of the wavy line represents a bonding position with other structures.

The average particle diameter of the above particle is preferably 0.01 μm to 3.0 μm, more preferably 0.03 μm to 2.0 μm, and even more preferably 0.10 μm to 1.0 μm. In a case where the particle diameter is in this range, excellent resolution and temporal stability are obtained.

In the present disclosure, the average primary particle diameter of the above particles is measured using a light scattering method or by capturing an electron micrograph of the particles, measuring the particle diameter of a total of 5,000 particles in the photograph, and calculating the average thereof. For non-spherical particles, the value of particle diameter of spherical particles having the same area as the area of the particles on the photograph is adopted as the particle diameter.

Note that unless otherwise specified, the average particle diameter in the present disclosure means a volume average particle diameter.

The image-recording layer may contain only one kind of particles, particularly, one kind of polymer particles or two or more kinds of polymer particles.

From the viewpoint of developability, UV printing durability, and suppressing UV plate missing, the content of particles, particularly, the content of polymer particles in the image-recording layer with respect to the total mass of the image-recording layer is preferably 5% by mass to 90% by mass, more preferably 10% by mass to 90% by mass, even more preferably 20% by mass to 90% by mass, and particularly preferably 50% by mass to 90% by mass.

Furthermore, from the viewpoint of developability, UV printing durability, and suppressing UV plate missing, the content of the polymer particles in the image-recording layer with respect to the total mass of components having a molecular weight of 3,000 or more in the image-recording layer is preferably 20% by mass to 100% by mass, more preferably 35% by mass to 100% by mass, even more preferably 50% by mass to 100% by mass, and particularly preferably 80% by mass to 100% by mass.

—Binder Polymer—

The image-recording layer may contain a binder polymer other than the polymer A. However, from the viewpoint of developability and UV printing durability, it is preferable that the image-recording layer do not contain a binder polymer.

The binder polymer is a polymer other than the polymer particles described above, that is, a binder polymer that is not in the form of particles.

The aforementioned binder polymer is preferably a (meth)acrylic resin, a polyvinyl acetal resin, or a polyurethane resin.

Among these, as the binder polymer described above, known binder polymers that can be used in an image-recording layer in lithographic printing plate precursors can be suitably used. As an example, a binder polymer that is used for an on-press development-type lithographic printing plate precursor (hereinafter, also called binder polymer for on-press development) will be specifically described.

As the binder polymer for on-press development, a binder polymer having an alkylene oxide chain is preferable. The binder polymer having an alkylene oxide chain may have a poly(alkylene oxide) moiety in a main chain or side chain. In addition, the binder polymer may be a graft polymer having poly(alkylene oxide) in a side chain or a block copolymer of a block constituted with a poly(alkylene oxide)-containing repeating unit and a block constituted with an (alkylene oxide)-free repeating unit.

As a binder polymer having a poly(alkylene oxide) moiety in the main chain, a polyurethane resin is preferable. In a case where the binder polymer has a poly(alkylene oxide) moiety in the side chain, examples of polymers include a (meth)acrylic resin, a polyvinyl acetal resin, a polyurethane resin, a polyurea resin, a polyimide resin, a polyamide resin, an epoxy resin, a polystyrene resin, a novolac-type phenol resin, a polyester resin, synthetic rubber, and natural rubber. Among these, a (meth)acrylic resin is particularly preferable.

In addition, as the binder polymer, for example, a polymer compound is also preferable which has a polyfunctional thiol having 6 or more and 10 or less functional groups as a nucleus and a polymer chain that is bonded to the nucleus by a sulfide bond and has a polymerizable group (hereinafter, this compound will be also called star-shaped polymer compound). As the star-shaped polymer compound, for example, the compounds described in JP2012-148555A can be preferably used.

Examples of the star-shaped polymer compound include the compound described in JP2008-195018A that has a polymerizable group such as an ethylenically unsaturated bond for improving the film hardness of an image area in a main chain or side chain and preferably in a side chain. The polymerizable group forms a crosslink between polymer molecules, which facilitates curing.

As the polymerizable group, an ethylenically unsaturated group such as a (meth)acryloyl group, a vinyl group, an allyl group, or a styryl group, an epoxy group, or the like is preferable, a (meth)acryloyl group, a vinyl group, or a styryl group is more preferable from the viewpoint of polymerization reactivity, and a (meth)acryloyl group is particularly preferable. These groups can be introduced into the polymer by a polymer reaction or copolymerization. For example, it is possible to use a reaction between a polymer having a carboxy group in a side chain and glycidyl methacrylate or a reaction between a polymer having an epoxy group and an ethylenically unsaturated group-containing carboxylic acid such as methacrylic acid. These groups may be used in combination.

The molecular weight of the binder polymer that is a weight-average molecular weight (Mw) expressed in terms of polystyrene by GPC is preferably 2,000 or more, more preferably 5,000 or more, and even more preferably 10,000 to 300,000.

If necessary, a hydrophilic polymer such as polyacrylic acid or polyvinyl alcohol described in JP2008-195018A can be used in combination. In addition, a lipophilic polymer and a hydrophilic polymer can be used in combination.

In the image-recording layer used in the present disclosure, one kind of binder polymer may be used alone, or two or more kinds of binder polymers may be used in combination.

The amount of the binder polymer to be incorporated into the image-recording layer can be randomly set. From the viewpoint of developability and UV printing durability, in the image-recording layer, the content of the binder polymer is preferably 0% or more than 0% by mass and 20% by mass or less with respect to the total mass of the image-recording layer, more preferably 0% or more than 0% by mass and 10% by mass or less with respect to the total mass of the image-recording layer, even more preferably 0% or more than 0% by mass and 5% by mass or less with respect to the total mass of the image-recording layer, particularly preferably 0% or more than 0% by mass and 2% by mass or less with respect to the total mass of the image-recording layer, and most preferably 0%.

—Color Developing Agent—

The image-recording layer preferably contains a color developing agent, and more preferably contains an acid color-developing agent. Furthermore, the color developing agent preferably includes a leuco compound.

"Color developing agent" used in the present disclosure means a compound that develops or removes color by a stimulus such as light or acid and thus changes the color of the image-recording layer. Furthermore, "acid color-developing agent" means a compound that develops or removes color by being heated in a state of accepting an electron accepting compound (for example, a proton of an acid or the like) and thus changes the color of the image-recording layer. The acid color-developing agent is particularly preferably a colorless compound which has a partial skeleton such as lactone, lactam, sultone, spiropyran, an ester, or an amide and allows such a partial skeleton to rapidly open the ring or to be cleaved when coming into contact with an electron accepting compound.

Examples of such an acid color-developing agent include phthalides such as 3,3-bis(4-dimethylaminophenyl)-6-dimethylaminophthalide (called "crystal violet lactone"), 3,3-bis(4-dimethylaminophenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl) phthalide, 3-(4-dimethylaminophenyl)-3-(2-methylindole-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazol-3-yl)-6-dimethylaminophthalide, 3,3-bis(2-phenylindol-3-yl)-6-dimethylaminophthalide, 3-(4-dimethylaminophenyl)-3-(1-methylpyrrol-3-yl)-6-dimethylaminophthalide, 3,3-bis[1,1-bis(4-dimethylaminophenyl)ethylen-2-yl]-4,5,6,7-tetrachlorophthalide, 3,3-bis[1,1-bis(4-pyrrolidinophenyl)ethylen-2-yl]-4,5,6,7-tetrabromophthalide, 3,3-bis[1-(4-dimethylaminophenyl)-1-(4-methoxyphenyl)ethylen-2-yl]-4,5,6,7-tetrachlorophthalide, 3,3-bis[1-(4-pyrrolidinophenyl)-1-(4-methoxyphenyl)ethylen-2-yl]-4,5,6,7-tetrachlorophthalide, 3-[1,1-di(1-ethyl-2-methylindol-3-yl)ethylen-2-yl]-3-(4-diethylaminophenyl)phthalide, 3-[1,1-di(1-ethyl-2-methylindol-3-yl)ethylen-2-yl]-3-(4-N-ethyl-N-phenylaminophenyl)phthalide, 3-(2-ethoxy-4-diethylaminophenyl)-3-(1-n-octyl-2-methylindol-3-yl)-phthalide, 3,3-bis(1-n-octyl-2-methylindol-3-yl)-phthalide, and 3-(2-methyl-4-diethylaminophenyl)-3-(1-n-octyl-2-methylindol-3-yl)-phthalide, 4,4-bis-dimethylaminobenzhydrinbenzyl ether, N-halophenyl-leucoauramine, N-2,4,5-trichlorophenylleucoauramine, rhodamine-B-anilinolactam, rhodamine-(4-nitroanilino)lactam, rhodamine-B-(4-chloroanilino)lactam, 3,7-bis(diethylamino)-10-benzoylphenoxazine, benzoyl leucomethylene blue, 4-nitrobenzoyl methylene blue, fluorans such as 3,6-dimethoxyfluoran, 3-dimethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzylaminofluoran, 3-diethylamino-7-octylaminofluoran, 3-diethylamino-7-di-n-hexylaminofluoran, 3-diethylamino-7-anilinofluoran, 3-diethylamino-7-(2'-fluorophenylamino)fluoran, 3-diethylamino-7-(2'-chlorophenylamino)fluoran, 3-diethylamino-7-(3'-chlorophenylamino)fluoran, 3-diethylamino-7-(2',3'-dichlorophenylamino)fluoran, 3-diethylamino-7-(3'-trifluoromethylphenylamino)fluoran, 3-di-n-butylamino-7-(2'-fluorophenylamino)fluoran, 3-di-n-butylamino-7-(2'-chlorophenylamino)fluoran, 3-N-isopentyl-N-ethylamino-7-(2'-chlorophenylamino)fluoran, 3-N-n-hexyl-N-ethylamino-7-(2'-chlorophenylamino)fluoran, 3-diethylamino-6-chloro-7-anilinofluoran, 3-di-n-butylamino-6-chloro-7-anilinofluoran, 3-diethylamino-6-methoxy-7-anilinofluoran, 3-di-n-butylamino-6-ethoxy-7-anilinofluoran, 3-pyrrolidino-6-methyl-7-anilinofluoran, 3-piperidino-6-methyl-7-anilinofluoran, 3-morpholino-6-methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methylamino-6-methyl-7-anilinofluoran, 3-N-n-propyl-N-methylamino-6-methyl-7-anilinofluoran, 3-N-n-propyl-N-ethylamino-6-methyl-7-anilinofluoran, 3-N-n-butyl-N-methylamino-6-methyl-7-anilinofluoran, 3-N-n-butyl-N-ethylamino-6-methyl-7-anilinofluoran, 3-N-isobutyl-N-methylamino-6-methyl-7-anilinofluoran, 3-N-isobutyl-N-ethylamino-6-methyl-7-anilinofluoran, 3-N-isopentyl-N-ethylamino-6-methyl-7-anilinofluoran, 3-N-n-hexyl-N-methylamino-6-methyl-7-anilinofluoran, 3-N-cyclohexyl-N-ethylamino-6-methyl-7-anilinofluoran, 3-N-cyclohexyl-N-n-propylamino-6-methyl-7-anilinofluoran, 3-N-cyclohexyl-N-n-butylamino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3'-methoxypropyl)-N-ethylamino-6-methyl-7-anilinofluoran, 3-N-(3'-ethoxypropyl)-N-methylamino-6-methyl-7-anilinofluoran, 3-N-(3'-ethoxypropyl)-N-ethylamino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethylamino-6-ethyl-7-anilinofluoran, 3-diethylamino-6-methyl-7-(3'-methylphenylamino)fluoran, 3-diethylamino-6-methyl-7-(2',6'-dimethylphenylamino)fluoran, 3-di-n-butylamino-6-methyl-7-(2',6'-dimethylphenylamino)fluoran, 3-di-n-butylamino-7-(2',6'-dimethylphenylamino)fluoran, 2,2-bis [4'-(3-N-cyclohexyl-N-methylamino-6-methylfluoran)-7-ylaminophenyl]propane, 3-[4'-(4-phenylaminophenyl)aminophenyl]amino-6-methyl-7-chlorofluoran, and 3-[4'-(dimethylaminophenyl)]amino-5,7-dimethylfluoran, phthalides such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di-n-hexylaminophenyl)-3-(1-n-octyl-2-methylindol-3-yl)-4,7-diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4 or 7-azaphthalide, 3-(2-ethoxy-4-diethylaminophenyl)-3-(1-ethyl-2-methylindol-3-yl)-4 or 7-azaphthalide, 3-(2-hexyloxy-4-diethylaminophenyl)-3-(1-ethyl-2-methylindol-3-yl)-4 or 7-azaphthalide, 3-(2-ethoxy-4-diethylaminophenyl)-3-(1-ethyl-2-phenylindol-3-yl)-4 or 7-azaphthalide, 3-(2-butoxy-4-diethylaminophenyl)-3-(1-ethyl-2-phenylindol-3-yl)-4 or 7-azaphthalide 3-methyl-spiro-dinaphthopyran, 3-ethyl-spiro-dinaphthopyran, 3-phenyl-spiro-dinaphthopyran, 3-benzyl-spiro-dinaphthopyran, 3-methyl-naphtho-(3-methoxybenzo)spiropyran, 3-propyl-spiro-dibenzopyran-3,6-bis(dimethylamino)fluorene-9-spiro-3'-(6'-dimethylamino)phthalide, and 3,6-bis(diethylamino)fluorene-9-spiro-3'-(6'-dimethylamino)phthalide, 2'-anilino-6'-(N-ethyl-N-isopentyl)amino-3'-methylspiro [isobenzofuran-1(3H),9'-(9H)xanthen-3-one, 2'-anilino-6'-(N-ethyl-N-(4-methylphenyl))amino-3'-methylspiro [isobenzofuran-1(3H),9'-(9H)xanthen]-3-one, 3'-N,N-dibenzylamino-6'-N,N-diethylaminospiro[isobenzofuran-1 (3H),9'-(9H)xanthen]-3-on e, 2'-(N-methyl-N-phenyl) amino-6'-(N-ethyl-N-(4-methylphenyl))aminospiro [isobenzofuran-1(3H),9'-(9H)xanthen-3-one, and the like.

Particularly, from the viewpoint of color developability, the color developing agent used in the present disclosure is preferably at least one kind of compound selected from the group consisting of a spiropyran compound, a spirooxazine compound, a spirolactone compound, and a spirolactam compound.

From the viewpoint of visibility, the hue of the colorant after color development is preferably green, blue, or black.

Furthermore, from the viewpoint of color developability and visibility of exposed portions, the acid color-developing agent is preferably a leuco colorant.

The leuco colorant is not particularly limited as long as it has a leuco structure. The leuco colorant preferably has a spiro structure, and more preferably has a spirolactone ring structure.

From the viewpoint of color developability and visibility of exposed portions, the leuco colorant preferably has a phthalide structure or a fluoran structure.

Furthermore, from the viewpoint of color developability and visibility of exposed portions, the leuco colorant having a phthalide structure or a fluoran structure is preferably a compound represented by any of Formula (Le-1) to Formula (Le-3), and more preferably a compound represented by Formula (Le-2).

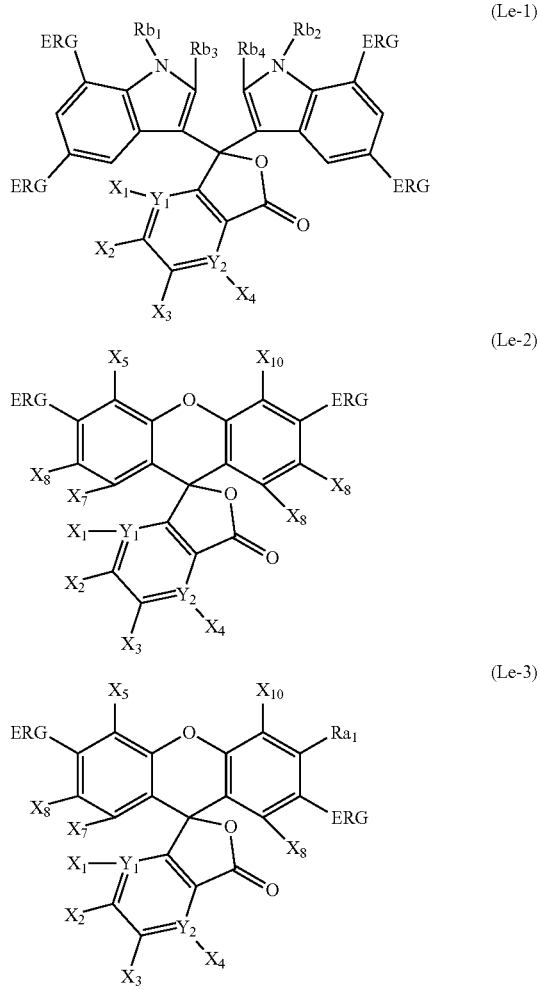

In Formula (Le-1) to Formula (Le-3), ERG each independently represents an electron donating group, $X_1$ to $X_4$ each independently represent a hydrogen atom, a halogen atom, or dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent a hydrogen atom, an alkyl group, or an aryl group.

As the electron donating groups represented by ERG in Formula (Le-1) to Formula (Le-3), from the viewpoint of color developability and visibility of exposed portions, an amino group, an alkylamino group, an arylamino group, a dialkylamino group, a monoalkyl monoarylamino group, a diarylamino group, an alkoxy group, an aryloxy group or an alkyl group is preferable, an amino group, alkylamino group, arylamino group, dialkylamino group, monoalkyl monoarylamino group, diarylamino group, alkoxy group, or an aryloxy group is more preferable, an arylamino group, a monoalkyl monoarylamino group, or a diarylamino group is even more preferable, and an arylamino group or a monoalkyl monoarylamino group is particularly preferable.

From the viewpoint of color developability and visibility of exposed portions, $X_1$ to $X_4$ in Formula (Le-1) to Formula (Le-3) preferably each independently represent a hydrogen atom or a chlorine atom, and more preferably each independently represent a hydrogen atom.

From the viewpoint of color developability and visibility of exposed portions, $X_5$ to $X_{10}$ in Formula (Le-2) or Formula (Le-3) preferably each independently represent a hydrogen atom, a halogen atom, an alkyl group, an aryl group, an amino group, an alkylamino group, an arylamino group, a dialkylamino group, a monoalkyl monoarylamino group, a diarylamino group, a hydroxy group, an alkoxy group, an aryloxy group, an acyl group, an alkoxycarbonyl group, an aryloxycarbonyl group, or an cyano group, more preferably each independently represent a hydrogen atom, a halogen atom, an alkyl group, an aryl group, an alkoxy group, or an aryloxy group, even more preferably each independently represent a hydrogen atom, a halogen atom, an alkyl group, or an aryl group, and particularly preferably each independently represent a hydrogen atom.

From the viewpoint of color developability and visibility of exposed portions, it is preferable that at least one of $Y_1$ or $Y_2$ in Formula (Le-1) to Formula (Le-3) be C, and it is more preferable that both of $Y_1$ and $Y_2$ be C.

From the viewpoint of color developability and visibility of exposed portions, $Ra_1$ in Formula (Le-1) to Formula (Le-3) is preferably an alkyl group or an alkoxy group, more preferably an alkoxy group, and particularly preferably a methoxy group.

From the viewpoint of color developability and visibility of exposed portions, $Rb_1$ to $Rb_4$ in Formula (Le-1) to Formula (Le-3) preferably each independently represent a hydrogen atom or an alkyl group, more preferably each independently represent an alkyl group, and particularly preferably each independently represent a methyl group.

From the viewpoint of color developability and visibility of exposed portions, the leuco colorant having a phthalide structure or a fluoran structure is more preferably a compound represented by any of Formula (Le-4) to Formula (Le-6), and even more preferably a compound represented by Formula (Le-5).

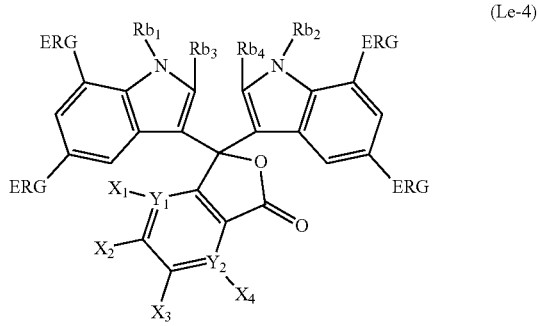

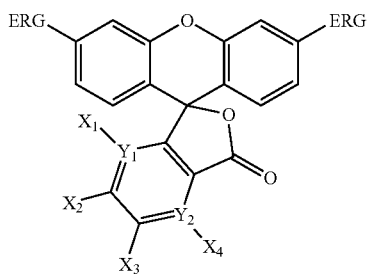

(Le-5)

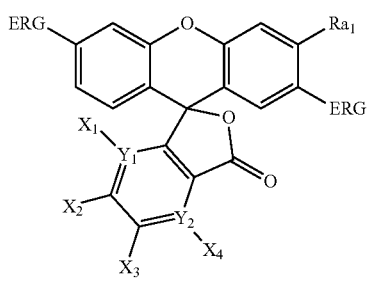

(Le-6)

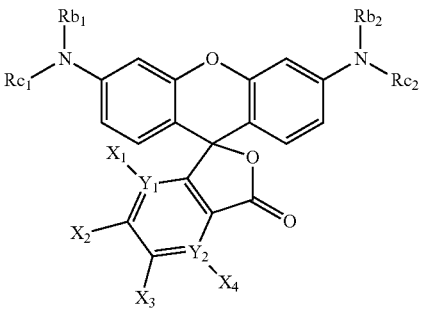

(Le-8)

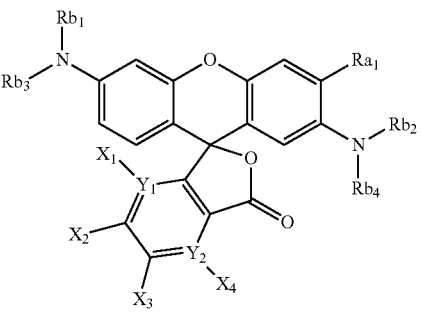

(Le-9)

In Formula (Le-4) to Formula (Le-6), ERG each independently represents an electron donating group, $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent a hydrogen atom, an alkyl group, or an aryl group.

ERG, $X_1$ to $X_4$, $Y_1$, $Y_2$, $Ra_1$, and $Rb_1$ to $Rb_4$ in Formula (Le-4) to Formula (Le-6) have the same definitions as ERG, $X_1$ to $X_4$, $Y_1$, $Y_2$, $Ra_1$, and $Rb_1$ to $Rb_4$ in Formula (Le-1) to Formula (Le-3) respectively, and preferred aspects thereof are also the same.

From the viewpoint of color developability and visibility of exposed portions, the leuco colorant having a phthalide structure or a fluoran structure is more preferably a compound represented by any of Formula (Le-7) to Formula (Le-9), and particularly preferably a compound represented by Formula (Le-8).

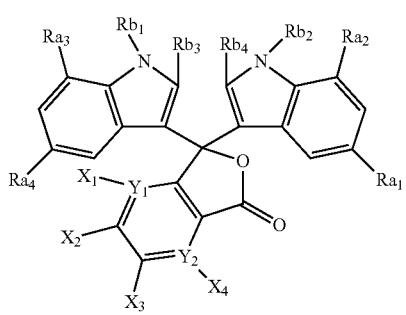

(Le-7)

In Formula (Le-7) to Formula (Le-9), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ to $Ra_4$ each independently represent a hydrogen atom, an alkyl group, or an alkoxy group, $Rb_1$ to $Rb_4$ each independently represent a hydrogen atom, an alkyl group, or an aryl group, and $Rc_1$ and $Rc_2$ each independently represent an aryl group.

$X_1$ to $X_4$, $Y_1$, and $Y_2$ in Formula (Le-7) to Formula (Le-9) have the same definition as $X_1$ to $X_4$, $Y_1$, and $Y_2$ in Formula (Le-1) to Formula (Le-3) respectively, and preferred aspects thereof are also the same.

From the viewpoint of color developability and visibility of exposed portions, $Ra_1$ to $Ra_4$ in Formula (Le-7) to Formula (Le-9) preferably each independently represent an alkyl group or an alkoxy group, more preferably each independently represent an alkoxy group, and particularly preferably each independently represent a methoxy group.

From the viewpoint of color developability and visibility of exposed portions, $Rb_1$ to $Rb_4$ in Formula (Le-7) to Formula (Le-9) preferably each independently represent a hydrogen atom, an alkyl group, or an aryl group substituted with an alkyl group or alkoxy group, more preferably each independently represent a hydrogen atom or an alkyl group, and particularly preferably each independently represent a hydrogen atom or a methyl group.

From the viewpoint of color developability and visibility of exposed portions, $Rc_1$ and $Rc_2$ in Formula (Le-8) preferably each independently represent a phenyl group or an alkylphenyl group, and more preferably each independently represent a phenyl group.

In Formula (Le-8), from the viewpoint of color developability and visibility of exposed portions, $X_1$ to $X_4$ preferably each represent a hydrogen atom, and $Y_1$ and $Y_2$ preferably each represent C.

From the viewpoint of color developability and visibility of exposed portions, $Rb_1$ to $Rb_2$ in Formula (Le-8) preferably each independently represent a hydrogen atom, an alkyl group, or an aryl group substituted with an alkyl group or an alkoxy group, more preferably each independently represent a hydrogen atom or an alkyl group.

The alkyl group in Formula (Le-1) to Formula (Le-9) may be linear or branched or may have a ring structure.

The number of carbon atoms in the alkyl group in Formula (Le-1) to Formula (Le-9) is preferably 1 to 20, more preferably 1 to 8, even more preferably 1 to 4, and particularly preferably 1 or 2.

The number of carbon atoms in the aryl group in Formula (Le-1) to Formula (Le-9) is preferably 6 to 20, more preferably 6 to 10, and particularly preferably 6 to 8.

Each of the groups in Formula (Le-1) to Formula (Le-9), such as a monovalent organic group, an alkyl group, an aryl group, a dialkylanilino group, an alkylamino group, and an alkoxy group, may have a substituent. Examples of the substituent include an alkyl group, an aryl group, a halogen atom, an amino group, an alkylamino group, an arylamino group, a dialkylamino group, a monoalkyl monoarylamino group, a diarylamino group, a hydroxy group, an alkoxy group, an aryloxy group, an acyl group, an alkoxycarbonyl group, an aryloxycarbonyl group, a cyano group, and the like. These substituents may be further substituted with these substituents.

Examples of the leuco colorant having a phthalide structure or a fluoran structure that are suitably used include the following compounds. Me represents a methyl group.

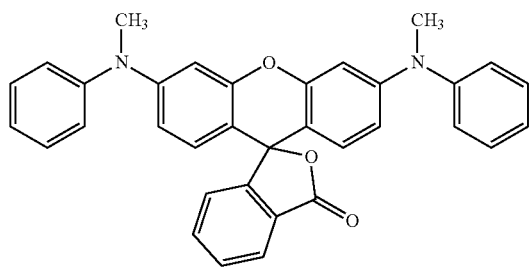

S-1

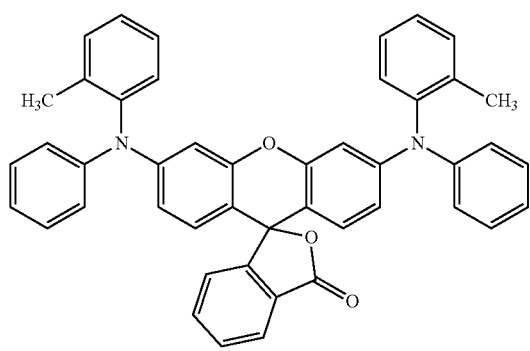

S-2

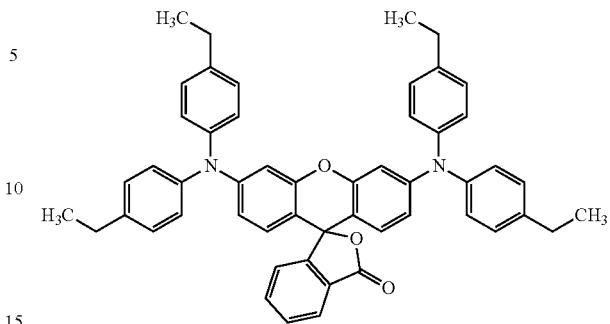

S-3

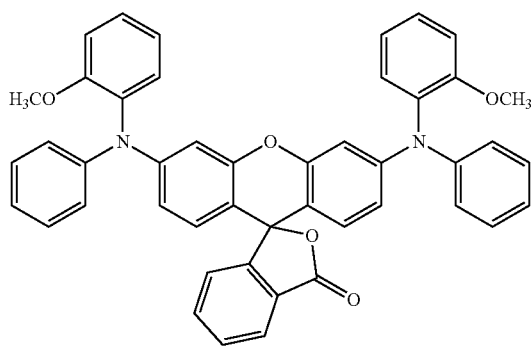

S-4

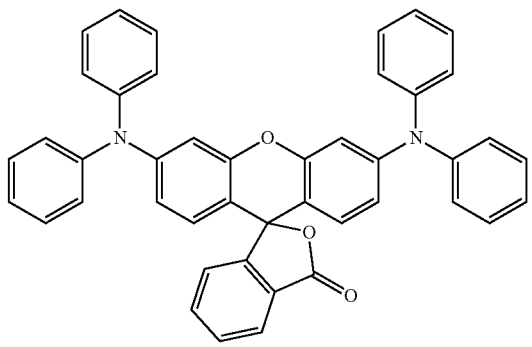

S-5

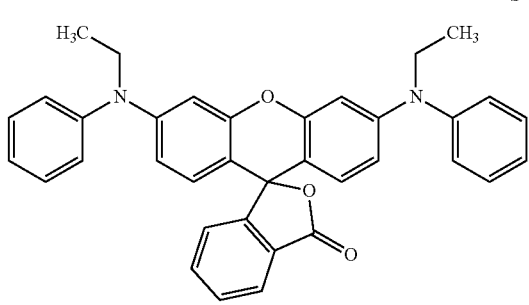

S-6

S-7
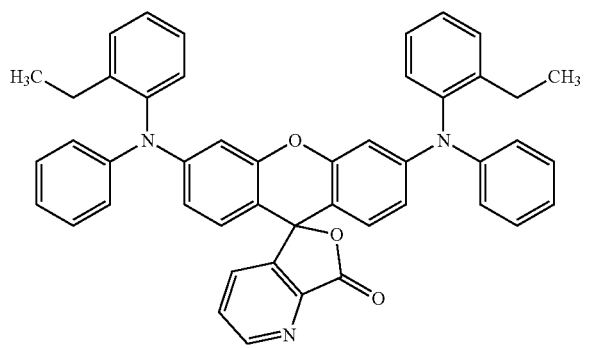
S-8
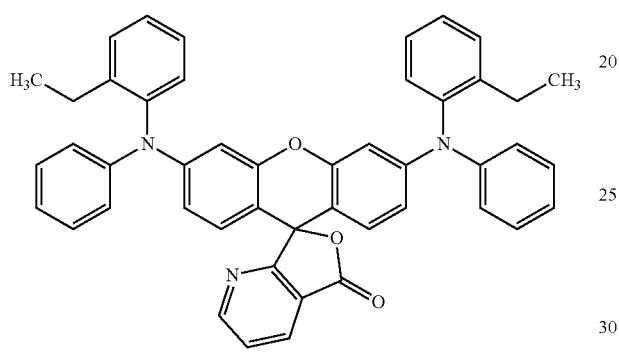
S-9
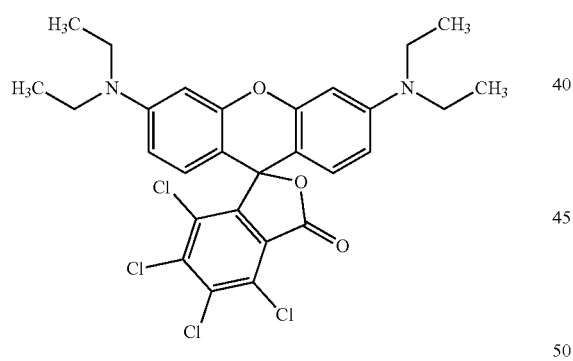
S-10
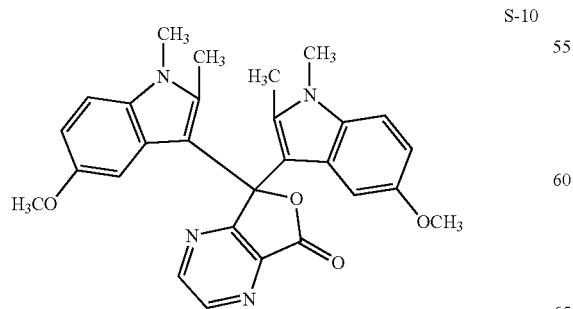
S-11
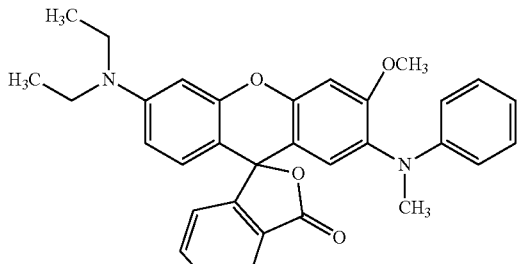
S-12
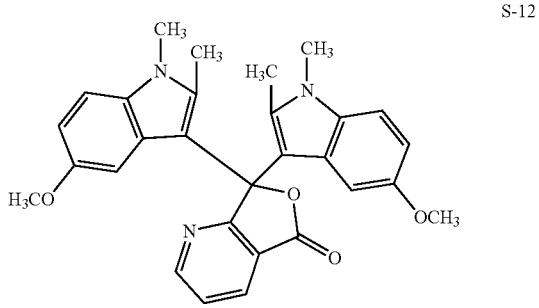
S-13
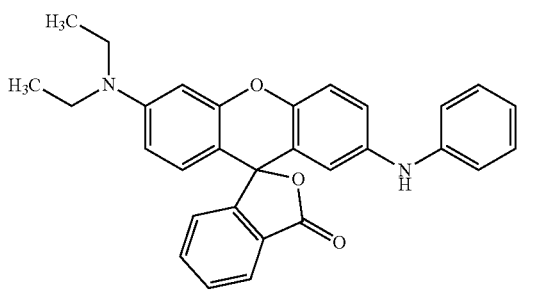
S-14
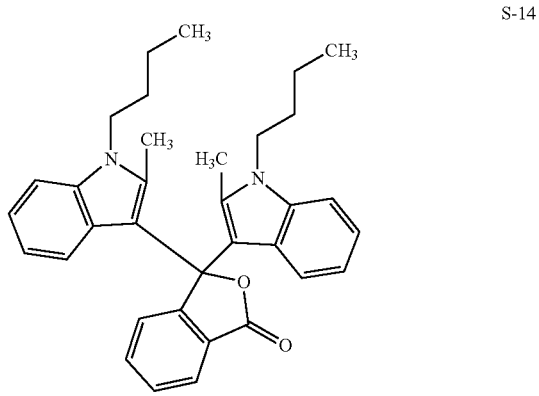
S-15
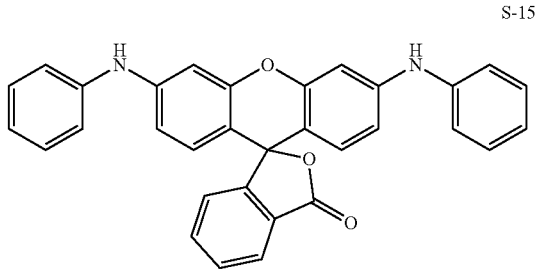
As the acid color-developing agent, commercially available products can be used. Examples thereof include ETAC, RED500, RED520, CVL, S-205, BLACK305, BLACK400, BLACK100, BLACK500, H-7001, GREEN300, NIR-BLACK78, BLUE220, H-3035, BLUE203, ATP, H-1046, and H-2114 (all manufactured by Fukui Yamada Chemical Co., Ltd.), ORANGE-DCF, Vermilion-DCF, PINK-DCF, RED-DCF, BLMB, CVL, GREEN-DCF, and TH-107 (all manufactured by Hodogaya Chemical Co., Ltd.), ODB, ODB-2, ODB-4, ODB-250, ODB-BlackXV, Blue-63, Blue-502, GN-169, GN-2, Green-118, Red-40, and Red-8 (all manufactured by Yamamoto Chemicals, Inc.), crystal violet lactone (manufactured by Tokyo Chemical Industry Co., Ltd.), and the like. Among these commercially available products, ETAC, S-205, BLACK305, BLACK400, BLACK100, BLACK500, H-7001, GREEN300, NIR-BLACK78, H-3035, ATP, H-1046, H-2114, GREEN-DCF, Blue-63, GN-169, and crystal violet lactone are preferable because these form a film having excellent visible light absorbance.

From the viewpoint of color developability and visibility of exposed portions, examples of suitably used leuco colorants include the following compounds.

CL-1

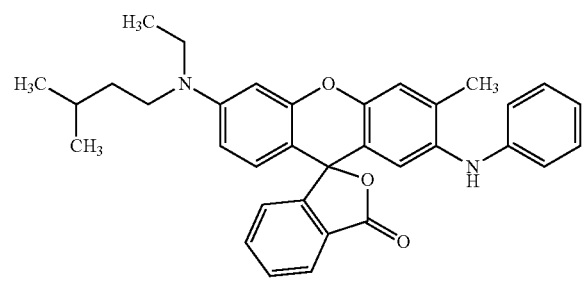

CL-2

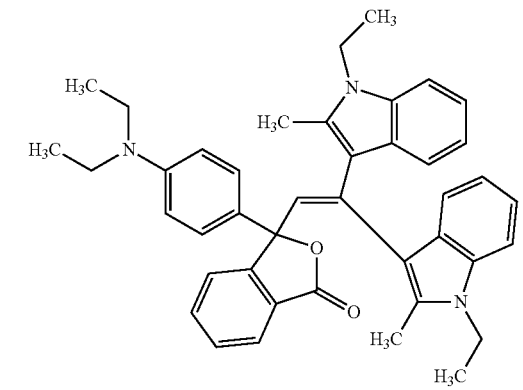

CL-3

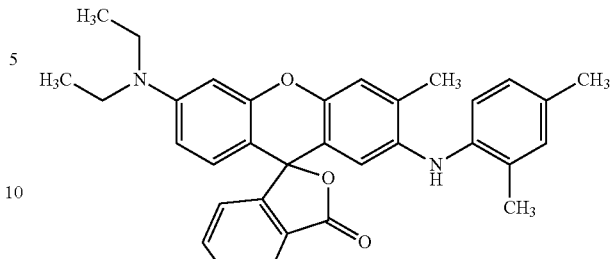

CL-4

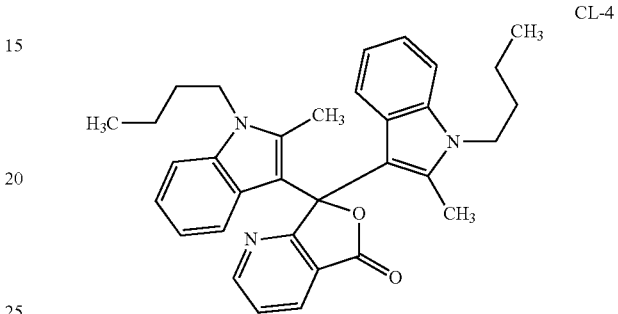

One kind of each of these color developing agents may be used alone. Alternatively, two or more kinds of components can be used in combination.

The content of the color developing agent with respect to the total mass of the image-recording layer is preferably 0.5% by mass to 10% by mass, and more preferably 1% by mass to 5% by mass.

—Chain Transfer Agent—

The image-recording layer used in the present disclosure may contain a chain transfer agent. The chain transfer agent contributes to the improvement of printing durability of the lithographic printing plate.

As the chain transfer agent, a thiol compound is preferable, a thiol having 7 or more carbon atoms is more preferable from the viewpoint of boiling point (low volatility), and a compound having a mercapto group on an aromatic ring (aromatic thiol compound) is even more preferable. The thiol compound is preferably a monofunctional thiol compound.

Specific examples of the chain transfer agent include the following compounds.

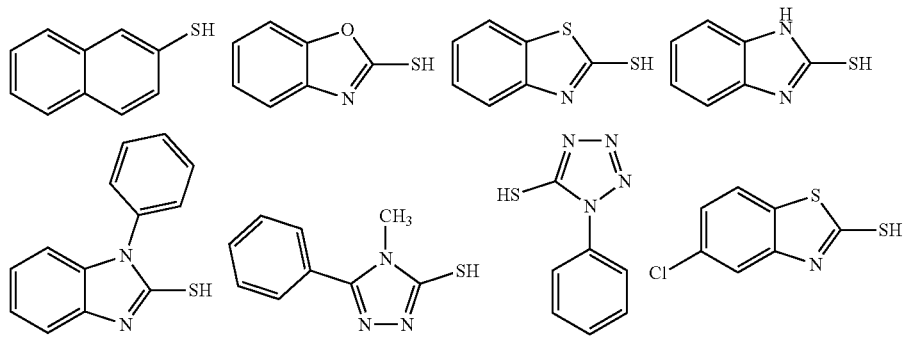

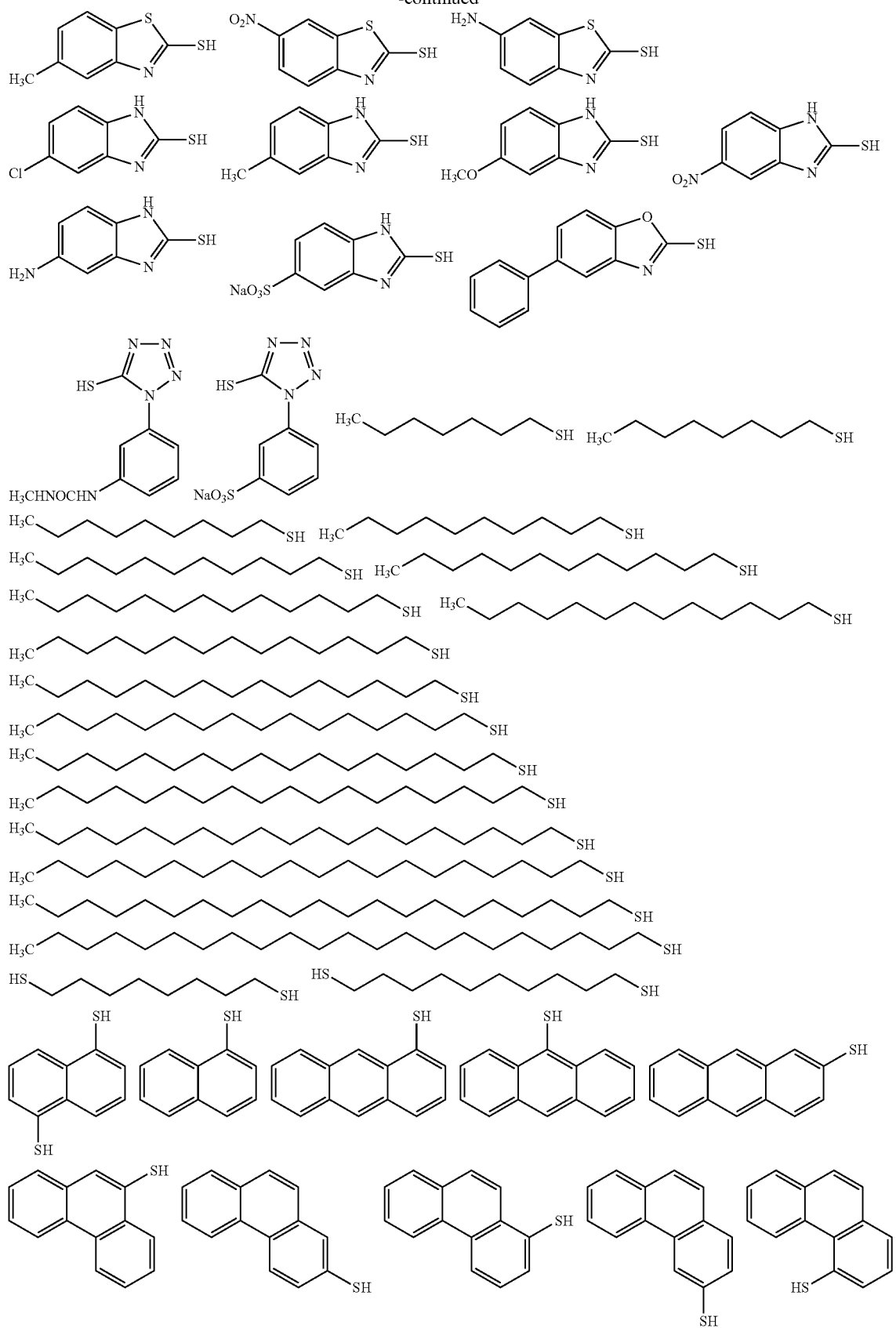

Only one kind of chain transfer agent may be added to the image-recording layer, or two or more kinds of chain transfer agents may be used in combination.

The content of the chain transfer agent with respect to the total mass of the image-recording layer is preferably 0.01% by mass to 50% by mass, more preferably 0.05% by mass to 40% by mass, and even more preferably 0.1% by mass to 30% by mass.

—Low-Molecular-Weight Hydrophilic Compound—

In order to suppress the deterioration of printing durability and improve developability, the image-recording layer may contain a low-molecular-weight hydrophilic compound. The low-molecular-weight hydrophilic compound is preferably a compound having a molecular weight less than 1,000, more preferably a compound having a molecular weight less than 800, and even more preferably a compound having a molecular weight less than 500.

Examples of the low-molecular-weight hydrophilic compound include water-soluble organic compounds including glycols such as ethylene glycol, diethylene glycol, triethylene glycol, propylene glycol, dipropylene glycol, and tripropylene glycol, ether or ester derivatives of these glycols, polyols such as glycerin, pentaerythritol, and tris(2-hydroxyethyl)isocyanurate, organic amines and salts thereof such as triethanolamine, diethanolamine, and monoethanolamine, organic sulfonic acids and salts thereof such as alkyl sulfonate, toluene sulfonate, and benzene sulfonate, organic sulfamic acids and salts thereof such as alkylsulfamate, organic sulfuric acids and salts thereof such as alkyl sulfate and alkyl ether sulfate, organic phosphonic acids and salts thereof such as phenyl phosphate, organic carboxylic acids and salts thereof such as tartaric acid, oxalic acid, citric acid, malic acid, lactic acid, gluconic acid, and amino acid, betaines, and the like.

As the low-molecular-weight hydrophilic compound, at least one compound selected from the group consisting of polyols, organic sulfates, organic sulfonates, and betaines is preferably incorporated into the image-recording layer.

Specific examples of the organic sulfonates include alkyl sulfonates such as sodium n-butyl sulfonate, sodium n-hexyl sulfonate, sodium 2-ethylhexyl sulfonate, sodium cyclohexyl sulfonate, and sodium n-octyl sulfonate; alkyl sulfonates having an ethylene oxide chain such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, and sodium 5,8,11,14-tetraoxatetracosane-1-sulfonate; aryl sulfonates such as sodium benzenesulfonate, sodium p-toluenesulfonate, sodium p-hydroxybenzene sulfonate, sodium p-styrene sulfonate, sodium dimethyl isophthalate-5-sulfonate, sodium 1-naphthyl sulfonate, sodium 4-hydroxynaphthyl sulfonate, disodium 1,5-naphthalene disulfonate, and trisodium 1,3,6-naphthalene trisulfonate, the compounds described in paragraphs "0026" to "0031" of JP2007-276454A and paragraphs "0020" to "0047" of JP2009-154525A, and the like. The salt may be a potassium salt or a lithium salt.

Examples of the organic sulfates include sulfates of alkyl, alkenyl, alkynyl, aryl, or heterocyclic monoether of polyethylene oxide. The number of ethylene oxide units is preferably 1 to 4, and the salt is preferably a sodium salt, a potassium salt, or a lithium salt. Specific examples thereof include the compounds described in paragraphs "0034" to "0038" of JP2007-276454A.

As the betaines, compounds in which a nitrogen atom is substituted with a hydrocarbon substituent having 1 to 5 carbon atoms are preferable. Specifically, examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-propanesulfonate, 3-(1-pyridinio)-1-propanesulfonate, and the like.

The low-molecular-weight hydrophilic compound substantially does not have a surface activation action because a hydrophobic portion in this compound has a small structure. Therefore, this compound prevents dampening water from permeating the exposed portion of the image-recording layer (image area) and deteriorating hydrophobicity or film hardness of the image area. Accordingly, the image-recording layer can maintain excellent ink receiving properties and printing durability.

The content of the low-molecular-weight hydrophilic compound with respect to the total mass of the image-recording layer is preferably 0.5% by mass to 20% by mass, more preferably 1% by mass to 15% by mass, and even more preferably 2% by mass to 10% by mass. In a case where the content is within this range, excellent developability and printing durability can be obtained.

One kind of low-molecular-weight hydrophilic compound may be used alone, or two or more kinds of low-molecular-weight hydrophilic compounds may be used by being mixed together.

—Oil Sensitizing Agent—

In order to improve receptivity, the image-recording layer may contain an oil sensitizing agent such as a phosphonium compound, a nitrogen-containing low-molecular-weight compound, or an ammonium group-containing polymer. Particularly, in a case where an inorganic lamellar compound is incorporated into a protective layer, these compounds function as a surface coating agent for the inorganic lamellar compound and can inhibit the receptivity deterioration caused in the middle of printing by the inorganic lamellar compound.

As the oil sensitizing agent, it is preferable to use a phosphonium compound, a nitrogen-containing low-molecular-weight compound, and an ammonium group-containing polymer in combination, and it is more preferable to use a phosphonium compound, quaternary ammonium salts, and an ammonium group-containing polymer in combination.

Examples of the phosphonium compound include the phosphonium compounds described in JP2006-297907A and JP2007-50660A. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, 1,9-bis(triphenylphosphonio)nonane=naphthalene-2,7-disulfonate, and the like.

Examples of the nitrogen-containing low-molecular-weight compound include amine salts and quaternary ammonium salts. In addition, examples thereof also include imidazolinium salts, benzimidazolinium salts, pyridinium salts, and quinolinium salts. Among these, quaternary ammonium salts and pyridinium salts are preferable. Specific examples thereof include tetramethylammonium=hexafluorophosphate, tetrabutylammonium=hexafluorophosphate, dodecyltrimethylammonium=p-toluenesulfonate, benzyltriethylammonium=hexafluorophosphate, benzyldimethyloctylammonium=hexafluorophosphate, benzyldimethyldodecylammonium=hexafluorophosphate, compounds described in paragraphs "0021" to "0037" of JP2008-284858A and paragraphs "0030" to "0057" of JP2009-90645A, and the like.

The ammonium group-containing polymer may have an ammonium group in the structure. As such a polymer, a polymer is preferable in which the content of (meth)acrylate having an ammonium group in a side chain as a copolymerization component is 5 mol % to 80 mol %. Specific examples thereof include the polymers described in paragraphs "0089" to "0105" of JP2009-208458A.

The reduced specific viscosity (unit: ml/g) of an ammonium group-containing polymer determined according to the measurement method described in JP2009-208458A is preferably in a range of 5 to 120, more preferably in a range of 10 to 110, and particularly preferably in a range of 15 to 100. In a case where the reduced specific viscosity is converted into a weight-average molecular weight (Mw), the weight-average molecular weight is preferably 10,000 to 1,500,000, more preferably 17,000 to 140,000, and particularly preferably 20,000 to 130,000.

Specific examples of the ammonium group-containing polymer will be shown below.

(1) 2-(Trimethylammonio)ethylmethacrylate=p-toluenesulfonate/3,6-dioxaheptylmethacrylate copolymer (molar ratio: 10/90, Mw: 45,000)
(2) 2-(Trimethylammonio)ethylmethacrylate=hexafluorophosphate/3,6-dioxaheptylmethacrylate copolymer (molar ratio: 20/80, Mw: 60,000)
(3) 2-(Ethyldimethylammonio)ethylmethacrylate=p-toluenesulfonate/hexylmethacrylate copolymer (molar ratio: 30/70, Mw: 45,000)
(4) 2-(Trimethylammonio)ethylmethacrylate=hexafluorophosphate/2-ethylhexylmethacrylate copolymer (molar ratio: 20/80, Mw: 60,000)
(5) 2-(Trimethylammonio)ethylmethacrylate=methylsulfate/hexylmethacrylate copolymer (molar ratio: 40/60, Mw: 70,000)
(6) 2-(Butyldimethylammonio)ethylmethacrylate=hexafluorophosphate/3,6-dioxaheptylmethacrylate copolymer (molar ratio: 25/75, Mw: 65,000)
(7) 2-(Butyldimethylammonio)ethylacrylate=hexafluorophosphate/3,6-dioxaheptylmethacrylate copolymer (molar ratio: 20/80, Mw: 65,000)
(8) 2-(Butyldimethylammonio)ethylmethacrylate=13-ethyl-5,8,11-trioxa-1-heptadecanesulfonate/3,6-dioxaheptylmethacrylate copolymer (molar ratio: 20/80, Mw: 75,000)
(9) 2-(Butyldimethylammonio)ethylmethacrylate=hexafluorophosphate/3,6-dioxaheptylmethacrylate/2-hydroxy-3-methacryloyloxypropylmethacrylate copolymer (molar ratio: 15/80/5, Mw: 65,000)

The content of the oil sensitizing agent with respect to the total mass of the image-recording layer is preferably 0.01% by mass to 30.0% by mass, more preferably 0.1% by mass to 15.0% by mass, and even more preferably 1% by mass to 10% by mass.

—Other Components—

As other components, a surfactant, a polymerization inhibitor, a higher fatty acid derivative, a plasticizer, inorganic particles, an inorganic lamellar compound, and the like can be incorporated into the image-recording layer. Specifically, the description in paragraphs "0114" to "0159" of JP2008-284817A can be referred to.

—Formation of Image-Recording Layer—

The image-recording layer in the lithographic printing plate precursor according to the present disclosure can be formed, for example, by preparing a coating liquid by dispersing or dissolving the necessary components described above in a known solvent, coating a support with the coating liquid by a known method such as bar coating, and drying the coating liquid, as described in paragraphs "0142" and "0143" of JP2008-195018A.

As the solvent, known solvents can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy methoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, and the like. One kind of solvent may be used alone, or two or more kinds of the solvents may be used in combination. The concentration of solid contents in the coating liquid is preferably about 1% to 50% by mass.

The coating amount (solid content) of the image-recording layer after coating and drying varies with uses. However, from the viewpoint of obtaining excellent sensitivity and excellent film characteristics of the image-recording layer, the coating amount is preferably 0.3 $g/m^2$ to 3.0 $g/m^2$.

<Support>

The lithographic printing plate precursor according to the present disclosure has a support.

The support to be used can be appropriately selected from known supports for a lithographic printing plate precursor.

As the support, a support having a hydrophilic surface (hereinafter, also called "hydrophilic support") is preferable.

As the support in the present disclosure, an aluminum plate is preferable which has been roughened using a known method and has undergone an anodic oxidation treatment. That is, the support in the present disclosure preferably has an aluminum plate and an aluminum anodic oxide film disposed on the aluminum plate.

As the support in the present disclosure, an aluminum support is preferable.

The aluminum support of the lithographic printing plate precursor according to the present disclosure to be used can be appropriately selected from known aluminum supports for a lithographic printing plate precursor.

As the aluminum support, an aluminum support having a hydrophilic surface (hereinafter, also called "hydrophilic aluminum support") is preferable.

For the aluminum support in the lithographic printing plate precursor according to the present disclosure, from the viewpoint of suppressing scratches and contamination, a water contact angle on a surface of the aluminum support on the image-recording layer side that is determined by an airborne water droplet method is preferably 1100 or less, more preferably 900 or less, even more preferably 80° or less, still more preferably 50° or less, particularly preferably 30° or less, more particularly preferably 20° or less, and most preferably 10° or less.

In the present disclosure, the water contact angle on a surface of the aluminum support on the image-recording layer side that is determined by an airborne water droplet method is measured by the following method.

The lithographic printing plate precursor is immersed in a solvent capable of removing the image-recording layer (for example, a solvent used in a coating liquid for an image-recording layer), and the image-recording layer is scraped off with at least one of sponge or cotton or dissolved in a solvent, so that the surface of the aluminum support is exposed.

The water contact angle on a surface of the exposed aluminum support on the image-recording layer side is measured using a measurement device, a fully automatic contact angle meter (for example, DM-501 manufactured by Kyowa Interface Science Co., Ltd.), as a water droplet contact angle on the surface at 25° C. (after 0.2 seconds).

As the aluminum support in the present disclosure, an aluminum plate is preferable which has been roughened using a known method and has undergone an anodic oxidation treatment. That is, the aluminum support in the present disclosure preferably has an aluminum plate and an aluminum anodic oxide film disposed on the aluminum plate.

One of the examples of preferred aspects of the aluminum support used in the present disclosure (the aluminum support according to this example is also called "support (1)") is as below.

That is, the support (1) has an aluminum plate and an anodic oxide film of aluminum disposed on the aluminum plate, the anodic oxide film is at a position closer to a side of the image-recording layer than the aluminum plate and has micropores extending in a depth direction from the surface of the anodic oxide film on the side of the image-recording layer, the average diameter of the micropores within the surface of the anodic oxide film is more than 10 nm and 100 nm or less, and a value of brightness L* of the surface of the anodic oxide film on the side of the image-recording layer is 70 to 100 in the L*a*b* color space.

FIG. 1 is a schematic cross-sectional view of an embodiment of an aluminum support 12a.

The aluminum support 12a has a laminated structure in which an aluminum plate 18 and an anodic oxide film 20a of aluminum (hereinafter, also simply called "anodic oxide film 20a") are laminated in this order. The anodic oxide film 20a in the aluminum support 12a is positioned so that the anodic oxide film 20a is closer to the image-recording layer side than the aluminum plate 18. That is, it is preferable that the lithographic printing plate precursor according to the present disclosure have at least an anodic oxide film, an image-recording layer, and a water-soluble resin layer in this order on an aluminum plate.

—Anodic Oxide Film—

Hereinafter, preferred aspects of the anodic oxide film 20a will be described.

The anodic oxide film 20a is a film prepared on a surface of the aluminum plate 18 by an anodic oxidation treatment. This film has uniformly distributed ultrafine micropores 22a approximately perpendicular to the surface of the film. The micropores 22a extend from a surface of the anodic oxide film 20a on the image-recording layer side (a surface of the anodic oxide film 20a opposite to the aluminum plate 18) along the thickness direction (toward the aluminum plate 18).

Within the surface of the anodic oxide film, the average diameter (average opening diameter) of the micropores 22a in the anodic oxide film 20a is preferably more than 10 nm and 100 nm or less. Particularly, from the viewpoint of balance between printing durability, antifouling properties, and image visibility, the average diameter of the micropores 22a is more preferably 15 nm to 60 nm, even more preferably 20 nm to 50 nm, and particularly preferably 25 nm to 40 nm. The internal diameter of the pores may be larger or smaller than the pore diameter within the surface layer.

In a case where the average diameter is more than 10 nm, printing durability and image visibility are further improved. Furthermore, in a case where the average diameter is 100 nm or less, printing durability is further improved.

The average diameter of the micropores 22a is determined by observing the surface of the anodic oxide film 20a with a field emission scanning electron microscope (FE-SEM) at 150,000× magnification (N=4), measuring the size (diameter) of 50 micropores existing in a range of 400 nm×600 nm in the obtained 4 images, and calculating the arithmetic mean thereof.

In a case where the shape of the micropores 22a is not circular, the equivalent circular diameter is used. "Equivalent circular diameter" is a diameter determined on an assumption that the opening portion is in the form of a circle having the same projected area as the projected area of the opening portion.

The depth of the micropores 22a is not particularly limited, but is preferably 10 nm to 3,000 nm, more preferably 50 nm to 2,000 nm, and even more preferably 300 nm to 1,600 nm. The depth is a value obtained by taking a photograph (150,000× magnification) of a cross section of the anodic oxide film 20a, measuring the depths of 25 or more micropores 22a, and calculating the average thereof.

The shape of the micropores 22a is not particularly limited. In FIG. 1, the micropores 22a have a substantially straight tubular shape (substantially cylindrical shape). However, the micropores 22a may have a conical shape that tapers along the depth direction (thickness direction). The shape of the bottom portion of the micropores 22a is not particularly limited, and may be a curved (convex) or flat surface shape.

In the L*a*b* color space, the value of brightness L* of the surface of the aluminum support 12a on the image-recording layer side (surface of the anodic oxide film 20a on the image-recording layer side) is preferably 70 to 100. Especially, the value of brightness L* is preferably 75 to 100 and more preferably 75 to 90, because printing durability and image visibility are better balanced in this range.

The brightness L* is measured using a color difference meter Spectro Eye manufactured by X-Rite, Incorporated.

For example, an aspect is also preferable in which the micropores in the support (1) are each constituted with a large diameter portion that extends to a position at a depth of 10 nm to 1,000 nm from the surface of the anodic oxide film and a small diameter portion that is in communication with the bottom portion of the large diameter portion and extends to a position at a depth of 20 nm to 2,000 nm from a communication position, an average diameter of the large diameter portion within the surface of the anodic oxide film is 15 nm to 150 nm, and an average diameter of the small diameter portion at a communication position is 13 nm or less (hereinafter, the support according to this aspect will be also called "support (2)").

Figure 2:
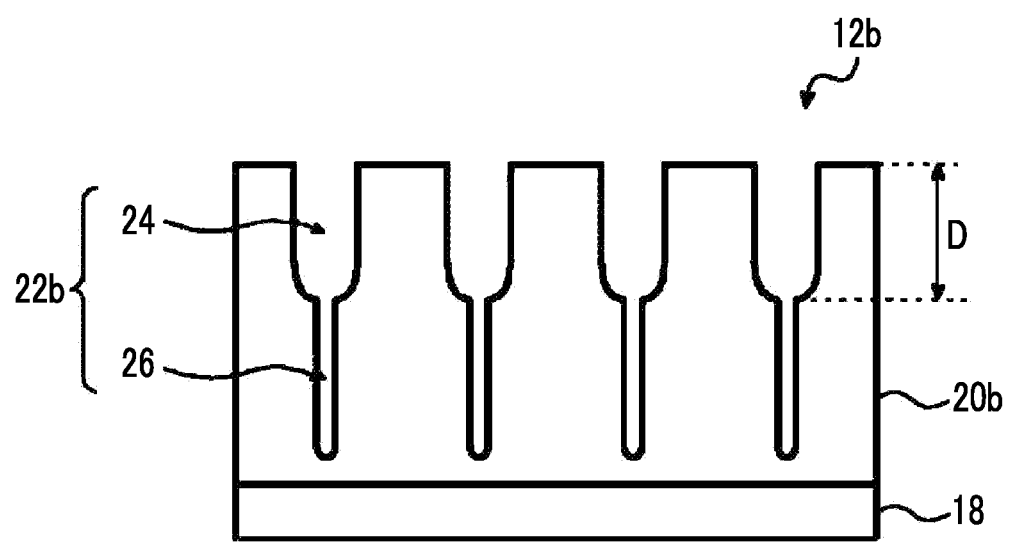
FIG. 2 is a schematic cross-sectional view of another embodiment of the aluminum support.

FIG. 2 is a schematic cross-sectional view of an embodiment of the aluminum support 12a that is different from what is shown in FIG. 1.

In FIG. 2, an aluminum support 12b includes an aluminum plate 18 and an anodic oxide film 20b having micropores 22b each composed of a large diameter portion 24 and a small diameter portion 26.

The micropores 22b in the anodic oxide film 20b are each composed of the large diameter portion 24 that extends to a position at a depth of 10 nm to 1,000 nm (depth D: see FIG. 2) from the surface of the anodic oxide film and the small diameter portion 26 that is in communication with the bottom portion of the large diameter portion 24 and further extends from the communication position to a position at a depth of 20 nm to 2,000 nm.

Hereinafter, the large diameter portion 24 and the small diameter portion 26 will be specifically described.

The average diameter of the large diameter portion 24 within the surface of the anodic oxide film 20b is the same as the average diameter of the micropores 22a in the aforementioned anodic oxide film 20a within the surface of the anodic oxide film, which is more than 10 nm and 100 nm or less. The suitable range thereof is also the same.

The method for measuring the average diameter of the large diameter portion 24 within the surface of the anodic oxide film 20b is the same as the method for measuring the average diameter of the micropores 22a in the anodic oxide film 20a within the surface of the anodic oxide film.

The bottom portion of the large diameter portion 24 is in a position at a depth of 10 nm to 1,000 nm (hereinafter, also called depth D) from the surface of the anodic oxide film. That is, the large diameter portion 24 is a pore portion extending to a position at a depth of 10 nm to 1,000 nm from the surface of the anodic oxide film in the depth direction (thickness direction). The depth is preferably 10 nm to 200 nm.

The depth is a value obtained by taking a photograph (150,000× magnification) of a cross section of the anodic oxide film 20b, measuring the depths of 25 or more large diameter portions 24, and calculating the average thereof.

The shape of the large diameter portion 24 is not particularly limited. Examples of the shape of the large diameter portion 24 include a substantially straight tubular shape (substantially cylindrical shape) and a conical shape that tapers along the depth direction (thickness direction). Among these, a substantially straight tubular shape is preferable.

As shown in FIG. 2, the small diameter portion 26 is a pore portion that is in communication with the bottom portion of the large diameter portion 24 and further extends from the communication position in the depth direction (thickness direction).

The average diameter of the small diameter portion 26 at the communication position is preferably 13 nm or less. Particularly, the average diameter is preferably 11 nm or less, and more preferably 10 nm or less. The lower limit thereof is not particularly limited, but is 5 nm or more in many cases.

The average diameter of the small diameter portion 26 is obtained by observing the surface of the anodic oxide film 20a with FE-SEM at 150,000× magnification (N=4), measuring the size (diameter) of the micropores (small diameter portion) existing in a range of 400 nm×600 nm in the obtained 4 images, and calculating the arithmetic mean thereof. In a case where the large diameter portion is deep, if necessary, the upper portion of the anodic oxide film 20b (region where the large diameter portion is located) may be cut (for example, by using argon gas), then the surface of the anodic oxide film 20b may be observed with FE-SEM as described above, and the average diameter of the small diameter portion may be determined.

In a case where the shape of the small diameter portion 26 is not circular, the equivalent circular diameter is used. "Equivalent circular diameter" is a diameter determined on an assumption that the opening portion is in the form of a circle having the same projected area as the projected area of the opening portion.

The bottom portion of the small diameter portion 26 is in a position 20 nm to 2,000 nm distant from the communication position with the large diameter portion 24 in the depth direction. In other words, the small diameter portion 26 is a pore portion that extends further from the communication position with the large diameter portion 24 in the depth direction (thickness direction), and the depth of the small diameter portion 26 is 20 nm to 2,000 nm. The depth is preferably 500 nm to 2,000 nm.

The depth is a value determined by taking a photograph (50,000× magnification) of a cross section of the anodic oxide film 20b, measuring the depths of 25 or more small diameter portions, and calculating the average thereof.

The shape of the small diameter portion 26 is not particularly limited. Examples of the shape of the small diameter portion 26 include a substantially straight tubular shape (substantially cylindrical shape) and a conical shape that tapers along the depth direction. Among these, a substantially straight tubular shape is preferable.

—Method for Manufacturing Aluminum Support—

As a method for manufacturing the aluminum support used in the present disclosure, for example, a manufacturing method is preferable in which the following steps are sequentially performed.

Roughening treatment step: step of performing roughening treatment on aluminum plate Anodic oxidation treatment step: step of subjecting aluminum plate having undergone roughening treatment to anodic oxidation Pore widening treatment step: step of bringing aluminum plate having anodic oxide film obtained by anodic oxidation treatment step into contact with aqueous acid solution or aqueous alkali solution so that diameter of micropores in anodic oxide film increases Hereinafter, the procedure of each step will be specifically described.

[Roughening Treatment Step]

The roughening treatment step is a step of performing a roughening treatment including an electrochemical roughening treatment on the surface of the aluminum plate. This step is preferably performed before the anodic oxidation treatment step which will be described later. However, in a case where the surface of the aluminum plate already has a preferable shape, the roughening treatment step may not be performed.

As the roughening treatment, only an electrochemical roughening treatment may be performed, or an electrochemical roughening treatment and mechanical roughening treatment and/or a chemical roughening treatment may be performed in combination.

In a case where the mechanical roughening treatment and the electrochemical roughening treatment are combined, it is preferable to perform the electrochemical roughening treatment after the mechanical roughening treatment.

It is preferable to perform the electrochemical roughening treatment by using direct current or alternating current in an aqueous solution containing nitric acid or hydrochloric acid as a main component.

The method of the mechanical roughening treatment is not particularly limited. Examples thereof include the method described in JP1975-40047B (JP-S50-40047B).

Furthermore, the chemical roughening treatment is not particularly limited, and examples thereof include known methods.

After the mechanical roughening treatment, it is preferable to perform the following chemical etching treatment.

By the chemical etching treatment performed after the mechanical roughening treatment, the edge portion of surface irregularities of the aluminum plate smoothed, so that ink clotting that may occur during printing is prevented, the antifouling properties of the printing plate are improved, and unnecessary substances such as abrasive particles remaining on the surface are removed.

Examples of the chemical etching treatment include etching with an acid and etching with an alkali. One of the examples of particularly efficient etching methods is a chemical etching treatment using an aqueous alkali solution (hereinafter, also called "alkaline etching treatment").

The alkaline agent used in the aqueous alkali solution is not particularly limited. Examples thereof include caustic soda, caustic potash, sodium metasilicate, sodium carbonate, sodium aluminate, and sodium gluconate.

The aqueous alkali solution may contain aluminum ions.

The concentration of the alkaline agent in the aqueous alkali solution is preferably 0.01% by mass or more, and more preferably 3% by mass or more. Furthermore, the concentration of the alkaline agent is preferably 30% by mass or less.

In a case where the alkaline etching treatment is performed, in order to remove products generated by the alkaline etching treatment, it is preferable to perform the chemical etching treatment by using a low-temperature aqueous acidic solution (hereinafter, also called "desmutting treatment").

The acid used in the aqueous acidic solution is not particularly limited, and examples thereof include sulfuric acid, nitric acid, and hydrochloric acid. The temperature of the aqueous acidic solution is preferably 20° C. to 80° C.

As the roughening treatment step, a method is preferable in which the treatments described in an aspect A or an aspect B are performed in the following order.

~Aspect A~

(2) Chemical etching treatment using aqueous alkali solution (first alkaline etching treatment)
(3) Chemical etching treatment using aqueous acidic solution (first desmutting treatment)
(4) Electrochemical roughening treatment using aqueous solution containing nitric acid as main component (first electrochemical roughening treatment)
(5) Chemical etching treatment using aqueous alkali solution (second alkaline etching treatment)
(6) Chemical etching treatment using aqueous acidic solution (second desmutting treatment)
(7) Electrochemical roughening treatment in aqueous solution containing hydrochloric acid as main component (second electrochemical roughening treatment)
(8) Chemical etching treatment using aqueous alkali solution (third alkaline etching treatment)
(9) Chemical etching treatment using aqueous acidic solution (third desmutting treatment)

~Aspect B~

(10) Chemical etching treatment using aqueous alkali solution (fourth alkaline etching treatment)
(11) Chemical etching treatment using aqueous acidic solution (fourth desmutting treatment)
(12) Electrochemical roughening treatment using aqueous solution containing hydrochloric acid as main component (third electrochemical roughening treatment)
(13) Chemical etching treatment using aqueous alkali solution (fifth alkaline etching treatment)
(14) Chemical etching treatment using aqueous acidic solution (fifth desmutting treatment)

If necessary, (1) mechanical roughening treatment may be performed before the treatment (2) of the aspect A or before the treatment (10) of the aspect B.

The amount of the aluminum plate dissolved by the first alkaline etching treatment and the fourth alkaline etching treatment is preferably 0.5 g/m$^2$ to 30 g/m$^2$, and more preferably 1.0 g/m$^2$ to 20 g/m$^2$.

Examples of the aqueous solution containing nitric acid as a main component used in the first electrochemical roughening treatment of the aspect A include aqueous solutions used in the electrochemical roughening treatment using direct current or alternating current. Examples thereof include an aqueous solution obtained by adding aluminum nitrate, sodium nitrate, ammonium nitrate, or the like to a 1 to 100 g/L aqueous nitric acid solution.

Examples of the aqueous solution containing hydrochloric acid as a main component used in the second electrochemical roughening treatment of the aspect A and in the third electrochemical roughening treatment of the aspect B include aqueous solutions used in the general electrochemical roughening treatment using direct current or alternating current. Examples thereof include an aqueous solution obtained by adding 0 g/L to 30 g/L of sulfuric acid to a 1 g/L to 100 g/L aqueous hydrochloric acid solution. Nitrate ions such as aluminum nitrate, sodium nitrate, and ammonium nitrate; hydrochloric acid ions such as aluminum chloride, sodium chloride, and ammonium chloride may be further added to this solution.

As the waveform of an alternating current power source for the electrochemical roughening treatment, a sine wave, a square wave, a trapezoidal wave, a triangular wave, and the like can be used. The frequency is preferably 0.1 Hz to 250 Hz.

Figure 3:
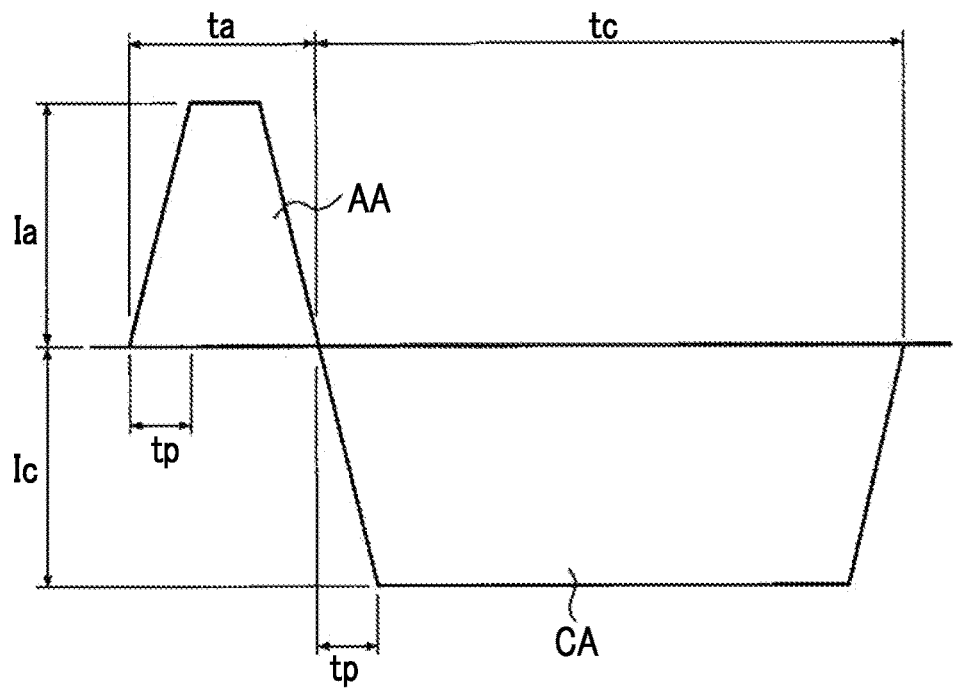
FIG. 3 is an example of a waveform graph of alternating current used for an electrochemical roughening treatment in a method for manufacturing an aluminum support.

FIG. 3 is an example of a waveform graph of alternating current used for an electrochemical roughening treatment.

In FIG. 3, ta represents an anodic reaction time, tc represents a cathodic reaction time, tp represents the time taken for current to reach a peak from 0, Ia represents the peak current on the anodic cycle side, Ic represents the peak current on the cathodic cycle side, AA represents current for an anodic reaction of an aluminum plate, and CA represents current for a cathodic reaction of an aluminum plate. For a trapezoidal wave, the time tp taken for current to reach a peak from 0 is preferably 1 ms to 10 ms. Regarding the conditions of one cycle of alternating current used for the electrochemical roughening, a ratio tc/ta of the cathodic reaction time tc to the anodic reaction time ta of the aluminum plate is preferably within a range of 1 to 20, a ratio Qc/Qa of an electricity quantity Qc during the cathodic reaction to an electricity quantity Qa during the anodic reaction of the aluminum plate is preferably within a range of 0.3 to 20, and the anodic reaction time ta is preferably within a range of 5 ms to 1,000 ms. The peak current density of the trapezoidal wave is preferably 10 A/dm$_2$ to 200 A/dm$^2$ at both the anodic cycle side Ia and the cathodic cycle side Ic of the current. Ic/Ia is preferably 0.3 to 20. At a point time when the electrochemical roughening has ended, the total quantity of electricity that participates in the anodic reaction of the aluminum plate is preferably 25 C/dm$^2$ to 1,000 C/dm$^2$.

Figure 4:
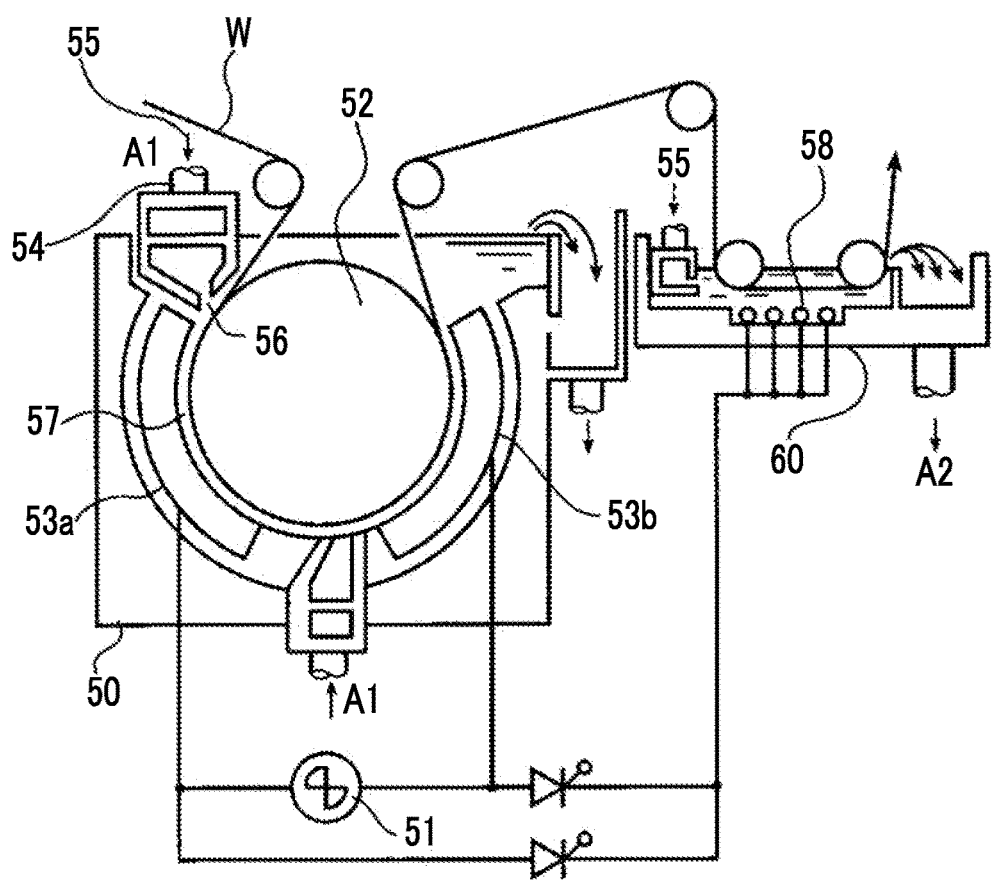
FIG. 4 is a lateral view showing an example of a radial cell in an electrochemical roughening treatment using alternating current in a method for manufacturing an aluminum support.

The electrochemical roughening using alternating current can be performed using the device shown in FIG. 4.

FIG. 4 is a lateral view showing an example of a radial cell in an electrochemical roughening treatment using alternating current.

In FIG. 4, 50 represents a main electrolytic cell, 51 represents an alternating current power source, 52 represents a radial drum roller, 53a and 53b represent main poles, 54 represents an electrolytic solution supply port, 55 represents an electrolytic solution, 56 represents a slit, 57 represents an electrolytic solution path, 58 represents an auxiliary anode, 60 represents an auxiliary anode tank, and W represents an aluminum plate. In FIG. 4, the arrow A1 represents a solution supply direction of an electrolytic solution, and the arrow A2 represents a discharge direction of the electrolytic solution. In a case where two or more electrolytic cells are used, the electrolysis conditions may be the same as or different from each other.

The aluminum plate W is wound around the radial drum roller 52 immersed and disposed in the main electrolytic cell 50. While being transported, the aluminum plate W is electrolyzed by the main poles 53a and 53b connected to the alternating current power source 51. From the electrolytic solution supply port 54, the electrolytic solution 55 is supplied to the electrolytic solution path 57 between the radial drum roller 52 and the main poles 53a and 53b through the slit 56. The aluminum plate W treated in the main electrolytic cell 50 is then electrolyzed in the auxiliary anode tank 60. In the auxiliary anode tank 60, the auxiliary anode 58 is disposed to face the aluminum plate W. The electrolytic solution 55 is supplied to flow in the space between the auxiliary anode 58 and the aluminum plate W.

In view of easily manufacturing a predetermined printing plate precursor, the amount of the aluminum plate dissolved by the second alkaline etching treatment is preferably 1.0 g/m$^2$ or more, and more preferably 2.0 g/m$^2$ to 10 g/m$^2$.

In view of easily manufacturing a predetermined printing plate precursor, the amount of the aluminum plate dissolved by the third alkaline etching treatment and the fourth alkaline etching treatment is preferably 0.01 g/m$^2$ to 0.8 g/m$^2$, and more preferably 0.05 g/m$^2$ to 0.3 g/m$^2$.

In the chemical etching treatment (first to fifth desmutting treatments) using an aqueous acidic solution, an aqueous acidic solution containing phosphoric acid, nitric acid, sulfuric acid, chromic acid, hydrochloric acid, or a mixed acid consisting of two or more of these acids is suitably used.

The concentration of the acid in the aqueous acidic solution is preferably 0.5% by mass to 60% by mass.

[Anodic Oxidation Treatment Step]

The procedure of the anodic oxidation treatment step is not particularly limited as long as the aforementioned micropores can be obtained. Examples thereof include known methods.

In the anodic oxidation treatment step, an aqueous solution of sulfuric acid, phosphoric acid, oxalic acid, or the like can be used as an electrolytic cell. For example, the concentration of sulfuric acid is 100 g/L to 300 g/L.

The conditions of the anodic oxidation treatment are appropriately set depending on the electrolytic solution used. For example, the liquid temperature is 5° C. to 70° C. (preferably 10° C. to 60° C.), the current density is 0.5 A/dm$^2$ to 60 A/dm$^2$ (preferably 1 A/dm$^2$ to 60 A/dm$^2$), the voltage is 1 V to 100 V (preferably 5 V to 50 V), the electrolysis time is 1 second to 100 seconds (preferably 5 seconds to 60 seconds), and the film amount is 0.1 g/m$^2$ to 5 g/m$^2$ (preferably 0.2 g/m$^2$ to 3 g/m$^2$).

[Pore Widening Treatment]

The pore widening treatment is a treatment of enlarging the diameter of micropores (pore diameter) present in the anodic oxide film formed by the aforementioned anodic oxidation treatment step (pore diameter enlarging treatment).

The pore widening treatment can be carried out by bringing the aluminum plate obtained by the anodic oxidation treatment step into contact with an aqueous acid solution or an aqueous alkali solution. The contact method is not particularly limited, and examples thereof include a dipping method and a spraying method.

<Undercoat layer>

The lithographic printing plate precursor according to the present disclosure preferably has an undercoat layer (called interlayer in some cases) between the image-recording layer and the support. The undercoat layer enhances the adhesiveness between the support and the image-recording layer in an exposed portion, and enables the image-recording layer to be easily peeled from the support in a non-exposed portion. Therefore, the undercoat layer contributes to the improvement of developability without deteriorating printing durability. Furthermore, in the case of exposure to infrared laser, the undercoat layer functions as a heat insulating layer and thus brings about an effect of preventing sensitivity reduction resulting from the diffusion of heat generated by exposure to the support.

Examples of compounds that are used in the undercoat layer include polymers having adsorbent groups that can be adsorbed onto the surface of the support and hydrophilic groups. In order to improve adhesiveness to the image-recording layer, polymers having adsorbent groups and hydrophilic groups plus crosslinking groups are preferable. The compounds that are used in the undercoat layer may be low-molecular-weight compounds or polymers. If necessary, as the compounds that are used in the undercoat layer, two or more kinds of compounds may be used by being mixed together.

In a case where the compound used in the undercoat layer is a polymer, a copolymer of a monomer having an adsorbent group, a monomer having a hydrophilic group, and a monomer having a crosslinking group is preferable.

As the adsorbent groups that can be adsorbed onto the surface of the support, a phenolic hydroxy group, a carboxy group, —PO$_3$H$_2$, —OPO$_3$H$_2$, —CONHSO$_2$—, —SO$_2$NHSO$_2$—, and —COCH$_2$COCH$_3$ are preferable. As the hydrophilic groups, a sulfo group or salts thereof and salts of a carboxy group are preferable. As the crosslinking groups, an acryloyl group, a methacryloyl group, an acrylamide group, a methacrylamide group, an allyl group, and the like are preferable.

The polymer may have a crosslinking group introduced by the formation of a salt of a polar substituent of the polymer and a compound that has a substituent having charge opposite to that of the polar substituent and an ethylenically unsaturated bond, or may be further copolymerized with monomers other than the monomers described above and preferably with hydrophilic monomers.

Specifically, for example, silane coupling agents having addition polymerizable ethylenic double bond reactive groups described in JP1998-282679A (JP-H10-282679A) and phosphorus compounds having ethylenic double bond reactive groups described in JP1990-304441A (JP-H02-304441A) are suitable. The low-molecular-weight compounds or polymer compounds having crosslinking groups (preferably ethylenically unsaturated bonding groups), functional groups that interact with the surface of the support, and hydrophilic groups described in JP2005-238816A, JP2005-125749A, JP2006-239867A, and JP2006-215263A are also preferably used.

For example, the high-molecular-weight polymers having adsorbent groups that can be adsorbed onto the surface of the support, hydrophilic groups, and crosslinking groups described in JP2005-125749A and JP2006-188038A are more preferable.

The content of ethylenically unsaturated bonding group in the polymer used in the undercoat layer is preferably 0.1 mmol to 10.0 mmol per gram of the polymer, and more preferably 0.2 mmol to 5.5 mmol per gram of the polymer.

The weight-average molecular weight (Mw) of the polymer used in the undercoat layer is preferably 5,000 or more, and more preferably 10,000 to 300,000.

[Hydrophilic Compound]

From the viewpoint of developability, it is preferable that the undercoat layer contain a hydrophilic compound.

The hydrophilic compound is not particularly limited, and known hydrophilic compounds used for the undercoat layer can be used.

Preferable examples of hydrophilic compounds include phosphonic acids having an amino group such as carboxymethyl cellulose and dextrin, an organic phosphonic acid, an organic phosphoric acid, an organic phosphinic acid, an amino acid, a hydrochloride of amine having a hydroxy group, and the like.

In addition, preferable examples of hydrophilic compounds include a compound having an amino group or a functional group capable of inhibiting polymerization and a group that interacts with the surface of the support (for example, 1,4-diazabicyclo[2.2.2]octane (DABCO), 2,3,5,6-tetrahydroxy-p-quinone, chloranil, sulfophthalic acid, ethylenediaminetetraacetic acid (EDTA) or a salt thereof, hydroxyethyl ethylenediaminetriacetic acid or a salt thereof, dihydroxyethyl ethylenediaminediacetic acid or a salt thereof, hydroxyethyl iminodiacetic acid or a salt thereof, and the like).

From the viewpoint of suppressing scratches and contamination, it is preferable that the hydrophilic compound include hydroxycarboxylic acid or a salt thereof.

Furthermore, from the viewpoint of suppressing scratches and contamination, it is preferable that the hydrophilic compound which is preferably hydroxycarboxylic acid or a salt thereof is contained in a layer on the aluminum support. In addition, the layer on the aluminum support is preferably a layer on the side where the image-recording layer is formed or a layer in contact with the aluminum support.

Preferable examples of the layer on the aluminum support include a layer in contact with the aluminum support, such as the undercoat layer or the image-recording layer. Furthermore, a layer other than the layer in contact with the aluminum support, for example, the protective layer or the image-recording layer may contain a hydrophilic compound which is preferably hydroxycarboxylic acid or a salt thereof.

In the lithographic printing plate precursor according to the present disclosure, from the viewpoint of suppressing scratches and contamination, it is preferable that the image-recording layer contain hydroxycarboxylic acid or a salt thereof.

Moreover, regarding the lithographic printing plate precursor according to the present disclosure, for example, an aspect is also preferable in which the surface of the aluminum support on the image-recording layer side is treated with a composition (for example, an aqueous solution or the like) containing at least hydroxycarboxylic acid or a salt thereof. In a case where the above aspect is adopted, at least some of the hydroxycarboxylic acid or a salt thereof used for treatment can be detected in a state of being contained in the layer on the image-recording layer side (for example, the image-recording layer or the undercoat layer) that is in contact with the aluminum support.

In a case where the layer on the image-recording layer side that is in contact with the aluminum support, such as the undercoat layer, contains hydroxycarboxylic acid or a salt thereof, the surface of the aluminum support on the image-recording layer side can be hydrophilized, and it is easy for the surface of the aluminum support on the image-recording layer side to have a water contact angle of 1100 or less measured by an airborne water droplet method. Therefore, scratches and contamination are excellently suppressed.

"Hydroxycarboxylic acid" is the generic term for organic compounds having one or more carboxy groups and one or more hydroxy groups in one molecule. These compounds are also called hydroxy acid, oxy acid, oxycarboxylic acid, or alcoholic acid (see Iwanami Dictionary of Physics and Chemistry, 5th Edition, published by Iwanami Shoten, Publishers. (1998)).

The hydroxycarboxylic acid or a salt thereof is preferably represented by Formula (HC).

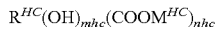     Formula (HC)

In Formula (HC), $R^{HC}$ represents an (mhc+nhc)-valent organic group, $M^{HC}$ each independently represents a hydrogen atom, an alkali metal, or an onium, and mhc and nhc each independently represent an integer of 1 or more. In a case where n is 2 or more, Ms may be the same or different from each other.

Examples of the (mhc+nhc)-valent organic group represented by $R^{HC}$ in Formula (HC) include an (mhc+nhc)-valent hydrocarbon group and the like. The hydrocarbon group may have a substituent and/or a linking group.

Examples of the hydrocarbon group include an (mhc+nhc)-valent group derived from aliphatic hydrocarbon, such as an alkylene group, an alkanetriyl group, an alkanetetrayl group, an alkanepentayl group, an alkenylene group, an alkenetriyl group, an alkenetetrayl group, and alkenepentayl group, an alkynylene group, an alkynetriyl group, alkynetetrayl group, or an alkynepentayl group, an (mhc+nhc)-valent group derived from aromatic hydrocarbon, such as an arylene group, an arenetriyl group, an arenetetrayl group, or an arenepentayl group, and the like. Examples of the substituent other than a hydroxy group and a carboxyl group include an alkyl group, an alkenyl group, an alkynyl group, an aralkyl group, an aryl group, and the like. Specific examples of the substituent include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, eicosyl group, isopropyl group, isobutyl group, s-butyl group, t-butyl group, isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a methoxymethyl group, a methoxyethoxyethyl group, an allyloxymethyl group, a phenoxymethyl group, an acetyloxymethyl group, a benzoyloxymethyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, 3-butynyl group, a phenyl group, a biphenyl group, a naphthyl group, a tolyl group, a xylyl group, a mesityl group, a cumenyl group, a methoxyphenyl group, an ethoxyphenyl group, a phenoxyphenyl group, an acetoxyphenyl group, a benzoyloxyphenyl group, a methoxycarbonylphenyl group, an ethoxycarbonylphenyl group, a phenoxycarbonylphenyl group, and the like. Furthermore, the linking group is composed of at least one atom selected from the group consisting of a hydrogen atom, a carbon atom, an oxygen atom, a nitrogen atom, a sulfur atom, and a halogen atom, and the number of atoms is preferably 1 to 50. Specific examples thereof include an alkylene group, a substituted alkylene group, an arylene group, a substituted arylene group, and the like. The linking group may have a structure in which a plurality of these divalent groups are linked through any of an amide bond, an ether bond, a urethane bond, a urea bond, and an ester bond.

Examples of the alkali metal represented by $M^{HC}$ include lithium, sodium, potassium, and the like. Among these, sodium is particularly preferable. Examples of the onium include ammonium, phosphonium, sulfonium, and the like. Among these, ammonium is particularly preferable.

From the viewpoint of suppressing scratches and contamination, $M^{HC}$ is preferably an alkali metal or an onium, and more preferably an alkali metal.

The total number of mhc and nhc is preferably 3 or more, more preferably 3 to 8, and even more preferably 4 to 6.

The molecular weight of the hydroxycarboxylic acid or a salt thereof is preferably 600 or less, more preferably 500 or less, and particularly preferably 300 or less. The molecular weight is preferably 76 or more.

Specifically, examples of the hydroxycarboxylic acid constituting the hydroxycarboxylic acid or a salt of the hydroxycarboxylic acid include gluconic acid, glycolic acid, lactic acid, tartronic acid, hydroxybutyrate (such as 2-hydroxybutyrate, 3-hydroxybutyrate, or γ-hydroxybutyrate, malic acid, tartaric acid, citramalic acid, citric acid, isocitric acid, leucine acid, mevalonic acid, pantoic acid, ricinoleic acid, ricineraidic acid, cerebronic acid, quinic acid, shikimic acid, a monohydroxybenzoic acid derivative (such as salicylic acid, creosotic acid (homosalicylic acid, hydroxy(methyl) benzoate), vanillic acid, or syringic acid), a dihydroxybenzoic acid derivative (such as pyrocatechuic acid, resorcylic acid, protocatechuic acid, gentisic acid, or orsellinic acid), a trihydroxybenzoic acid derivative (such as gallic acid), a phenyl acetate derivative (such as mandelic acid, benzilic acid, or atrolactic acid), a hydrocinnamic acid derivative (such as melilotic acid, phloretic acid, coumaric acid, umbellic acid, caffeic acid, ferulic acid, sinapic acid, cerebronic acid, or carminic acid), and the like.

Among these, as the aforementioned hydroxycarboxylic acid or a hydroxycarboxylic acid constituting a salt of the hydroxycarboxylic acid, from the viewpoint of suppressing scratches and contamination, a compound having two or more hydroxy groups is preferable, a compound having 3 or more hydroxy groups is more preferable, a compound having 5 or more hydroxy groups is even more preferable, and a compound having 5 to 8 hydroxy groups is particularly preferable.

Furthermore, as a hydroxycarboxylic acid having one carboxy group and two or more hydroxy groups, gluconic acid or shikimic acid is preferable.

As hydroxycarboxylic acid having two or more carboxy groups and one hydroxy group, citric acid or malic acid is preferable.

As hydroxycarboxylic acid having two or more carboxy groups and two or more hydroxy groups, tartaric acid is preferable.

Among these, gluconic acid is particularly preferable as the aforementioned hydroxycarboxylic acid.

One kind of hydrophilic compound may be used alone, or two or more kinds of hydrophilic compounds may be used in combination.

In a case where the undercoat layer contains a hydrophilic compound which is preferably hydroxycarboxylic acid or a salt thereof, the content of the hydrophilic compound, preferably the content of hydroxycarboxylic acid and a salt thereof, with respect to the total mass of the undercoat layer is preferably 0.01% by mass to 50% by mass, more preferably 0.1% by mass to 40% by mass, and particularly preferably 1.0% by mass to 30% by mass.

In order to prevent contamination over time, the undercoat layer may contain a chelating agent, a secondary or tertiary amine, a polymerization inhibitor, and the like, in addition to the following compounds for the undercoat layer.

The undercoat layer is formed by known coating methods. The coating amount (solid content) of the undercoat layer is preferably 0.1 mg/m$^2$ to 100 mg/m$^2$, and more preferably 1 mg/m$^2$ to 30 mg/m$^2$.

<Protective Layer>

The lithographic printing plate precursor according to the present disclosure may have a protective layer (also called "overcoat layer" in some cases) on the image-recording layer. The protective layer has a function of suppressing the reaction inhibiting image formation by blocking oxygen and a function of preventing the damage of the image-recording layer and preventing ablation during exposure to high-illuminance lasers.

The protective layer having such characteristics is described, for example, in U.S. Pat. No. 3,458,311A and JP1980-49729B (JP-S55-49729B). As polymers with low oxygen permeability that are used in the protective layer, any of water-soluble polymers and water-insoluble polymers can be appropriately selected and used. If necessary, two or more kinds of such polymers can be used by being mixed together. Specifically, examples of such polymers include polyvinyl alcohol, modified polyvinyl alcohol, polyvinylpyrrolidone, a water-soluble cellulose derivative, poly(meth)acrylonitrile, and the like.

As the modified polyvinyl alcohol, acid-modified polyvinyl alcohol having a carboxy group or a sulfo group is preferably used. Specific examples thereof include modified polyvinyl alcohols described in JP2005-250216A and JP2006-259137A.

In order to improve oxygen barrier properties, it is preferable that the protective layer contain an inorganic lamellar compound. The inorganic lamellar compound refers to particles in the form of a thin flat plate, and examples thereof include mica groups such as natural mica and synthetic mica, talc represented by Formula 3MgO·4SiO·H$_2$O, taeniolite, montmorillonite, saponite, hectorite, zirconium phosphate, and the like.

As the inorganic lamellar compound, a mica compound is preferably used. Examples of the mica compound include mica groups such as natural mica and synthetic mica represented by Formula: $A(B, C)_{2-5}D_4O_{10}(OH, F, O)_2$ [here, A represents any of K, Na, and Ca, B and C represent any of Fe (II), Fe (III), Mn, Al, Mg, and V, and D represents Si or Al.].

In the mica groups, examples of natural mica include white mica, soda mica, gold mica, black mica, and lepidolite. Examples of synthetic mica include non-swelling mica such as fluorophlogopite $KMg_3(AlSi_3O_{10})F_2$, potassium tetrasilic mica $KMg_{2.5}(Si_4O_{10})F_2$, and, Na tetrasilylic mica $NaMg_{2.5}(Si_4O_{10})F_2$, swelling mica such as Na or Li taeniolite (Na, Li)Mg$_2$Li(Si$_4$O$_{10}$)F$_2$, montmorillonite-based Na or Li hectorite (Na, Li)$_{1/8}$Mg$_{2/5}$Li$_{1/8}$(Si$_4$O$_{10}$)F$_2$, and the like. Furthermore, synthetic smectite is also useful.

Among the aforementioned mica compounds, fluorine-based swelling mica is particularly useful. That is, swelling synthetic mica has a laminated structure consisting of unit crystal lattice layers having a thickness in a range of approximately 10 Å to 15 Å (1 Å is equal to 0.1 nm), and metal atoms in lattices are more actively substituted than in any other clay minerals. As a result, positive charges are deficient in the lattice layers, and positive ions such as Li$^+$, Na$^+$, Ca$^{2+}$, and Mg$^{2+}$ are adsorbed between the layers in order to compensate for the deficiency. Positive ions interposed between the layers are referred to as exchangeable positive ions and are exchangeable with various positive ions. Particularly, in a case where the positive ions between the layers are Li$^+$ and Na$^+$, the ionic radii are small, and thus the bonds between lamellar crystal lattices are weak, and mica is significantly swollen by water. In a case where shear is applied in this state, mica easily cleavages and forms a stable sol in water. Swelling synthetic mica is particularly preferably used because it clearly exhibits such a tendency.

From the viewpoint of diffusion control, regarding the shapes of the mica compounds, the thickness is preferably thin, and the planar size is preferably large as long as the smoothness and actinic ray-transmitting property of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particle. The higher the aspect ratio is, the stronger the obtained effect is.

Regarding the particle diameter of the mica compound, the average long diameter thereof is preferably 0.3 μm to 20 μm, more preferably 0.5 μm to 10 μm, and particularly preferably 1 μm to 5 μm. The average thickness of the particles is preferably 0.1 μm or less, more preferably 0.05 μm or less, and particularly preferably 0.01 μm or less. Specifically, for example, in the case of swelling synthetic mica which is a typical compound, an aspect is preferable in which the compound has a thickness of about 1 nm to 50 nm and a surface size (long diameter) of about 1 μm to 20 μm.

The content of the inorganic lamellar compound with respect to the total solid content of the protective layer is preferably 1% by mass to 60% by mass, and more preferably 3% by mass to 50% by mass. Even in a case where two or more kinds of inorganic lamellar compounds are used in combination, the total amount of the inorganic lamellar compounds preferable equals the content described above. In a case where the content is within the above range, the oxygen barrier properties are improved, and excellent sensitivity is obtained. In addition, the deterioration of receptivity can be prevented.

—Discoloring Compound—

The protective layer preferably contains a discoloring compound.

The protective layer may contain other components such as a water-soluble polymer, a hydrophobic polymer, an oil sensitizing agent, an acid generator, and an infrared absorber, in addition to the discoloring compound.

From the viewpoint of improving visibility of exposed portions, in a case where the lithographic printing plate precursor according to the present disclosure is exposed to infrared with a wavelength of 830 nm at an energy density of 110 mJ/cm$^2$, a brightness change ΔL between the brightness of the precursor before exposure and the brightness of the precursor after exposure is preferably 2.0 or more.

The brightness change ΔL is more preferably 3.0 or more, even more preferably 5.0 or more, particularly preferably 8.0 or more, and most preferably 10.0 or more.

An upper limit of the brightness change ΔL is, for example, 20.0.

Especially, in a case where the protective layer contains a discoloring compound, it is preferable that the aforementioned preferable numerical range of the brightness change ΔL be satisfied.

The brightness change ΔL is measured by the following method.

In Luxel PLATESETTER T-9800 manufactured by FUJI-FILM Graphic Systems that is equipped with an infrared semiconductor laser with a wavelength of 830 nm, the lithographic printing plate precursor is exposed under the conditions of output of 99.5%, outer drum rotation speed of 220 rpm, and resolution of 2,400 dpi (dots per inch, 1 inch=25.4 mm (energy density of 110 mJ/cm$^2$)). The exposure is performed in an environment of 25° C. and 50% RH.

The brightness change of the lithographic printing plate precursor before and after exposure is measured.

The brightness change is measured using a spectrocolorimeter eXact manufactured by X-Rite, Incorporated. By using the L* value (brightness) in the L*a*b* color space, the absolute value of a difference between the L* value of the image-recording layer after the exposure and the L* value of the image-recording layer before the exposure is adopted as the brightness change ΔL.

In the present disclosure, "discoloring compound" refers to a compound which undergoes change in absorption in the visible light region (wavelength: 400 nm or more and less than 750 nm) due to the exposure to infrared. That is, in the present disclosure, "discoloring" means that the absorption in the visible light region (wavelength: 400 nm or more and less than 750 nm) changes due to the exposure to infrared.

Specifically, examples of the discoloring compound in the present disclosure include (1) compound that absorbs more light in the visible light region due to the exposure to infrared than before the exposure to infrared, (2) compound that is made capable of absorbing light in the visible light region due to the exposure to infrared, and (3) compound that is made incapable of absorbing light in the visible light region due to the exposure to infrared.

The infrared in the present disclosure is a ray having a wavelength of 750 nm to 1 mm, and preferably a ray having a wavelength of 750 nm to 1,400 nm.

The discoloring compound preferably includes a compound that develops color due to the exposure to infrared.

In addition, the discoloring compound preferably includes a decomposable compound that decomposes due to the exposure to infrared, and particularly preferably includes a decomposable compound that decomposes by either or both of heat and electron transfer resulting from the exposure to infrared.

More specifically, the discoloring compound in the present disclosure is preferably a compound that decomposes due to the exposure to infrared (more preferably, decomposes by either or both of heat or electron transfer due to the exposure to infrared) and absorbs more light in the visible light region than before the exposure to infrared or is made capable of absorbing light of longer wavelengths and thus capable of absorbing light in the visible light region.

"Decomposes by electron transfer" mentioned herein means that electrons excited to the lowest unoccupied molecular orbital (LUMO) from the highest occupied molecular orbital (HOMO) of the discoloring compound by exposure to infrared move to electron accepting groups (groups having potential close to LUMO) in a molecule by means of intramolecular electron transfer and thus result in decomposition.

Hereinafter, as an example of the discoloring compound, a decomposable compound will be described.

There are no limitations on the decomposable compound as long as it absorbs at least a part of light in the infrared wavelength region (wavelength region of 750 nm to 1 mm, preferably a wavelength region of 750 nm to 1,400 nm) and decomposes. The decomposable compound is preferably a compound having maximum absorption wavelength in a wavelength region of 750 nm to 1,400 nm.

More specifically, the decomposable compound is preferably a compound that decomposes due to the exposure to infrared and generates a compound having maximum absorption wavelength in a wavelength region of 500 nm to 600 nm.

From the viewpoint of improving visibility of exposed portions, the decomposable compound is preferably a cyanine dye having a group that decomposes by the exposure to infrared (specifically, $R^1$ in General Formulas 1-1 to 1-7).

From the viewpoint of improving visibility of exposed portions, the decomposable compound is more preferably a compound represented by Formula 1-1.

Formula 1-1

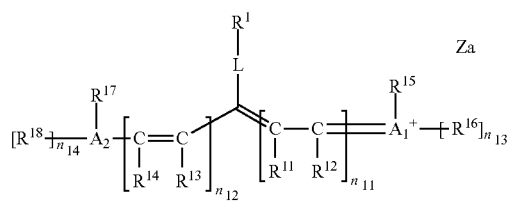

In Formula 1-1, $R^1$ represents a group that is represented by any of Formula 2 to Formula 4, $R^{11}$ to $R^{18}$ each independently represent a hydrogen atom, a halogen atom, $-R^a$, $-OR^b$, $-SR^c$, or $-NR^dR^e$, $R^a$ to $R^e$ each independently represent a hydrocarbon group, $A_1$, $A_2$, and a plurality of $R_{11}$ to $R_{18}$ may be linked to each other to form a monocyclic or polycyclic ring, $A_1$ and $A_2$ each independently represent an oxygen atom, a sulfur atom, or a nitrogen atom, $n_{11}$ and $n_{12}$ each independently represent an integer of 0 to 5, the sum of $n_{11}$ and $n_{12}$ is 2 or more, $n_{13}$ and $n_{14}$ each independently represent 0 or 1, L represents an oxygen atom, a sulfur atom, or $-NR^{10}-$, $R^{10}$ represents a hydrogen atom, an alkyl group, or an aryl group, and Za represents a counterion that neutralizes charge.

Formula 2

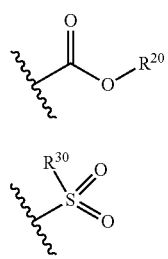

Formula 3

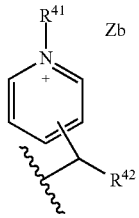

Formula 4

In Formula 2 to Formula 4, $R^{20}$, $R^0$, $R^{41}$, and $R^{42}$ each independently represent an alkyl group or an aryl group, Zb represents a counterion that neutralizes charge, the wavy line represents a bonding site with the group represented by L in Formula 1-1.

In a case where the compound represented by Formula 1-1 is exposed to infrared, the $R^1$—L bond is cleaved, L turns into =O, =S, or =NR$^{10}$, and the compound is discolored.

In Formula 1-1, $R^1$ represents a group represented by any of Formula 2 to Formula 4.

Hereinafter, each of the group represented by Formula 2, the group represented by Formula 3, and the group represented by Formula 4 will be described.

In Formula 2, $R^{20}$ represents an alkyl group or an aryl group, and the portion of the wavy line represents a bonding site with the group represented by L in Formula 1-1.

As the alkyl group represented by $R^{20}$, an alkyl group having 1 to 30 carbon atoms is preferable, an alkyl group having 1 to 15 carbon atoms is more preferable, and an alkyl group having 1 to 10 carbon atoms is even more preferable.

The alkyl group may be linear or branched, or may have a ring structure.

The aryl group represented by $R^{20}$ is preferably an aryl group having 6 to 30 carbon atoms, more preferably an aryl group having 6 to 20 carbon atoms, and even more preferably an aryl group having 6 to 12 carbon atoms.

From the viewpoint of color developability, $R^{20}$ is preferably an alkyl group.

From the viewpoint of decomposition properties and color developability, the alkyl group represented by $R^{20}$ is preferably a secondary alkyl group or a tertiary alkyl group, and more preferably a tertiary alkyl group.

Furthermore, from the viewpoint of decomposition properties and color developability, the alkyl group represented by $R^{20}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

Specific examples of the group represented by Formula 2 will be shown below. However, the present disclosure is not limited thereto. In the following structural formulas, • represents a bonding site with the group represented by L in Formula 1-1.

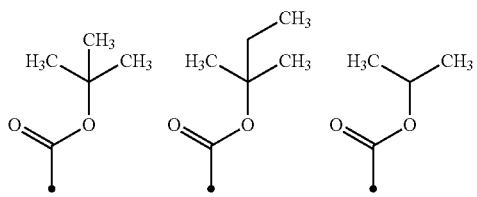

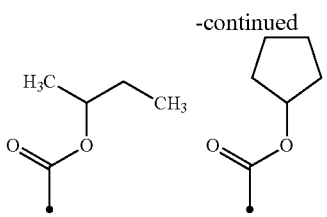

In Formula 3, $R^{30}$ represents an alkyl group or an aryl group, and the portion of the wavy line represents a bonding site with the group represented by L in Formula 1-1.

The alkyl group and aryl group represented by $R^{30}$ are the same as the alkyl group and aryl group represented by $R^{20}$ in Formula 2, and the preferred aspects thereof are also the same.

From the viewpoint of decomposition properties and color developability, the alkyl group represented by $R^{30}$ is preferably a secondary alkyl group or a tertiary alkyl group, and more preferably a tertiary alkyl group.

Furthermore, from the viewpoint of decomposition properties and color developability, the alkyl group represented by $R^{30}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

In addition, from the viewpoint of decomposition properties and color developability, the alkyl group represented by $R^{30}$ is preferably a substituted alkyl group, more preferably a fluoro-substituted alkyl group, even more preferably a perfluoroalkyl group, and particularly preferably a trifluoromethyl group.

From the viewpoint of decomposition properties and color developability, the aryl group represented by $R^{30}$ is preferably a substituted aryl group. Examples of the substituent include an alkyl group (preferably an alkyl group having 1 to 4 carbon atoms), an alkoxy group (preferably an alkoxy group having 1 to 4 carbon atoms), and the like.

Specific examples of the group represented by Formula 3 will be shown below. However, the present disclosure is not limited thereto. In the following structural formulas, • represents a bonding site with the group represented by L in Formula 1-1.

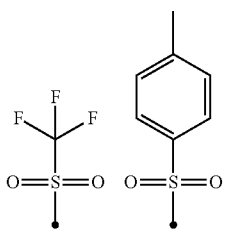

In Formula 4, $R^{41}$ and $R^{42}$ each independently represent an alkyl group or an aryl group, Zb represents a counterion that neutralizes charge, and the portion of the wavy line represents a bonding site with the group represented by L in Formula 1-1.

The alkyl group and aryl group represented by $R^{41}$ or $R^{42}$ are the same as the alkyl group and aryl group represented by $R^{20}$ in Formula 2, and preferred aspects thereof are also the same.

From the viewpoint of decomposition properties and color developability, $R^{41}$ is preferably an alkyl group.

From the viewpoint of decomposition properties and color developability, $R^{42}$ is preferably an alkyl group.

From the viewpoint of decomposition properties and color developability, the alkyl group represented by $R^{41}$ is preferably an alkyl group having 1 to 8 carbon atoms, more preferably an alkyl group having 1 to 4 carbon atoms, and particularly preferably a methyl group.

From the viewpoint of decomposition properties and color developability, the alkyl group represented by $R^{42}$ is preferably a secondary alkyl group or a tertiary alkyl group, and more preferably a tertiary alkyl group.

Furthermore, from the viewpoint of decomposition properties and color developability, the alkyl group represented by $R^{42}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

Zb in Formula 4 may be a counterion that neutralizes charge, and may be included in Za in Formula 1-1 in the entirety of the compound.

Zb is preferably a sulfonate ion, a carboxylate ion, a tetrafluoroborate ion, a hexafluorophosphate ion, a p-toluenesulfonate ion, or a perchlorate ion, and more preferably a tetrafluoroborate ion.

Specific examples of the group represented by Formula 4 will be shown below. However, the present disclosure is not limited thereto. In the following structural formulas, • represents a bonding site with the group represented by L in Formula 1-1.

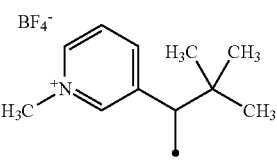

L in Formula 1-1 is preferably an oxygen atom or —$NR^{10}$—, and particularly preferably an oxygen atom.

Furthermore, $R^{10}$ in —$NR^{10}$— is preferably an alkyl group. The alkyl group represented by $R^{10}$ is preferably an alkyl group having 1 to 10 carbon atoms. The alkyl group represented by $R^{10}$ may be linear or branched, or may have a ring structure.

Among the alkyl groups, a methyl group or a cyclohexyl group is preferable.

In a case where $R^{10}$ in —$NR^{10}$— represents an aryl group, the aryl group is preferably an aryl group having 6 to 30 carbon atoms, more preferably an aryl group having 6 to 20 carbon atoms, and even more preferably an aryl group having 6 to 12 carbon atoms. These aryl groups may have a substituent.

In Formula 1-1, $R^{11}$ to $R^{18}$ preferably each independently represent a hydrogen atom, —$R^a$, —$OR^b$, —$SR^c$, or —$NR^dR^e$.

The hydrocarbon group represented by $R^a$ to $R^c$ is preferably a hydrocarbon group having 1 to 30 carbon atoms, more preferably a hydrocarbon group having 1 to 15 carbon atoms, and even more preferably a hydrocarbon group having 1 to 10 carbon atoms.

The hydrocarbon group may be linear or branched or may have a ring structure.

As the hydrocarbon group, an alkyl group is particularly preferable.

The aforementioned alkyl group is preferably an alkyl group having 1 to 30 carbon atoms, more preferably an alkyl group having 1 to 15 carbon atoms, and even more preferably an alkyl group having 1 to 10 carbon atoms.

The alkyl group may be linear or branched, or may have a ring structure.

Specific examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among these alkyl groups, a methyl group, an ethyl group, a propyl group, or a butyl group is preferable.

The above alkyl group may have a substituent.

Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, groups obtained by combining these, and the like.

$R^{11}$ to $R^{14}$ in Formula 1-1 preferably each independently represent a hydrogen atom or —$R^a$ (that is, a hydrocarbon group), more preferably each independently represent a hydrogen atom or an alkyl group, and even more preferably each independently represent a hydrogen atom except in the cases described below.

Particularly, each of $R^{11}$ and $R^{13}$ bonded to the carbon atom that is bonded to the carbon atom to which L is bonded is preferably an alkyl group. It is more preferable that $R^{11}$ and $R^{13}$ be linked to each other to form a ring. The ring to be formed in this way may be a monocyclic or polycyclic ring. Specifically, examples of the ring to be formed include a monocyclic ring such as a cyclopentene ring, a cyclopentadiene ring, a cyclohexene ring, or a cyclohexadiene ring, and a polycyclic ring such as an indene ring or an indole ring.

Furthermore, it is preferable that $R^{12}$ bonded to the carbon atom to which $A_1^+$ is bonded be linked to $R^{15}$ or $R^{16}$ (preferably $R^{16}$) to form a ring, and $R^{14}$ bonded to the carbon atom to which $A_2$ is bonded be linked to $R^{17}$ or $R^{18}$ (preferably $R^{18}$) to form a ring.

In Formula 1-1, $n_{13}$ is preferably 1, and $R^{16}$ is preferably —$R^a$ (that is, a hydrocarbon group).

Furthermore, it is preferable that $R^{16}$ be linked to $R^{12}$ bonded to the carbon atom to which $A_1^+$ is bonded, so as to form a ring. As the ring to be formed, an indolium ring, a pyrylium ring, a thiopyrylium ring, a benzoxazoline ring, or a benzimidazoline ring is preferable, and an indolium ring is more preferable from the viewpoint of improving visibility of exposed portions. These rings may further have a substituent.

In Formula 1-1, $n_4$ is preferably 1, and $R^{18}$ is preferably —$R^a$ (that is, a hydrocarbon group).

Furthermore, it is preferable that $R^{18}$ be linked to $R^4$ bonded to the carbon atom to which $A_2$ is bonded, so as to form a ring. As the ring to be formed, an indole ring, a pyran ring, a thiopyran ring, a benzoxazole ring, or a benzimidazole ring is preferable, and an indole ring is more preferable from the viewpoint of improving visibility of exposed portions. These rings may further have a substituent.

It is preferable that $R^{16}$ and $R^{18}$ in Formula 1-1 be the same group. In a case where $R^{16}$ and $R^{18}$ each form a ring, it is preferable that the formed rings have the same structure except for $A_1^+$ and $A_2$.

It is preferable that $R^{15}$ and $R^{17}$ in Formula 1-1 be the same group. Furthermore, $R^{15}$ and $R^{17}$ are preferably —$R^a$ (that is, a hydrocarbon group), more preferably an alkyl group, and even more preferably a substituted alkyl group.

From the viewpoint of improving water solubility, $R^{15}$ and $R^{17}$ in the compound represented by Formula 1-1 are preferably a substituted alkyl group.

Examples of the substituted alkyl group represented by $R^{15}$ or $R^{17}$ include a group represented by any of Formula (a1) to Formula (a4).

(a1)

(a2)

(a3)

(a4)

In Formula (a1) to Formula (a4), $R^{W0}$ represents an alkylene group having 2 to 6 carbon atoms, W represents a single bond or an oxygen atom, and $n_{W1}$ represents an integer of 1 to 45, $R^{W1}$ represents an alkyl group having 1 to 12 carbon atoms or —C(=O)—$R^{W5}$, $R^{W5}$ represents an alkyl group having 1 to 12 carbon atoms, $R^{W2}$ to $R^{W4}$ each independently represent a single bond or an alkylene group having 1 to 12 carbon atoms, and M represents a hydrogen atom, a sodium atom, a potassium atom, or an onium group.

Specific examples of the alkylene group represented by $R^{W0}$ in Formula (a1) include an ethylene group, a n-propylene group, an isopropylene group, a n-butylene group, an isobutylene group, a n-pentylene group, an isopentylene group, a n-hexyl group, an isohexyl group, and the like. Among these, an ethylene group, a n-propylene group, an isopropylene group, or a n-butylene group is preferable, and a n-propylene group is particularly preferable.

$n_{W1}$ is preferably 1 to 10, more preferably 1 to 5, and particularly preferably 1 to 3.

Specific examples of the alkyl group represented by $R^{W1}$ include a methyl group, an ethyl group, a n-propyl group, an isopropyl group, a n-butyl group, an isobutyl group, a tert-butyl group, a n-pentyl group, an isopentyl group, a neopentyl group, a n-hexyl group, a n-octyl group, a n-dodecyl group, and the like. Among these, a methyl group, an ethyl group, a n-propyl group, an isopropyl group, a n-butyl group, or a tert-butyl group is preferable, a methyl group or an ethyl group is more preferable, and a methyl group is particularly preferable.

The alkyl group represented by $R^{W5}$ is the same as the alkyl group represented by $R^{W1}$. Preferred aspects of the alkyl group represented by $R^{W5}$ are the same as preferred aspects of the alkyl group represented by $R^{W1}$.

Specific examples of the group represented by Formula (a1) will be shown below. However, the present disclosure is not limited thereto. In the following structural formulas, Me represents a methyl group, Et represents an ethyl group, and * represents a bonding site.

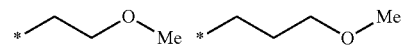

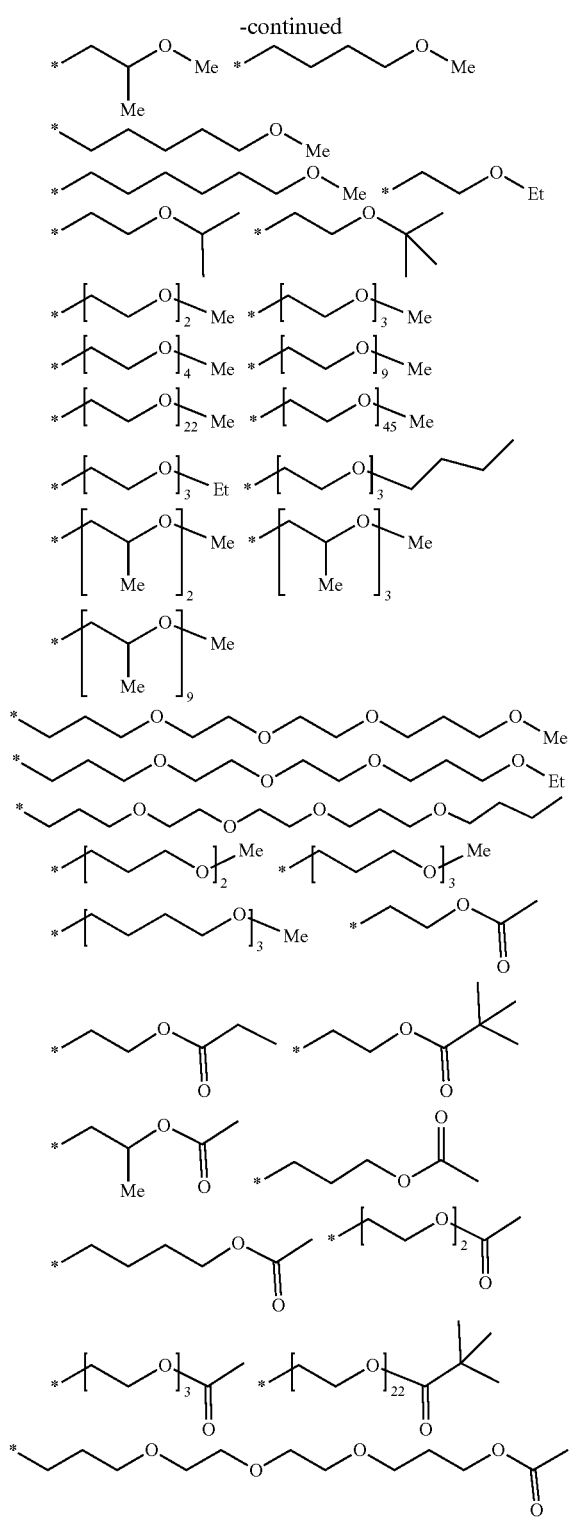

Specific examples of the alkylene group represented by $R^{W2}$ to $R^{W4}$ in Formula (a2) to Formula (a4) include a methylene group, an ethylene group, a n-propylene group, an isopropylene group, a n-butylene group, an isobutylene group, a n-pentylene group, an isopentylene group, a n-hexyl group, an isohexyl group, a n-octylene group, a n-dodecylene group, and the like. Among these, an ethylene group, a n-propylene group, an isopropylene group, or a n-butylene group is preferable, and an ethylene group or a n-propylene group is particularly preferable.

In Formula (a3), two Ms may be the same or different from each other.

Examples of the onium group represented by M in Formula (a2) to Formula (a4) include an ammonium group, an iodonium group, a phosphonium group, a sulfonium group, and the like.

All of $CO_2M$ in Formula (a2), $PO_3M_2$ in Formula (a2), and $SO_3M$ in Formula (a4) may have an anion structure from which M is dissociated. The countercation of the anion structure may be $A_1^+$ or a cation that can be contained in $R^1$—L in Formula 1-1.

Among the groups represented by Formula (a1) to Formula (a4), the group represented by Formula (a1), Formula (a2), or Formula (a4) is preferable.

$n_{11}$ and $n_{12}$ in Formula 1-1 are preferably the same as each other, and preferably both represent an integer of 1 to 5, more preferably both represent an integer of 1 to 3, even more preferably both represent 1 or 2, and particularly preferably both represent 2.

$A_1$ and $A_2$ in Formula 1-1 each independently represent an oxygen atom, a sulfur atom, or a nitrogen atom. Among these, a nitrogen atom is preferable.

$A_1$ and $A_2$ in Formula 1-1 are preferably the same atoms.

Za in Formula 1-1 represents a counterion that neutralizes charge.

In a case where all of $R^{11}$ to $R^{18}$ and $R^1$—L are groups having a neutral charge, Za is a monovalent counteranion. Here, $R^{11}$ to $R^{18}$ and $R^1$—L may have an anion structure or a cation structure. For example, in a case where two or more among $R^{11}$ to $R^{18}$ and $R^1$—L have an anion structure, Za can also be a countercation.

In a case where the cyanine dye represented by Formula 1-1 has such a structure that the overall charge of the compound is neutral except for Za, Za is unnecessary.

In a case where Za is a counteranion, examples thereof include a sulfonate ion, a carboxylate ion, a tetrafluoroborate ion, a hexafluorophosphate ion, a p-toluenesulfonate ion, a perchlorate ion, and the like. Among these, a tetrafluoroborate ion is preferable.

In a case where Za is a countercation, examples thereof include an alkali metal ion, an alkaline earth metal ion, an ammonium ion, a pyridinium ion, sulfonium ion, and the like. Among these, a sodium ion, a potassium ion, an ammonium ion, a pyridinium ion, or a sulfonium ion is preferable, and a sodium ion, a potassium ion, or an ammonium ion is more preferable.

From the viewpoint of improving visibility of exposed portions, the decomposable compound is more preferably a compound represented by Formula 1-2 (that is, a cyanine dye).

Formula 1-2

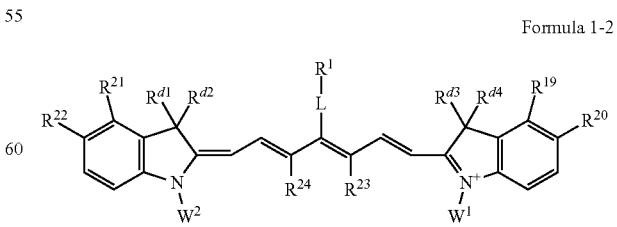

In Formula 1-2, $R^1$ represents a group represented by any of Formula 2 to Formula 4, $R^{19}$ to $R^{22}$ each independently represent a hydrogen atom, a halogen atom, —$R^a$, —$OR^b$, —CN, —SR$^c$, or —NR$^d$R$^e$, R$^{23}$ and R$^{24}$ each independently represent a hydrogen atom or —R$^a$, R$^a$ to R$^e$ each independently represent a hydrocarbon group, R$^{19}$ and R$^{20}$, R$^{21}$ and R$^{22}$, or R$^{23}$ and R$^{24}$ may be linked to each other to form a monocyclic or polycyclic ring, L represents an oxygen atom, a sulfur atom, or —NR$^{10}$—, R$^{10}$ represents a hydrogen atom, an alkyl group, or an aryl group, R$^{d1}$ to R$^{d4}$, W$^1$, and W$^2$ each independently represent an alkyl group which may have a substituent, and Za represents a counterion that neutralizes charge.

R$^1$ in Formula 1-2 has the same definition as R$^1$ in Formula 1-1, and preferred aspects thereof are also the same.

In Formula 1-2, R$^{19}$ to R$^{22}$ preferably each independently represent a hydrogen atom, a halogen atom, —R$^a$, —OR$^b$, or —CN.

More specifically, R$^{19}$ and R$^{21}$ are preferably a hydrogen atom or —R$^a$.

Furthermore, R$^{20}$ and R$^{22}$ are preferably a hydrogen atom, —R$^a$, —OR$^b$, or —CN.

—R$^a$ represented by R$^{19}$ to R$^{22}$ is preferably an alkyl group or an alkenyl group.

In a case where all of R$^{19}$ to R$^{22}$ are —R$^a$, it is preferable that R$^{19}$ and R$^{20}$ and R$^{21}$ and R$^{22}$ be linked to each other to form a monocyclic or polycyclic ring.

Examples of the ring formed of R$^{19}$ and R$^{20}$ or R$^{21}$ and R$^{22}$ linked to each other include a benzene ring, a naphthalene ring, and the like.

R$^{23}$ and R$^{24}$ in Formula 1-2 are preferably linked to each other to form a monocyclic or polycyclic ring.

The ring formed of R$^{23}$ and R$^{24}$ linked to each other may be a monocyclic or polycyclic ring. Specific examples of the ring to be formed include a monocyclic ring such as a cyclopentene ring, a cyclopentadiene ring, a cyclohexene ring, or a cyclohexadiene ring, and a polycyclic ring such as an indene ring.

R$^{d1}$ to R$^{d4}$ in Formula 1-2 are preferably an unsubstituted alkyl group. Furthermore, all of R$^{d1}$ to R$^{d4}$ are preferably the same group.

Examples of the unsubstituted alkyl group include unsubstituted alkyl groups having 1 to 4 carbon atoms. Among these, a methyl group is preferable.

From the viewpoint of improving water solubility of the compound represented by Formula 1-2, W$^1$ and W$^2$ in Formula 1-2 preferably each independently represent a substituted alkyl group.

Examples of the substituted alkyl group represented by W$^1$ and W$^2$ include a group represented by any of Formula (a1) to Formula (a4) in Formula 1-1, and preferred aspects thereof are also the same.

From the viewpoint of on-press developability, W$^1$ and W$^2$ preferably each independently represent an alkyl group having a substituent. The alkyl group preferably has at least —(OCH$_2$CH$_2$)—, a sulfo group, a salt of a sulfo group, a carboxy group, or a salt of a carboxy group, as the substituent.

Za represents a counterion that neutralizes charge in the molecule.

In a case where all of R$^{19}$ to R$^{22}$, R$^{23}$ and R$^{24}$, R$^{d1}$ to R$^{d4}$, W$^1$, W$^2$, and R$^1$—L are groups having a neutral charge, Za is a monovalent counteranion. Here, R$^{19}$ to R$^{22}$, R$^{23}$ and R$^{24}$, R$^{d1}$ to R$^{d4}$, W$^1$, W$^2$, and R$^1$—L may have an anion structure or a cation structure. For example, in a case where two among R$^{19}$ to R$^{22}$, R$^{23}$ and R$^{24}$, R$^{d1}$ to R$^{d4}$, W$^1$, W$^2$, and R$^1$—L have an anion structure, Za can be a countercation.

In a case where the compound represented by Formula 1-2 has such a structure that the overall charge of the compound is neutral except for Za, Za is unnecessary.

Examples of the case where Za is a counteranion are the same as such examples of Za in Formula 1-1, and preferred aspects thereof are also the same. Furthermore, examples of the case where Za is a countercation are the same as such examples of Za in Formula 1-1, and preferred aspects thereof are also the same.

From the viewpoint of decomposition properties and color developability, the cyanine dye as a decomposable compound is even more preferably a compound represented by any of Formula 1-3 to Formula 1-7.

Particularly, from the viewpoint of decomposition properties and color developability, the cyanine dye is preferably a compound represented by any of Formula 1-3, Formula 1-5, and Formula 1-6.

Formula 1-3
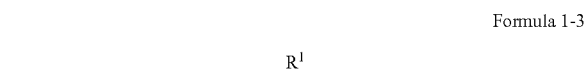

Formula 1-4
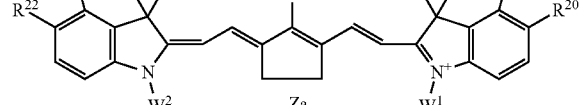
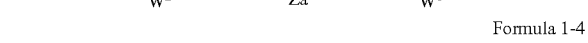

Formula 1-5
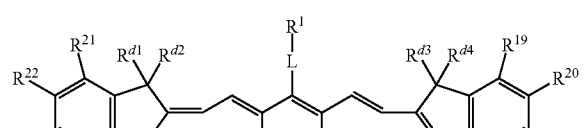

Formula 1-6
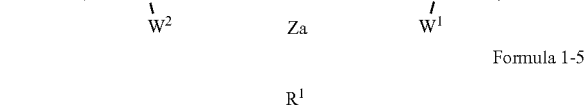

Formula 1-7
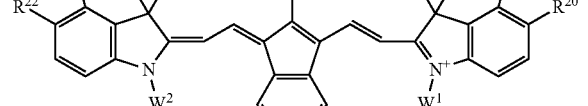
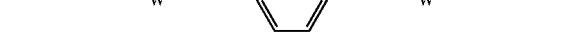

In Formula 1-3 to Formula 1-7, R$^1$ represents a group represented by any of Formula 2 to Formula 4, and R$^{19}$ to R$^{22}$ each independently represent a hydrogen atom, a halogen atom, —$R^a$, —$OR^b$, —CN, —$SR^c$, or —$NR^dR^e$, and $R^{25}$ and $R^{26}$ each independently represent a hydrogen atom, a halogen atom, or —$R^a$, and $R^a$ to $R^e$ each independently represent a hydrocarbon group, $R^{19}$ and $R^{20}$, $R^{21}$ and $R^{22}$, or $R^{25}$ and $R^{26}$ may be linked to each other to form a monocyclic or polycyclic ring, L represents an oxygen atom, a sulfur atom, or —$NR^{10}$—, $R^{10}$ represents a hydrogen atom, an alkyl group, or an aryl group, and $R^{d1}$ to $R^{d4}$, $W^1$, and $W^2$ each independently represent an alkyl group which may have a substituent, and Za represents a counterion that neutralizes charge.

$R^1$, $R^{19}$ to $R^{22}$, $R^{d1}$ to $R^{d4}$, $W^1$, $W^2$, and L in Formula 1-3 to Formula 1-7 have the same definitions as $R^1$, $R^{19}$ to $R^{22}$, $R^{d1}$ to $R^{d4}$, $W^1$, $W^2$, and L in Formula 1-2, and preferred aspects thereof are also the same.

$R^{25}$ and $R^{26}$ in Formula 1-7 preferably each independently represent a hydrogen atom or an alkyl group, more preferably each independently represent an alkyl group, and particularly preferably each independently represent a methyl group.

Specific examples of the cyanine dye as a decomposable compound will be shown below. However, the present disclosure is not limited thereto.

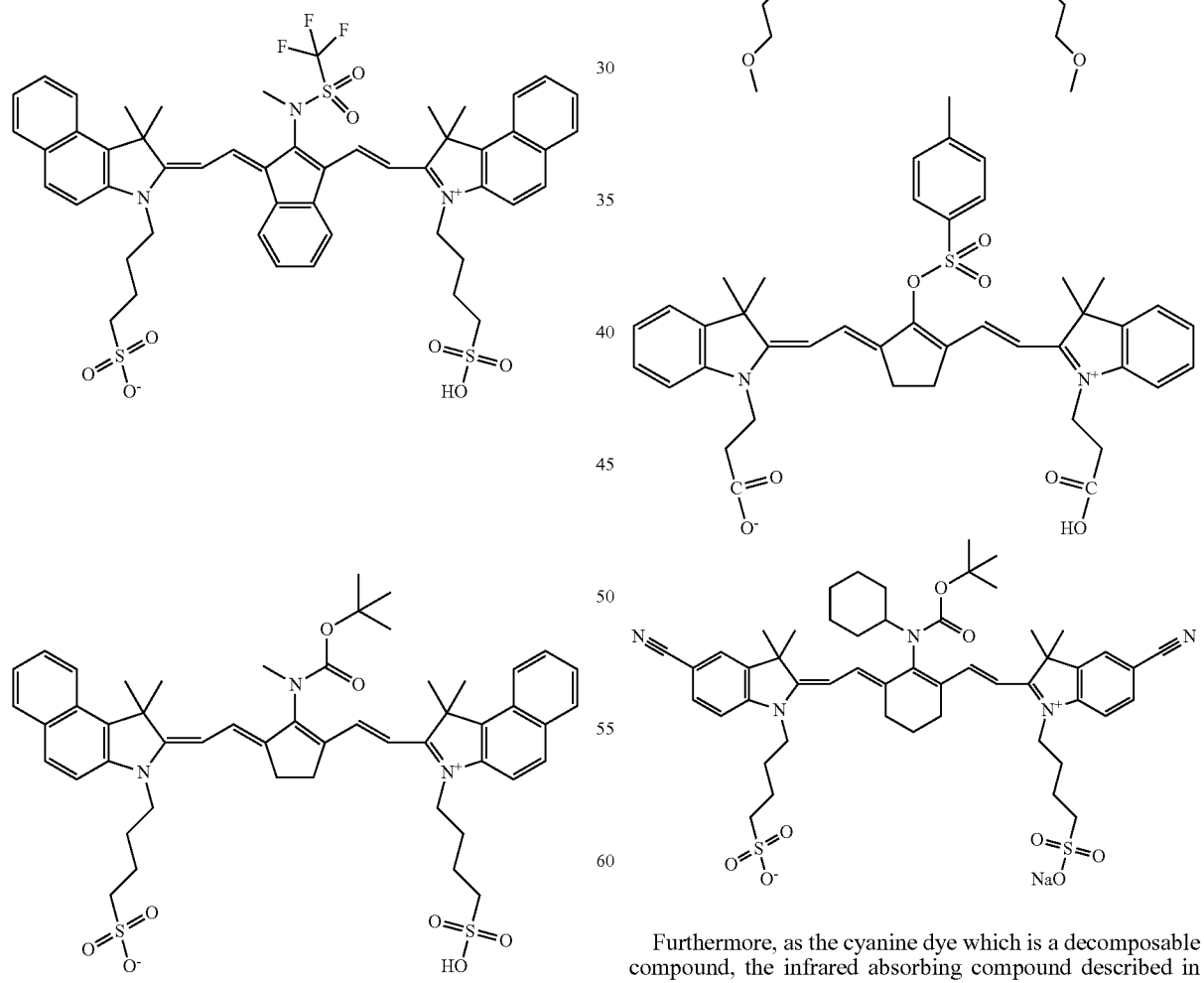

Furthermore, as the cyanine dye which is a decomposable compound, the infrared absorbing compound described in WO2019/219560A can be suitably used.

Moreover, the discoloring compound may contain an acid color-developing agent.

As the acid color-developing agent, it is possible to use the compounds described as acid color-developing agents in the image-recording layer, and preferred aspects thereof are also the same.

One kind of discoloring compound may be used alone, or two or more kinds of components may be combined and used as the discoloring compound.

As the discoloring compound, the decomposable compound described above and an acid generator that will be described later may be used in combination.

From the viewpoint of color developability, the content of the discoloring compound in the protective layer with respect to the total mass of the protective layer is preferably 0.10% by mass to 50% by mass, more preferably 0.50% by mass to 30% by mass, and even more preferably 1.0% by mass to 20% by mass.

From the viewpoint of color developability, $M^X/M^Y$ which is a ratio of a content $M^X$ of the discoloring compound in the protective layer to a content $M^Y$ of the infrared absorber in the image-recording layer is preferably 0.1 or more, more preferably 0.2 or more, and particularly preferably 0.3 or more and 3.0 or less.

—Water-Soluble Polymer—

From the viewpoint of development removability (more preferably on-press developability), the protective layer preferably contains a water-soluble polymer.

In the present disclosure, a water-soluble polymer refers to a polymer that dissolves 1 g or more in 100 g of pure water at 70° C. and is not precipitated even though a solution of 1 g of the polymer in 100 g of pure water at 70° C. is cooled to 25° C.

Examples of the water-soluble polymer used in the protective layer include polyvinyl alcohol, modified polyvinyl alcohol, polyvinylpyrrolidone, a water-soluble cellulose derivative, polyethylene glycol, poly(meth)acrylonitrile, and the like.

As the modified polyvinyl alcohol, acid-modified polyvinyl alcohol having a carboxy group or a sulfo group is preferably used. Specific examples thereof include modified polyvinyl alcohols described in JP2005-250216A and JP2006-259137A.

Preferable examples of the water-soluble polymer include polyvinyl alcohol. Particularly, as the water-soluble polymer to be used, polyvinyl alcohol having a saponification degree of 50% or more is more preferable.

The saponification degree is preferably 60% or higher, more preferably 70% or higher, and even more preferably 85% or higher. The upper limit thereof of the saponification degree is not particularly limited, and may be 100% or less.

The saponification degree is measured according to the method described in JIS K 6726: 1994.

Preferable examples of the water-soluble polymer also include polyvinylpyrrolidone.

As the water-soluble polymer, it is also preferable to use polyvinyl alcohol and polyvinylpyrrolidone in combination.

One kind of water-soluble polymer may be used alone, or two or more kinds of water-soluble polymers may be used in combination.

In a case where the protective layer contains a water-soluble polymer, the content of the water-soluble polymer with respect to the total mass of the protective layer is preferably 1% by mass to 99% by mass, more preferably 3% by mass to 97% by mass, and even more preferably 5% by mass to 95% by mass.

—Other Components—

The protective layer may contain other components such as a hydrophobic polymer, an oil sensitizing agent, an acid generator, and an infrared absorber, in addition to the discoloring compound and water-soluble polymer described above.

Hereinafter, those other components will be described.

[Hydrophobic Polymer]

The protective layer preferably contains a hydrophobic polymer.

The hydrophobic polymer refers to a polymer that dissolves less than 1 g or does not dissolve in 100 g of pure water at 70° C.

Examples of the hydrophobic polymer include polyethylene, polystyrene, polyvinyl chloride, polyvinylidene chloride, polyalkyl (meth)acrylate ester (for example, polymethyl (meth)acrylate, polyethyl (meth)acrylate, polybutyl (meth)acrylate, and the like), a copolymer obtained by combining raw material monomers of these polymers, and the like.

The hydrophobic polymer preferably includes a polyvinylidene chloride resin.

Furthermore, the hydrophobic polymer preferably includes a styrene-acrylic copolymer.

In addition, from the viewpoint of on-press developability, the hydrophobic polymer is preferably hydrophobic polymer particles.

One kind of hydrophobic polymer may be used alone, or two or more kinds of hydrophobic polymers may be used in combination.

In a case where the protective layer contains a hydrophobic polymer, the content of the hydrophobic polymer with respect to the total mass of the protective layer is preferably 1% by mass to 80% by mass, and more preferably 5% by mass to 50% by mass.

[Oil Sensitizing Agent]

From the viewpoint of ink receptivity, the protective layer preferably contains an oil sensitizing agent.

As the oil sensitizing agent to be used in the protective layer, it is possible to use the oil sensitizing agent described above regarding the image-recording layer, and preferred aspects thereof are also the same.

One kind of oil sensitizing agent may be used alone, or two or more kinds of oil sensitizing agents may be used in combination.

In a case where the protective layer contains an oil sensitizing agent, the content of the oil sensitizing agent with respect to the total mass of the protective layer is preferably 0.5% by mass to 30% by mass, and more preferably 1% by mass to 20% by mass.

[Acid Generator]

In a case where an acid color-developing agent is used as a discoloring compound, the protective layer preferably contains an acid generator.

"Acid generator" in the present disclosure is a compound that generates an acid by light or heat. Specifically, the acid generator refers to a compound that generates an acid by being decomposed by exposure to infrared.

The acid to be generated is preferably a strong acid having a pKa of 2 or less, such as sulfonic acid or hydrochloric acid. The acid generated from the acid generator enables the acid color-developing agent to discolor.

Specifically, as the acid generator, from the viewpoint of sensitivity and stability, an onium salt compound is preferable.

Specific examples of onium salts suitable as the acid generator include the compounds described in paragraphs "0121" to "0124" of WO2016/047392A.

Particularly, sulfonate, carboxylate, $BPh_4^-$, $BF_4^-$, $PF_6^-$, $ClO_4^-$ of triarylsulfonium or diaryliodonium, and the like are preferable. Ph represents a phenyl group.

One kind of acid generator may be used alone, or two or more kinds of acid generators may be used in combination.

In a case where the protective layer contains an acid generator, the content of the acid generator with respect to the total mass of the protective layer is preferably 0.5% by mass to 30% by mass, and more preferably 1% by mass to 20% by mass.

The protective layer may contain known additives such as an inorganic lamellar compound and a surfactant, in addition to the components described above.

The protective layer is formed by coating by a known method and drying.

The coating amount (solid content) of the protective layer is preferably 0.01 $g/m^2$ to 10 $g/m^2$, more preferably 0.02 $g/m^2$ to 3 $g/m^2$, and particularly preferably 0.1 $g/m^2$ to 2.0 $g/m^2$.

The film thickness of the protective layer is preferably 0.1 μm to 5.0 μm, and more preferably 0.3 μm to 4.0 μm.

The film thickness of the protective layer is preferably 10% to 500% of the film thickness of the image-recording layer which will be described later, and more preferably 20% to 300% of the film thickness of the image-recording layer.

The protective layer may contain known additives such as a plasticizer for imparting flexibility, a surfactant for improving coating properties, and inorganic particles for controlling surface slipperiness.

(Method for Preparing Lithographic Printing Plate and Lithographic Printing Method)

It is possible to prepare a lithographic printing plate by performing image exposure and a development treatment on the lithographic printing plate precursor according to the present disclosure.

The method for preparing a lithographic printing plate according to the present disclosure preferably includes a step of exposing the lithographic printing plate precursor according to the present disclosure in the shape of an image (hereinafter, this step will be also called "exposure step") and a step of removing the image-recording layer in a non-image area on a printer by supplying at least one material selected from the group consisting of a printing ink and dampening water (hereinafter, this step will be also called "on-press development step").

The lithographic printing method according to the present disclosure preferably includes a step of exposing the lithographic printing plate precursor according to the present disclosure in the shape of an image (exposure step), a step of removing the image-recording layer in a non-image area on a printer by supplying at least one material selected from the group consisting of a printing ink and dampening water so that a lithographic printing plate is prepared (on-press development step), and a step of performing printing by using the obtained lithographic printing plate (printing step).

Hereinafter, regarding the method for preparing a lithographic printing plate according to the present disclosure and the lithographic printing method according to the present disclosure, preferred aspects of each step will be described in order. Note that the lithographic printing plate precursor according to the present disclosure can also be developed using a developer.

Hereinafter, the exposure step and the on-press development step in the method for preparing a lithographic printing plate will be described. The exposure step in the method for preparing a lithographic printing plate according to the present disclosure is the same step as the exposure step in the lithographic printing method according to the present disclosure. Furthermore, the on-press development step in the method for preparing a lithographic printing plate according to the present disclosure is the same step as the on-press development step in the lithographic printing method according to the present disclosure.

Furthermore, presumably, a part of the outermost layer may be removed during on-press development, and a part of the outermost layer may remain on the surface of the image area or permeate the inside of the image area by a printing ink.

<Exposure Step>

The method for preparing a lithographic printing plate according to the present disclosure preferably includes an exposure step of exposing the lithographic printing plate precursor according to the present disclosure in the shape of an image so that an exposed portion and a non-exposed portion are formed. The lithographic printing plate precursor according to the present disclosure is preferably exposed to a laser through a transparent original picture having a linear image, a halftone dot image, or the like or exposed in the shape of an image by laser light scanning according to digital data or the like.

The wavelength of a light source to be used in preferably 750 nm to 1,400 nm. As the light source having a wavelength of 750 nm to 1,400 nm, a solid-state laser or a semiconductor laser that radiates infrared is suitable. In a case where an infrared laser is used, the output is preferably 100 mW or higher, the exposure time per pixel is preferably 20 microseconds or less, and the amount of irradiation energy is preferably 10 $mJ/cm^2$ to 300 $mJ/cm^2$. In addition, in order to shorten the exposure time, a multibeam laser device is preferably used. The exposure mechanism may be any one of an in-plane drum method, an external surface drum method, a flat head method, or the like.

The image exposure can be carried out by a common method using a platesetter or the like. In the case of on-press development, image exposure may be carried out on a printer after the lithographic printing plate precursor is mounted on the printer.

<On-Press Development Step>

The method for preparing a lithographic printing plate according to the present disclosure preferably includes an on-press development step of removing the image-recording layer in a non-image area on a printer by supplying at least one material selected from the group consisting of a printing ink and dampening water.

Hereinafter, the on-press development method will be described.

[On-Press Development Method]

In the on-press development method, the lithographic printing plate precursor having undergone image exposure is preferably supplied with an oil-based ink and an aqueous component on a printer, so that the image-recording layer in a non-image area is removed and a lithographic printing plate is prepared.

That is, in a case where the lithographic printing plate precursor is subjected to image exposure and then directly mounted on a printer without being subjected to any development treatment, or in a case where the lithographic printing plate precursor is mounted on a printer, then subjected to image exposure on the printer, and then supplied with an oil-based ink and an aqueous component for printing, at the initial stage in the middle of printing, in a non-image area, a non-cured image-recording layer is removed by either or both of the supplied oil-based ink and the aqueous component by means of dissolution or dispersion, and the hydrophilic surface is exposed in that portion. On the other hand, in an exposed portion, the image-recording layer cured by exposure forms an oil-based ink-receiving portion having a lipophilic surface. What is supplied first to the surface of the plate may be any of the oil-based ink or the aqueous component. However, in view of preventing the plate from being contaminated by the components of the image-recording layer from which aqueous components are removed, it is preferable that the oil-based ink be supplied first. In the manner described above, the lithographic printing plate precursor is subjected to on-press development on a printer and used as it is for printing a number of sheets. As the oil-based ink and the aqueous component, ordinary printing ink and ordinary dampening water for lithographic printing are suitably used.

As the laser used for performing image exposure on the lithographic printing plate precursor according to the present disclosure, a light source having a wavelength of 300 nm to 450 nm or 750 nm to 1,400 nm is preferably used. A light source having a wavelength of 300 nm to 450 nm is preferable for a lithographic printing plate precursor including an image-recording layer containing sensitizing dye having maximum absorption in such a wavelength region. The light source having a wavelength of 750 nm to 1,400 nm is preferable for the aforementioned lithographic printing plate precursor. As the light source having a wavelength of 300 nm to 450 nm, a semiconductor laser is suitable.

<Development Step Using Developer>

The method for preparing a lithographic printing plate according to the present disclosure may be a method including a step of exposing the lithographic printing plate precursor according to the present disclosure in the shape of an image and a step of preparing a lithographic printing plate by removing the image-recording layer in a non-image area by using a developer (also called "development step using a developer").

Furthermore, the lithographic printing method according to the present disclosure may be a method including a step of exposing the lithographic printing plate precursor according to the present disclosure in the shape of an image, a step of preparing a lithographic printing plate by removing the image-recording layer in a non-image area by using a developer, and a step of performing printing by using the obtained lithographic printing plate.

As the developer, known developers can be used.

The pH of the developer is not particularly limited, and the developer may be a strongly alkaline developer. Preferable examples of the developer include a developer having a pH of 2 to 11. Preferable examples of the developer having a pH of 2 to 11 include a developer containing at least one kind of component among surfactants and water-soluble polymer compounds.

Examples of the development treatment using a strongly alkaline developer include a method of removing the protective layer by a pre-rinsing step, then performing development using an alkali, rinsing and removing the alkali by a post-rinsing step, performing a gum solution treatment, and performing drying by a drying step.

In a case where the aforementioned developer containing a surfactant or a water-soluble polymer compound is used, development and the gum solution treatment can be simultaneously performed. As a result, the post-rinsing step is unnecessary, and it is possible to perform both the development and gum solution treatment by using one solution and to subsequently perform the drying step. Furthermore, because the removal of the protective layer can be performed simultaneously with the development and the gum solution treatment, the pre-rinsing step is unnecessary as well. After the development treatment, it is preferable to remove an excess of developer by using a squeeze roller or the like and to subsequently perform drying.

<Printing Step>

The lithographic printing method according to the present disclosure includes a printing step of printing a recording medium by supplying a printing ink to the lithographic printing plate.

The printing ink is not particularly limited, and various known inks can be used as desired. In addition, preferable examples of the printing ink include oil-based ink or ultraviolet-curable ink (UV ink).

In the printing step, if necessary, dampening water may be supplied.

Furthermore, the printing step may be successively carried out after the on-press development step or the development step using a developer, without stopping the printer.

The recording medium is not particularly limited, and known recording media can be used as desired.

In the method for preparing a lithographic printing plate from the lithographic printing plate precursor according to the present disclosure and in the lithographic printing method according to the present disclosure, if necessary, the entire surface of the lithographic printing plate precursor may be heated as necessary before exposure, in the middle of exposure, or during a period of time from exposure to development. In a case where the lithographic printing plate precursor is heated as above, an image-forming reaction in the image-recording layer is accelerated, which can result in advantages such as improvement of sensitivity or printing durability, stabilization of sensitivity, and the like. Heating before development is preferably carried out under a mild condition of 150° C. or lower. In a case where this aspect is adopted, it is possible to prevent problems such as curing of a non-image area. For heating after development, it is preferable to use an extremely severe condition which is preferably in a range of 100° C. to 500° C. In a case where this aspect is adopted, a sufficient image-strengthening action is obtained, and it is possible to inhibit problems such as the deterioration of the support or the thermal decomposition of the image area.

EXAMPLES

Hereinafter, the present disclosure will be specifically described based on examples, but the present disclosure is not limited thereto. In the present examples, unless otherwise specified, "%" and "part" mean "% by mass" and "part by mass" respectively.

<Synthesis of Polymerizable Compound 3>

A mixed solution of polyisocyanate (manufactured by Mitsui Chemicals, Inc., 4.7 parts by mass) shown in Table 1, a hydroxyl group-containing polyfunctional acrylate (manufactured by TOAGOSEI CO., LTD.) shown in Table 1 in such an amount that the ratio of the NCO value of polyisocyanate to the hydroxyl number of hydroxyl group-containing polyfunctional acrylate was 1:1, 0.02 parts by mass of t-butylbenzoquinone, and 11.5 parts by mass of methyl ethyl ketone was heated at 65° C. NEOSTANN U-600 (bismuth-based polycondensation catalyst, manufactured by NITTO KASEI CO., LTD., 0.11 parts by mass) was added to the reaction solution, and the reaction solution was heated at the same temperature for 4 hours. The reaction solution was cooled to room temperature (25° C.), and methyl ethyl ketone was added thereto, thereby synthesizing a urethane acrylate solution having a solid content of 50% by mass.

Subsequently, by using recycling GPC (instrument: LC908-C60, column: JAIGEL-1H-40 and 2H-40 (manufactured by Japan Analytical Industry Co., Ltd.)) and tetrahydrofuran (THF) as an eluent, molecular weight fractionation of the urethane acrylate solution was performed. Then, M3-1 to M3-3 shown in Table 1 were obtained.

<Measurement of Weight-Average Molecular Weight (Mw) and Ethylenically Unsaturated Bond Valence (C=C Valence)>

The weight-average molecular weight Mw of the polymerizable compound 3 was measured by the following measurement instruments and methods.

GPC measurement instrument: TOSOH HLC-8320 GPC, GPC mobile phase: THF

Inspector Differential Refractometer (RI), flow rate: 0.35 mIUmin

Columns: TSKgel SuperHZM-M, TSKgel SuperHZ4000, TSKgel SuperHZ3000, and TSKgel SuperHZ2000 were connected and used.

Column temperature: 40° C.

Standard sample for molecular weight calibration curve: polystyrene (PS)

The (model) structure of compounds was analyzed by $^1$H-NMR spectroscopy and used for calculating the ethylenically unsaturated bond valence (C=C valence) of the compounds.

The undercoat layer was bar-coated with the following coating liquid (1) for an image-recording layer and dried in an oven at 120° C. for 40 seconds so that an image-recording layer having a dry coating amount of 0.971 g/m$^2$ was formed. In this way, a lithographic printing plate precursor was obtained.

The coating liquid (1) for an image-recording layer containing polymer particles (microgel) was prepared by mixing a photosensitive liquid obtained by mixing together components other than the following microgel liquid with the following microgel liquid immediately before coating and stirring the mixture.

<Coating Liquid for Undercoat Layer>

Compound (P-1) for undercoat layer [the following structure]: 0.1370 parts

Sodium gluconate: 0.0700 parts

Surfactant (EMALEX 710, manufactured by NIHON EMULSION Co., Ltd.): 0.00159 parts Preservative (BIOHOPE L, manufactured by K·I Chemical Industry Co., LTD.): 0.00149 parts Water: 3.29000 parts

TABLE 1

| | Polyisocyanate | | | Hydroxyl group-containing polyfunctional acrylate | | Physical properties | |
| --- | --- | --- | --- | --- | --- | --- | --- |
| | Type | Trade name | NCO % | Type | Trade name | Weight-average molecular weight | C=C valence mmol/g |
| M3-1 synthetic polymer | TMP adduct | TAKENATE D-160N | 12.6 | DPPA | ARONIX M-405 | 12,000 | 7.0 |
| M3-2 synthetic polymer | Biuret polymer | TAKENATE D-165N | 23.3 | DPPA | ARONIX M-405 | 12,000 | 7.0 |
| M3-3 synthetic polymer | Isocyanurate polymer | TAKENATE D-170N | 20.7 | DPPA | ARONIX M-405 | 12,000 | 7.0 |

<Preparation of Support>

An aluminum alloy plate made of a material 1S having a thickness of 0.3 mm was subjected to (A-a) Mechanical roughening treatment (brush grain method) to (A-i) Desmutting treatment in aqueous acidic solution described in paragraphs "0126" to "0134" of JP2012-158022A.

Then, the conditions of treatments from (A-j) First-stage anodic oxidation treatment described in paragraph "0135" of JP2012-158022A to (A-m) Third stage anodic oxidation treatment described in paragraph "0138" in the same document were appropriately adjusted, and an anodic oxide film was formed which had a large diameter portion having an average diameter of 35 nm and a depth of 100 nm and a small diameter portion having an average diameter of 10 nm and a depth of 1,000 nm and satisfied a ratio of depth of large diameter portion/average diameter of large diameter portion=2.9, thereby obtaining an aluminum support A.

A rinsing treatment was performed between all the treatment steps. After the rinsing treatment, water was drained using a nip roller.

<Formation of Undercoat Layer>

The support A (printing surface side) was coated with coating liquid for an undercoat layer having the following composition so that the dry coating amount was 87 mg/m$^2$. In this way, an undercoat layer was formed.

(P-1)

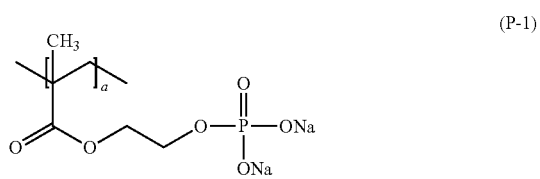

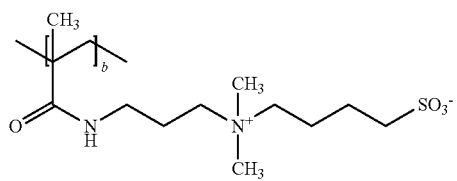

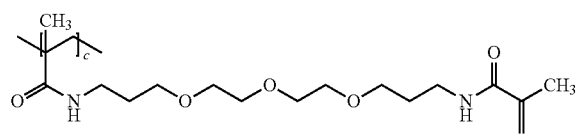

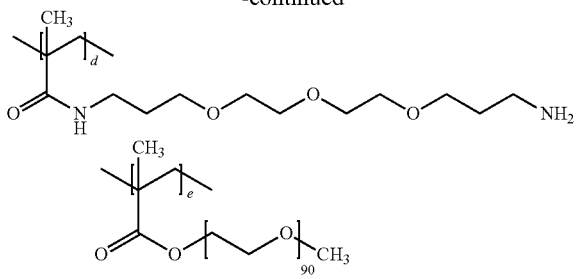

a/b/c/d/e = 14.2/71.8/8.9/0.1/5.0 (% by mass)
a/b/c/d/e = 19.0/72.8/7.7/0.1/0.4 (mol %)
Weight-average molecular weight = 200.000

<<Coating liquid (1) for image-recording layer>>

IR-1 (infrared absorber, the following compound): 0.01970 parts

Color developing agent (S-15) [the above structure]: 0.02000 parts

IA-1 (electron-accepting polymerization initiator, the following compound): 0.11000 parts Electron-donating polymerization initiator (borate compound, (sodium tetraphenylborate)): 0.025 parts Polymerizable compound 3 described in Table 2: amount described in Table 2

Polymerizable compound 2 described in Table 2: amount described in Table 2

Polymerizable compound 1 described in Table 2: amount described in Table 2

Anionic surfactant (A-1) [the following structure]: 0.004 parts

Fluorine-based surfactant (W-1) [the following structure]: 0.00416 parts

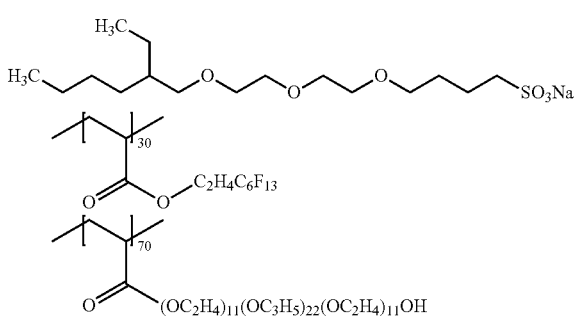

2-Butanone: 4.92 parts
1-Methoxy-2-propanol: 3.10 parts
Methanol: 2.79 parts
Microgel liquid: 2.32 parts

[Infrared Absorber]

IR-1: a compound having the following structure, HOMO=−5.35 eV, LUMO=−3.73 eV, where Ph represents a phenyl group.

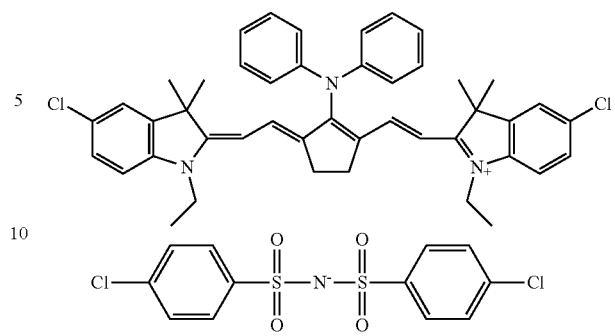

[Electron-Accepting Polymerization Initiator]

IA-1: compound having the following structure, LUMO=−3.02 eV

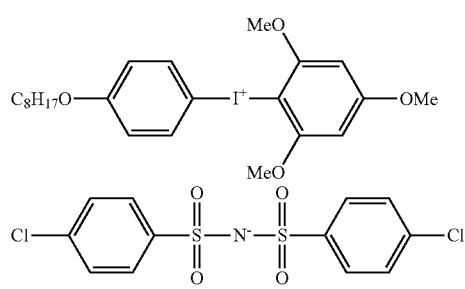

—Preparation of Microgel Liquid—

Microgel (polymer particles): 2.640 parts

Distilled water: 2.425 parts

Microgel used in the aforementioned microgel liquid was prepared by the following method.

—Preparation of Polyvalent Isocyanate Compound—

Bismuth tris(2-ethylhexanoate) (NEOSTANN U-600, manufactured by NITTO KASEI CO., LTD., 43 mg) was added to an ethyl acetate (25.31 g) suspension solution of 17.78 g (80 mmol) of isophorone diisocyanate and 7.35 g (20 mmol) of the following polyhydric phenol compound (1), and the obtained solution was stirred. The reaction temperature was set to 50° C. at a point in time when heat release subsided, and the solution was stirred for 3 hours, thereby obtaining an ethyl acetate solution of the polyvalent isocyanate compound (1) (50% by mass).

Polyhydric phenol compound (1)

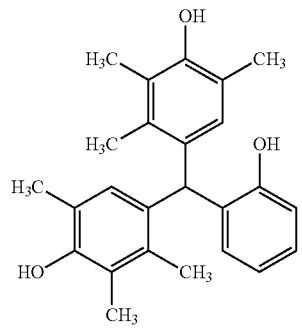

—Preparation of Microgel—

The following oil-phase components and water-phase components were mixed together and emulsified at 12,000 rpm (revolutions per minute) for 10 minutes by using a homogenizer. The obtained emulsion was stirred at 45° C. for 4 hours, a 10% by mass aqueous solution of 5.20 g of 1,8-diazabicyclo[5.4.0]undec-7-ene-octylate (U-CAT SA102, manufactured by San-Apro Ltd.) was added thereto, and the solution was stirred at room temperature for 30 minutes and left to stand at 45° C. for 24 hours. Distilled water was added thereto so that the concentration of solid contents was adjusted to 20% by mass, thereby obtaining an aqueous dispersion of microgel (1). The average particle diameter thereof measured by a light scattering method was 0.28 μm.

—Oil-Phase Component—
(Component 1) ethyl acetate: 12.0 g
(Component 2) An adduct obtained by addition of trimethylolpropane (6 moles), xylene diisocyanate (18 moles), and polyoxyethylene with a methylated terminal (1 mole, the number of repeating oxyethylene units: 90) (50% by mass ethyl acetate solution, manufactured by Mitsui Chemicals, Inc.): 3.76 g
(Component 3) polyvalent isocyanate compound (1) (as 50% by mass ethyl acetate solution): 15.0 g
(Component 4) 65% by mass ethyl acetate solution of dipentaerythritol pentaacrylate (SR-399, manufactured by Sartomer Company Inc.): 11.54 g
(Component 5) 10% ethyl acetate solution of sulfonate type surfactant (PIONINE A-41-C, manufactured by TAKEMOTO OIL & FAT Co., Ltd.): 4.42 g —Water-Phase Component—
Distilled water: 46.87 g <Evaluation>
(1) Printing Durability Against Ultraviolet-Curable Ink (UV Printing Durability)

By using Magnus 800 Quantum manufactured by Kodak Japan Ltd. that was equipped with an infrared semiconductor laser, the lithographic printing plate precursor prepared as above was exposed under the conditions of output of 27 W, an outer drum rotation speed of 450 rpm, and a resolution of 2,400 dpi (dot per inch, 1 inch is equal to 2.54 cm) (irradiation energy equivalent to 110 mJ/cm$^2$). The exposure image included a solid image and a 10% halftone dot chart of Amplitude Modulation Screen (AM screen).

The obtained exposed precursor was mounted on a Kikuban-sized cylinder of a printer SX-74 manufactured by Heidelberger Druckmaschinen AG without being developed. This printer was connected to a 100 L-capacity dampening water circulation tank having a non-woven fabric filter and a temperature control device. A circulation device was filled with dampening water (80 L) containing 2.0% dampening water S-Z1 (manufactured by FUJIFILM Corporation), and T&K UV OFS K-HS black GE-M (manufactured by T&K TOKA CO., LTD.) was used as printing ink. The dampening water and ink were supplied by a standard automatic printing start method, and then printing was performed on 500 sheets of TOKUBISHI art paper (ream weight: 76.5 kg, manufactured by MITSUBISHI PAPER MILLS LIMITED.) at a printing rate of 10,000 sheets/hour.

Then, printing was performed further. As the number of printing sheets increased, the image area gradually wore out, and thus the ink density on the printed matter decreased. For the AM screen 10% halftone dots in the printed matter, the area ratio of the 10% halftone dot AM screen was measured using a Gretag density meter (manufactured by GretagMacbeth). The number of printing sheets at a point in time when the measured area ratio was 3% lower than the area ratio measured after 500 sheets were printed was adopted as the number of sheets of completed printing and used for evaluation of printing durability. The number of sheets of completed printing in Example 1 was regarded as 100, and printing durability was evaluated by relative comparison. The higher the numerical value, the better the printing durability. The evaluation results are described in Table 2.

(2) On-Press Developability

By using Magnus 800 Quantum manufactured by Kodak Japan Ltd. that was equipped with an infrared semiconductor laser, the lithographic printing plate precursor prepared as above was exposed under the conditions of output of 27 W, an outer drum rotation speed of 450 rpm, and a resolution of 2,400 dpi (dot per inch, 1 inch is equal to 2.54 cm) (irradiation energy equivalent to 110 mJ/cm$^2$). The exposure image included a solid image and a 3% halftone dot chart of Amplitude Modulation Screen (AM screen).

The obtained exposed precursor was mounted on a Kikuban-sized cylinder of a printer SX-74 manufactured by Heidelberger Druckmaschinen AG without being developed. This printer was connected to a 100 L-capacity dampening water circulation tank having a non-woven fabric filter and a temperature control device. A circulation device was filled with dampening water (80 L) containing 2.0% dampening water S-Z1 (manufactured by FUJIFILM Corporation), and T&K UV OFS K-HS black GE-M (manufactured by T&K TOKA CO., LTD.) was used as printing ink. The dampening water and ink were supplied by a standard automatic printing start method, and then printing was performed on 500 sheets of TOKUBISHI art paper (manufactured by MITSUBISHI PAPER MILLS LIMITED., ream weight: 76.5 kg) at a printing rate of 10,000 sheets/hour.

During the on-press development described above, the number of printing papers used until no ink was transferred to a non-image area was measured as the on-press developability. The results are described in Table 2. It can be said that the smaller the number of printing papers, the better the on-press developability.

(3) Suppression of UV Plate Missing

By using Magnus 800 Quantum manufactured by Kodak Japan Ltd. that was equipped with an infrared semiconductor laser, the lithographic printing plate precursor prepared as above was exposed under the conditions of output of 27 W, an outer drum rotation speed of 450 rpm, and a resolution of 2,400 dpi (dots per inch, 1 inch is equal to 2.54 cm) (irradiation energy equivalent to 110 mJ/cm$^2$). The exposure images included a solid image and an amplitude modulated screening (AM screening) as a 3% halftone dot chart.

A piano wire (ESCO CORPORATION) having a diameter of 0.4 mm was attached to the halftone dot portion of the exposed precursor in the direction perpendicular to the rotation direction of the plate cylinder, and the precursor was mounted on the Kikuban-sized cylinder of printer SX-74 manufactured by Heidelberger Druckmaschinen AG without being subjected to a development treatment. This printer was connected to a 100 L-capacity dampening water circulation tank having a non-woven fabric filter and a temperature control device. A circulation device was filled with dampening water (80 L) containing 2.0% dampening water S-Z1 (manufactured by FUJIFILM Corporation), and T&K UV OFS K-HS black GE-M (manufactured by T&K TOKA CO., LTD.) was used as printing ink. The dampening water and ink were supplied by a standard automatic printing start method, and then printing was performed on TOKUBISHI art paper (manufactured by MITSUBISHI PAPER MILLS LIMITED., ream weight: 76.5 kg) at a printing rate of 10,000 sheets/hour.

When the number of printing sheets reached 2,000, the piano wire was removed from the plate, the plate was set in the printer again, and printing was started. For the 100th printed matter after the resumption of printing and the image area corresponding to the position of the piano wire were checked observed. Furthermore, whether defective sticking occurred was visually checked using 50× magnifying glass, and defective sticking was evaluated on a scale of 1 to 10. The higher the score, the harder it is for defective sticking to occur. The evaluation results are described in Table 2.

TABLE 2

| | | Image-recording layer | | | | | | | |
|---|---|---|---|---|---|---|---|---|---|
| | | Polymerizable compound 1 | | | | Polymerizable compound 2 | | | |
| | | Type | Molecular weight | Number of functional groups | Amount of addition M1 (mg/m$^2$) | Type | Molecular weight | Number of functional groups | Amount of addition M2 (mg/m$^2$) | Ratio (M2/(M1 + M2)) |
| Example | 1 | M1-1 | 578 | 6 | 0.24 | M2-1 | 1,428 | 15 | 0.04 | 0.14 |
| | 2 | M1-2 | 524 | 5 | 0.24 | M2-1 | 1,428 | 15 | 0.04 | 0.14 |
| | 3 | M1-3 | 415 | 3 | 0.24 | M2-1 | 1,428 | 15 | 0.04 | 0.14 |
| | 4 | M1-1 | 578 | 6 | 0.12 | M2-1 | 1,428 | 15 | 0.04 | 0.14 |
| | | M1-2 | 524 | 5 | 0.12 | | | | | |
| | 5 | M1-1 | 578 | 6 | 0.12 | M2-1 | 1,428 | 15 | 0.04 | 0.14 |
| | | M1-3 | 415 | 3 | 0.12 | | | | | |
| | 6 | M1-1 | 578 | 6 | 0.24 | M2-2 | 2,078 | 10 | 0.04 | 0.14 |
| | 7 | M1-1 | 578 | 6 | 0.24 | M2-1 | 1,428 | 15 | 0.04 | 0.14 |
| | 8 | M1-1 | 578 | 6 | 0.24 | M2-1 | 1,428 | 15 | 0.04 | 0.14 |
| | 9 | M1-1 | 578 | 6 | 0.24 | M2-1 | 1,428 | 15 | 0.04 | 0.14 |
| | 10 | M1-1 | 578 | 6 | 0.24 | M2-1 | 1,428 | 15 | 0.04 | 0.14 |
| | 11 | M1-1 | 578 | 6 | 0.24 | M2-1 | 1,428 | 15 | 0.04 | 0.14 |
| | 12 | M1-1 | 578 | 6 | 0.24 | M2-1 | 1,428 | 15 | 0.04 | 0.14 |
| | 13 | M1-1 | 578 | 6 | 0.24 | M2-1 | 1,428 | 15 | 0.04 | 0.14 |
| | 14 | M1-1 | 578 | 6 | 0.24 | M2-1 | 1,428 | 15 | 0.04 | 0.14 |
| | 15 | M1-1 | 578 | 6 | 0.24 | M2-1 | 1,428 | 15 | 0.04 | 0.14 |
| | 16 | M1-1 | 578 | 6 | 0.24 | M2-1 | 1,428 | 15 | 0.04 | 0.14 |
| | 17 | M1-1 | 578 | 6 | 0.24 | M2-1 | 1,428 | 15 | 0.04 | 0.40 |
| | 18 | M1-1 | 578 | 6 | 0.12 | M2-1 | 1,428 | 15 | 0.04 | 0.25 |
| | 19 | M1-1 | 578 | 6 | 0.24 | M2-1 | 1,428 | 15 | 0.02 | 0.08 |
| | 20 | M1-1 | 578 | 6 | 0.24 | M2-1 | 1,428 | 15 | 0.04 | 0.14 |
| | 21 | M1-1 | 578 | 6 | 0.24 | M2-1 | 1,428 | 15 | 0.04 | 0.14 |
| Comparative Example | 1 | M1-4 | 261 | 3 | 0.28 | — | — | — | — | — |
| | 2 | M1-3 | 261 | 3 | 0.13 | — | — | — | — | — |
| | 3 | — | — | — | — | M2-1 | 1,428 | 15 | 0.2 | — |

| | | Image-recording layer | | | | | Evaluation | | |
|---|---|---|---|---|---|---|---|---|---|
| | | Polymerizable compound 3 | | | | | | | |
| | | Type | Molecular weight | Amount of addition M3 (mg/m$^2$) | C=C valence | Ratio (M3/(M1 + M2 + M3)) | Color developing agent | UV printing durability | On-press developability (number of sheets) | Suppression of UV plate missing |
| Example | 1 | M3-1 | 12,000 | 0.07 | 7 | 0.20 | S-15 | 100 | 20 | 8 |
| | 2 | M3-1 | 12,000 | 0.07 | 7 | 0.20 | S-15 | 85 | 20 | 7 |
| | 3 | M3-1 | 12,000 | 0.07 | 7 | 0.20 | S-15 | 60 | 20 | 5 |
| | 4 | M3-1 | 12,000 | 0.07 | 7 | 0.20 | S-15 | 95 | 20 | 8 |
| | 5 | M3-1 | 12,000 | 0.07 | 7 | 0.20 | S-15 | 85 | 20 | 7 |
| | 6 | M3-1 | 12,000 | 0.07 | 7 | 0.20 | S-15 | 85 | 20 | 7 |
| | 7 | M3-2 | 12,000 | 0.07 | 7 | 0.20 | S-15 | 95 | 20 | 8 |
| | 8 | M3-3 | 12,000 | 0.07 | 7 | 0.20 | S-15 | 95 | 20 | 8 |
| | 9 | M3-4 | 12,000 | 0.07 | 2 | 0.20 | S-15 | 50 | 15 | 5 |
| | 10 | M3-1 | 3,000 | 0.07 | 7 | 0.20 | S-15 | 60 | 15 | 6 |
| | 11 | M3-1 | 8,000 | 0.07 | 7 | 0.20 | S-15 | 80 | 20 | 7 |
| | 12 | M3-1 | 15,000 | 0.07 | 7 | 0.20 | S-15 | 110 | 40 | 9 |
| | 13 | M3-1 | 12,000 | 0.03 | 7 | 0.10 | S-15 | 70 | 15 | 6 |
| | 14 | M3-1 | 12,000 | 0.28 | 7 | 0.50 | S-15 | 120 | 60 | 9 |
| | 15 | M3-1 | 12,000 | 0.07 | 7 | 0.30 | S-15 | 80 | 20 | 7 |
| | | M3-4 | 12,000 | 0.07 | | | | | | |
| | 16 | M3-1 | 12,000 | 0.07 | 7 | 0.20 | S-15 | 80 | 15 | 7 |
| | 17 | M3-1 | 12,000 | 0.07 | 7 | 0.20 | S-15 | 110 | 40 | 9 |
| | 18 | M3-1 | 12,000 | 0.07 | 7 | 0.30 | S-15 | 85 | 40 | 7 |
| | 19 | M3-1 | 12,000 | 0.07 | 7 | 0.21 | S-15 | 80 | 30 | 7 |
| | 20 | M3-1 | 12,000 | 0.04 | 7 | 0.13 | S-15 | 70 | 20 | 6 |
| | 21 | M3-1 | 12,000 | 0.07 | 7 | 0.20 | CL-1 | 90 | 20 | 7 |
| Comparative Example | 1 | M3-2 | 110,000 | 0.20 | 0.2 | 0.42 | — | 40 | 40 | 2 |
| | 2 | M3-2 | 35,000 | 0.20 | 1.5 | 0.60 | — | 30 | 30 | 2 |
| | 3 | M3-1 | 12,000 | 0.20 | 8 | 0.50 | CL-1 | 60 | 100 | 6 |

In Table 2, "-" means that the example does not contain the corresponding component.

In Table 2, "ratio" of the polymerizable compound 3 means the ratio of the content M3 of the polymerizable compound 3 to the total content M1+M2+M3 of the polymerizable compound 1, the polymerizable compound 2, and the polymerizable compound 3 (M3/(M1+M2+M3)). In Table 2, "ratio" of the polymerizable compound 2 means the ratio of the content M2 of the polymerizable compound 2 to the total content M1+M2 of the polymerizable compound 1 and the polymerizable compound 2 (M2/(M1+M2)).

In addition, "C=C valence" represents an ethylenically unsaturated bond valence, and the unit is mmol/g.

Details of the abbreviations in Table 2 are as below.

[Polymerizable Compound 1]

M1-1: the following compound (dipentaerythritol hexa(meth)acrylate, KAYARAD DPHA; manufactured by Nippon Kayaku Co., Ltd.)

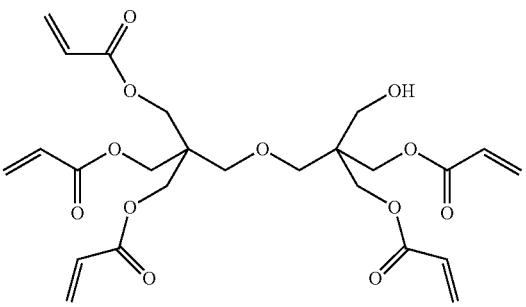

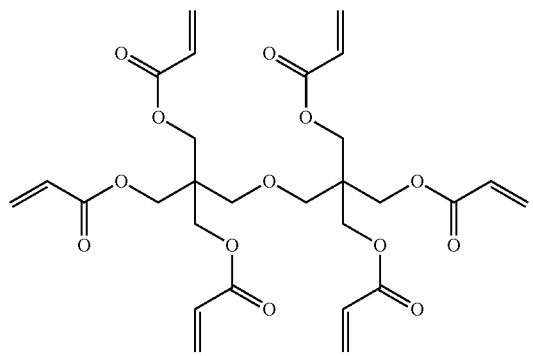 [SMILES: C=CC(=O)OCC(COCC(COC(=O)C=C)(COC(=O)C=C)COC(=O)C=C)(COC(=O)C=C)COC(=O)C=C]

M1-2: the following compound (DPPA, trade name: ARONIX M-403, manufactured by TOAGOSEI CO., LTD.)

M1-3: the following compound (tris(acroyloboxyethyl) isocyanurate, trade name: NK ESTER A-9300, manufactured by SHIN-NAKAMURA CHEMICAL CO, LTD.)

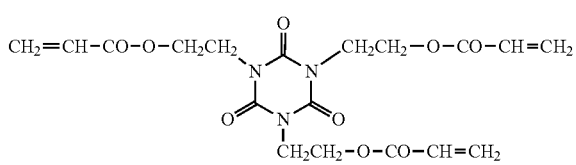

M1-4: the following compounds (ethoxylated bisphenol A diacrylate, trade name: A-BPE-4, manufactured by SHIN-NAKAMURA CHEMICAL CO, LTD.)

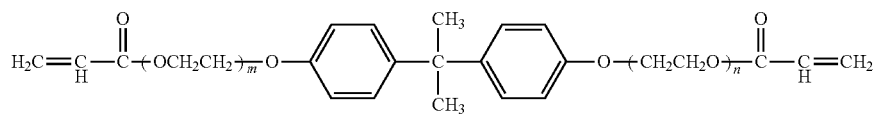

m + n = 4

[Polymerizable Compound 2]

M2-1: the following compound

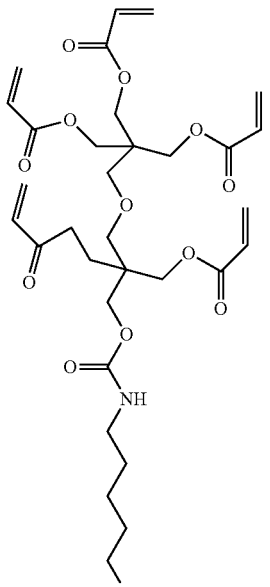

-continued
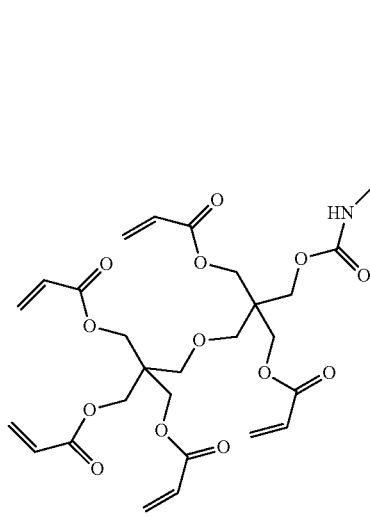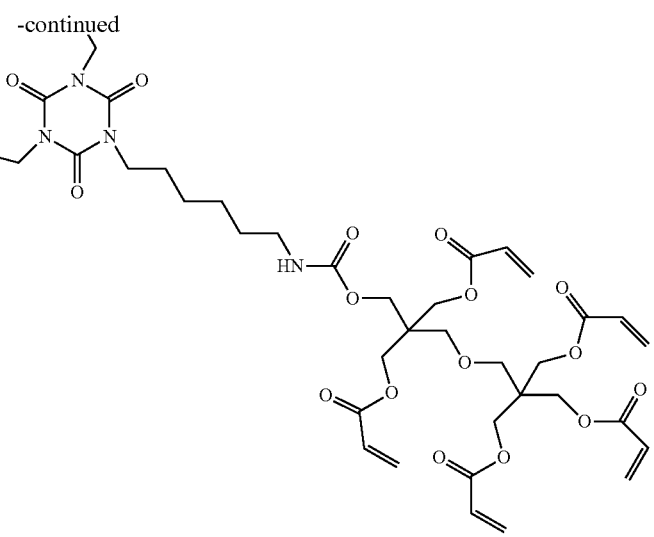
M2-2: the following compound
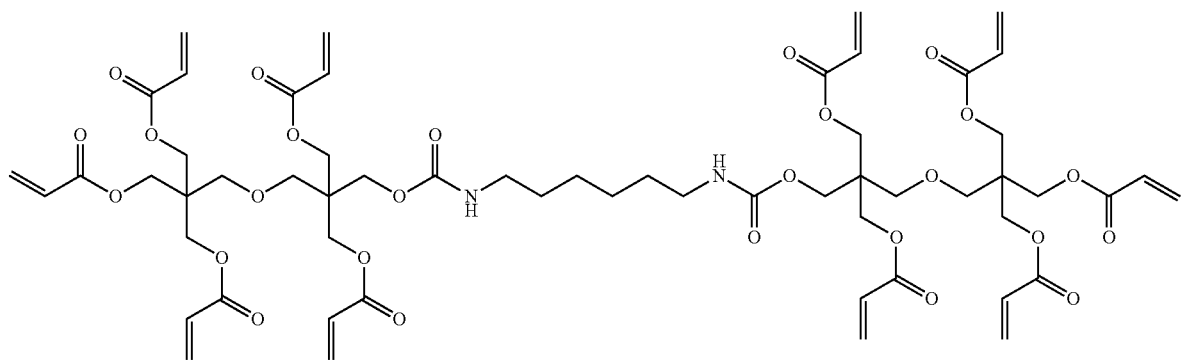 [SMILES: C=CC(=O)OCC(COCC(COC(=O)C=C)(COC(=O)C=C)COC(=O)NCCCCCCNC(=O)OCC(COCC(COC(=O)C=C)(COC(=O)C=C)COC(=O)C=C)(COC(=O)C=C)COC(=O)C=C)(COC(=O)C=C)COC(=O)C=C]
[Polymerizable Compound 3]
M3-4: the following compound
A star-shaped polymer having the following structure in which the composition of the following polymer chains is a/b/c=33/42/25 in terms of the molar ratio of monomers polymerized.
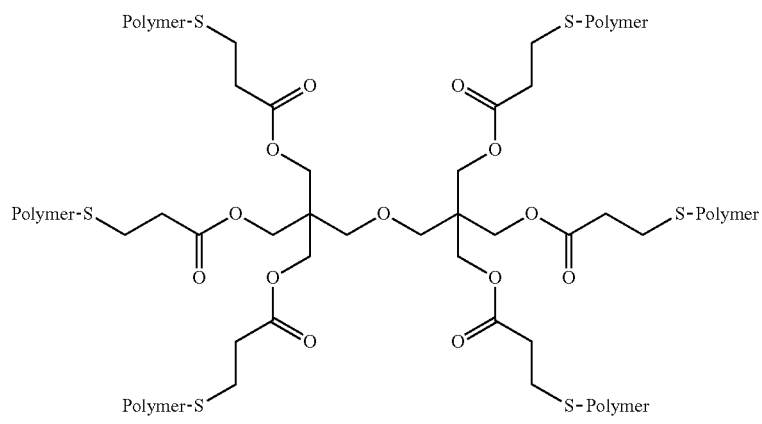
Polymer moiety -continued

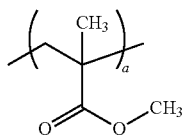 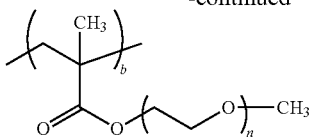 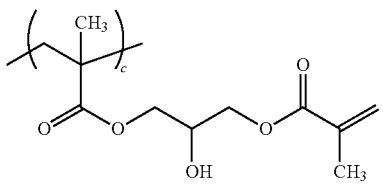

[Color Developing Agent]
C-1 and C-2: the following compounds

C-1

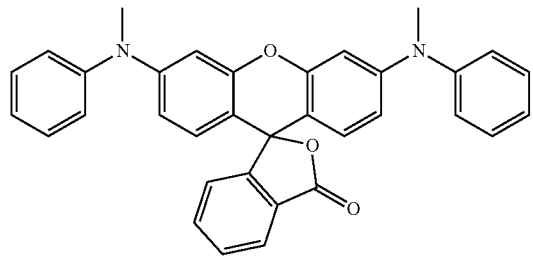

C-2

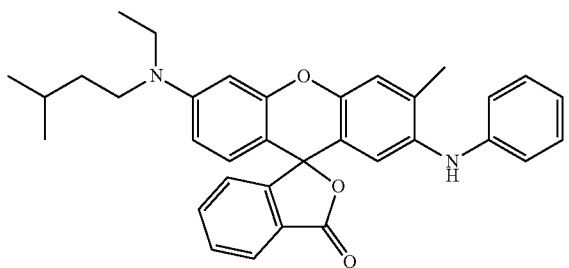

As is evident from the results described in Table 2, the lithographic printing plate precursors of Examples 1 to 21 that are the lithographic printing plate precursor according to the present disclosure have excellent on-press developability and make it possible to obtain a lithographic printing plate which exhibit excellent printing durability even in a case where a UV ink is used.

Furthermore, as is evident from the results described in Table 2, the lithographic printing plate precursors of Examples 1 to 21 that are the lithographic printing plate precursor according to the present disclosure excellently suppress UV plate missing as well.

Examples 22 to 32

As shown in Table 3, the same process as that in Example 1 was carried out up to the formation of an image-recording layer.

<Formation of Protective Layer>

The image-recording layer was bar-coated with a coating liquid for a protective layer containing the components shown in the following Table 4 (the coating liquid for a protective layer contained the components shown in Table 4, and the solid content thereof was adjusted to 20% by mass by using deionized water), followed by drying in an oven at 120° C. for 60 seconds, thereby forming a protective layer having a dry coating amount of 0.50 g/m². A lithographic printing plate precursor was obtained through the above steps.

<Evaluation of Lithographic Printing Plate Precursor>

UV printing durability, suppression of UV plate missing, and on-press developability (immediately after exposure) were evaluated in the same manner as described above.

[Temporal On-Press Developability]

The lithographic printing plate precursor was set at a position of an illuminance of 1,000 1x by using a pocket-type illuminance meter ANA-F9 manufactured by TOKYO PHOTOELECTRIC CO., LTD., and irradiated for 2 hours with white light from a light source, OSRAM FLR40SW fluorescent lamp manufactured by Mitsubishi Electric Corporation, in an environment with a room temperature (25° C.) and a humidity of 50%. By using the lithographic printing plate having undergone exposure, on-press developability (2 hours after exposure to white light) was measured in the same manner as in the evaluation of on-press developability described above. The results are shown in Table 4.

[Visibility (Color Developability): Measurement of Brightness Change ΔL Before and after Exposure]

In Luxel PLATESETTER T-9800 manufactured by FUJI-FILM Graphic Systems that was equipped with an infrared semiconductor laser with a wavelength of 830 nm, the lithographic printing plate precursor was exposed under the conditions of output of 99.5%, outer drum rotation speed of 220 rpm, and resolution of 2,400 dpi (dots per inch, 1 inch=25.4 mm (energy density of 110 mJ/cm²), immediately after exposure and after the 24 hours of storage in a dark place (25° C.) subsequent to exposure. The exposure was carried out in an environment of 25° C. and 50% RH.

The brightness change of the lithographic printing plate precursor before and after exposure was measured. The brightness change was measured using a spectrocolorimeter eXact manufactured by X-Rite, Incorporated. By using the L* value (brightness) in the L*a*b* color space, the absolute value of a difference between the L* value of the image-recording layer after the exposure and the L* value of the image-recording layer before the exposure was adopted as the brightness change ΔL. In the evaluation, the larger the ΔL, the better the visibility of the exposed portion. The value ΔL determined using the lithographic printing plate precursor immediately after exposure is listed in the column of "ΔL (immediately after exposure)" in Table 3. The value ΔL determined using the lithographic printing plate precursor after the 24 hours of storage is listed in the column of "ΔL (after 24 hours)" in Table 3.

[Scratch Resistance (Suppression of Scratches and Contamination)]

In Luxel PLATESETTER T-6000III manufactured by FUJIFILM Corporation that was equipped with an infrared semiconductor laser, each of the obtained lithographic printing plate precursors was exposed under the conditions of outer drum rotation speed of 1,000 rpm (revolutions per minute), a laser output of 70%, and resolution of 2,400 dpi (dots per inch). After the exposure treatment, the lithographic printing plate obtained in an environment of a temperature of 25° C. and a humidity of 70% was scratched by a scratch tester.

As the scratch tester, HEIDON scratching Intersity TESTER HEIDEN-18 was used. In addition, a sapphire needle having a diameter of 0.1 mm was used, and the scratch load was set to 50 (g). Without being subjected to a development treatment, the scratched plate was mounted on the plate cylinder of DIA IF2 printer manufactured by Mitsubishi Heavy Industries, Ltd. By using dampening water containing IF102 (manufactured by FUJIFILM Corporation)/tap water=3/97 (volume ratio) and Values-G(N) black ink (manufactured by DIC Corporation), on-press development was performed by supplying the dampening water and the ink according to the standard automatic printing start method of DIA IF2. Then, printing was performed using TOKUBISHI art paper (ream weight: 76.5 kg, manufactured by MITSUBISHI PAPER MILLS LIMITED.) at a printing rate of 10,000 sheets/hour, and whether the scratched portion turned into a printing stain was evaluated. The results are shown in Table 3. In addition, regarding the intermediate points such as 9 points and 7 points, in a case where the scratches and contamination of an example are at the intermediate level of the upper evaluation standard, the intermediate points were given to the example. The evaluation standards of 10 to 6 points are preferable.

—Evaluation Standard—

10 points: The scratched portion does not turn into a printing stain.
8 points: Slight printing stains that cannot be visually identified are observed on the scratched portion.
6 points: Slight printing stains are visually observed on the scratched portion.
4 points: Printing stains are visually observed on the scratched portion.
2 points: Noticeable printing stains are observed on the scratched portion.

TABLE 3

| | | Image-recording layer | | | | | | |
|---|---|---|---|---|---|---|---|---|
| | | Polymerizable compound 1 | | | | Polymerizable compound 2 | | |
| | | Type | Molecular weight | Number of functional groups | Amount of addition M1 (mg/m$^2$) | Type | Molecular weight | Number of functional groups | Amount of addition M2 (mg/m$^2$) |
| Example | 22 | M1-1 | 578 | 6 | 0.24 | M2-1 | 1,428 | 15 | 0.04 |
| | 23 | M1-1 | 578 | 6 | 0.24 | M2-1 | 1,428 | 15 | 0.04 |
| | 24 | M1-1 | 578 | 6 | 0.24 | M2-1 | 1,428 | 15 | 0.04 |
| | 25 | M1-1 | 578 | 6 | 0.24 | M2-1 | 1,428 | 15 | 0.04 |
| | 26 | M1-1 | 578 | 6 | 0.24 | M2-1 | 1,428 | 15 | 0.04 |
| | 27 | M1-1 | 578 | 6 | 0.24 | M2-1 | 1,428 | 15 | 0.04 |
| | 28 | M1-1 | 578 | 6 | 0.24 | M2-1 | 1,428 | 15 | 0.04 |
| | 29 | M1-1 | 578 | 6 | 0.24 | M2-1 | 1,428 | 15 | 0.04 |
| | 30 | M1-1 | 578 | 6 | 0.24 | M2-1 | 1,428 | 15 | 0.04 |
| | 31 | M1-1 | 578 | 6 | 0.24 | M2-1 | 1,428 | 15 | 0.04 |
| | 32 | M1-1 | 578 | 6 | 0.24 | M2-1 | 1,428 | 15 | 0.04 |

| | | | Image-recording layer | | | | |
|---|---|---|---|---|---|---|---|
| | | | Polymerizable compound 3 | | | | |
| | | Ratio M2/(M1 + M2) | Type | Molecular weight | Amount of addition M3 (mg/m$^2$) | C=C valence | Ratio M3/(M1 + M2 + M3) | Color developing agent |
| Example | 22 | 0.14 | M3-1 | 12,000 | 0.07 | 7 | 0.20 | S-15 |
| | 23 | 0.14 | M3-1 | 12,000 | 0.07 | 7 | 0.20 | S-15 |
| | 24 | 0.14 | M3-1 | 12,000 | 0.07 | 7 | 0.20 | S-15 |
| | 25 | 0.14 | M3-1 | 12,000 | 0.07 | 7 | 0.20 | S-15 |
| | 26 | 0.14 | M3-1 | 12,000 | 0.07 | 7 | 0.20 | S-15 |
| | 27 | 0.14 | M3-1 | 12,000 | 0.07 | 7 | 0.20 | S-15 |
| | 28 | 0.14 | M3-1 | 12,000 | 0.07 | 7 | 0.20 | S-15 |
| | 29 | 0.14 | M3-1 | 12,000 | 0.07 | 7 | 0.20 | S-15 |
| | 30 | 0.14 | M3-1 | 12,000 | 0.07 | 7 | 0.20 | S-15 |
| | 31 | 0.14 | M3-1 | 12,000 | 0.07 | 7 | 0.20 | S-15 |
| | 32 | 0.14 | M3-1 | 12,000 | 0.07 | 7 | 0.20 | S-15 |

TABLE 4

| | | Protective layer | | | | | | | |
|---|---|---|---|---|---|---|---|---|---|
| | | Discoloring compound | | Water-soluble polymer | | | Hydrophobic polymer | | Acid color developing agent | |
| | | Type | Amount of addition | PVA-1 | PVA-2 | WP-1 | P-1 | P-2 | S-1 | S-2 |
| Example | 22 | IR-1 | 0.02 | 1.0 | — | — | — | — | — | — |
| | 23 | IR-1 | 0.2 | — | 1.0 | — | — | — | — | — |
| | 24 | IR-2 | 0.02 | 1.0 | — | — | — | — | — | — |
| | 25 | IR-3 | 0.02 | — | 0.1 | — | — | — | — | — |
| | 26 | IR-3 | 0.02 | 0.4 | 1.6 | — | — | — | — | — |
| | 27 | IR-3 | 0.02 | — | 1.0 | 0.2 | — | — | — | — |
| | 28 | IR-3 | 0.02 | — | 0.7 | 0.2 | 0.5 | — | — | — |
| | 29 | IR-5 | 0.02 | — | 0.7 | 0.2 | — | 0.5 | — | — |
| | 30 | IR-6 | 0.02 | — | 0.7 | 0.2 | 0.5 | — | — | — |
| | 31 | IR-4 | 0.02 | — | 0.7 | 0.2 | 0.5 | — | 0.05 | — |
| | 32 | IR-7 | 0.02 | — | 0.7 | 0.2 | 0.5 | — | — | 0.05 |

| | | Protective layer | | Evaluation | | | | | | |
|---|---|---|---|---|---|---|---|---|---|---|
| | | Acid generator Int-1 | Oil sensitizing agent A-1 | UV printing durability | Suppression of UV plate missing | ΔL (immediately after exposure) | ΔL (after 24 hours) | On-press developability (immediately after exposure) | On-press developability (after 2 hours of exposure to white light) | Scratch resistance (raw plate) |
| Example | 22 | — | — | 100 | 8 | 4 | 4 | 15 | 15 | 5 |
| | 23 | — | — | 100 | 8 | 10 | 10 | 15 | 15 | 5 |
| | 24 | — | — | 100 | 8 | 5 | 5 | 15 | 15 | 5 |
| | 25 | — | — | 100 | 8 | 10 | 10 | 15 | 15 | 4 |
| | 26 | — | — | 100 | 8 | 3 | 3 | 15 | 15 | 6 |
| | 27 | — | — | 100 | 8 | 6 | 6 | 10 | 10 | 5 |
| | 28 | — | — | 100 | 8 | 6 | 6 | 10 | 10 | 9 |
| | 29 | — | — | 100 | 8 | 6 | 6 | 10 | 10 | 9 |
| | 30 | — | 0.02 | 100 | 8 | 6 | 6 | 10 | 10 | 10 |
| | 31 | 0.1 | — | 100 | 8 | 12 | 10 | 10 | 10 | 5 |
| | 32 | 0.1 | — | 100 | 8 | 8 | 6 | 10 | 10 | 5 |

In Table 3, "C=C valence" represents an ethylenically unsaturated bond valence, and the unit is mmol/g.

Details of the compounds listed in Table 4 other than the above compounds will be shown below.

[Discoloring Compound]

IR-1 to IR-7: compounds having the following structures

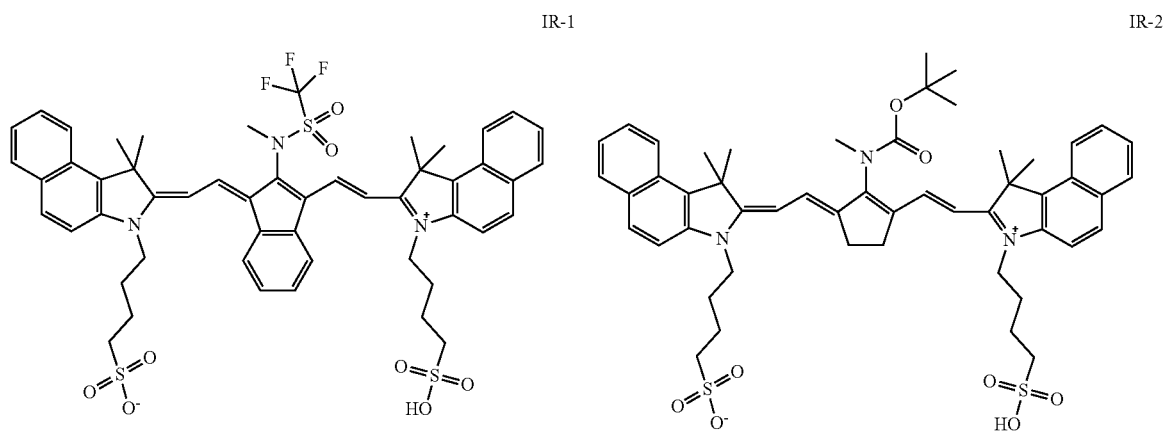

IR-1

IR-2

-continued
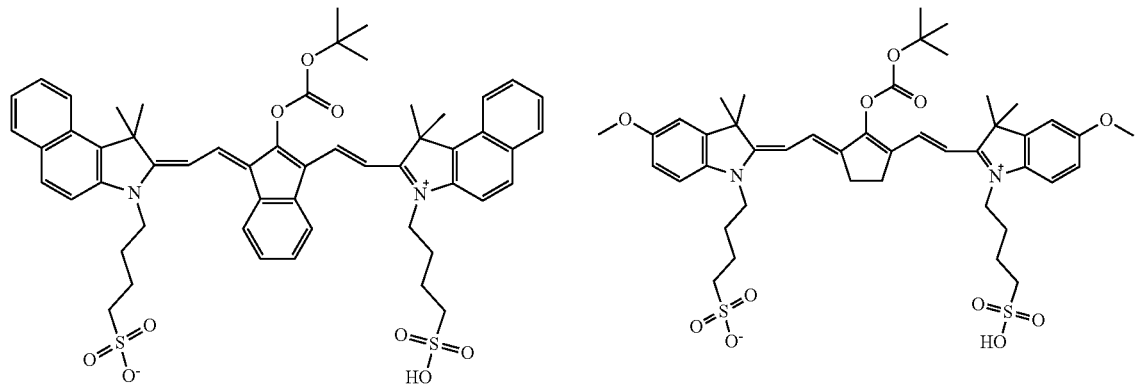
IR-3
IR-4
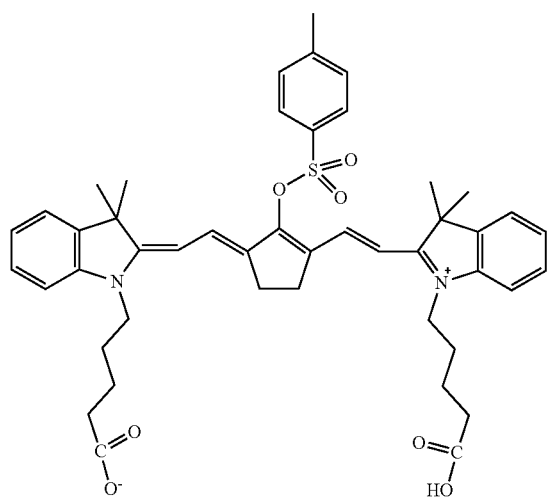
IR-5
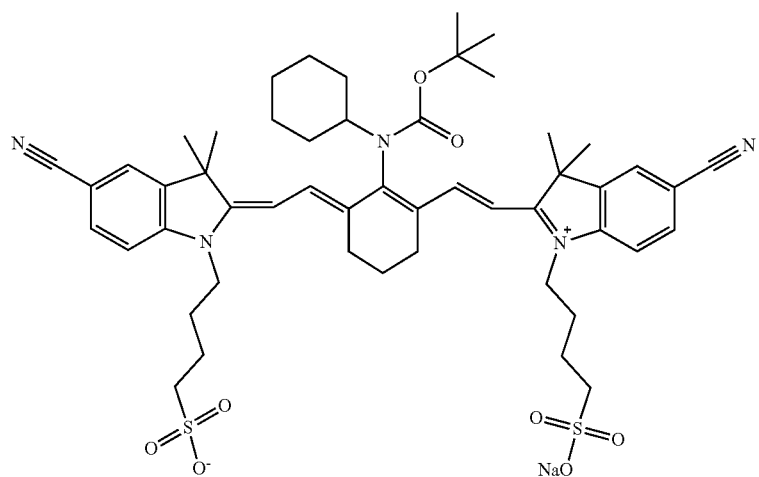
IR-6

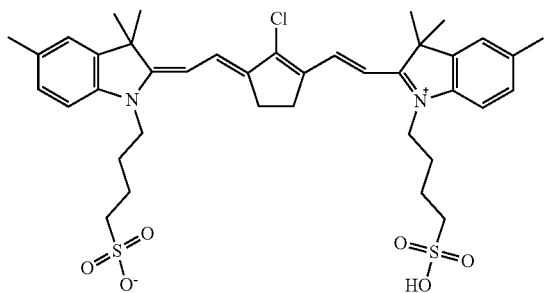

IR-7

[Acid Color-Developing Agent]
S-1: Compound having the following structure
S-2: Compound having the following structure

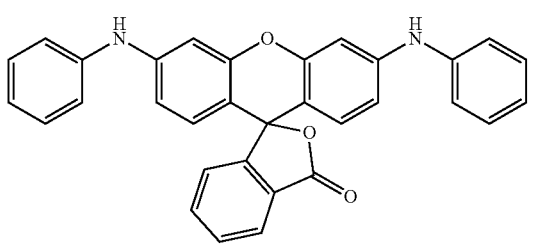

S-1

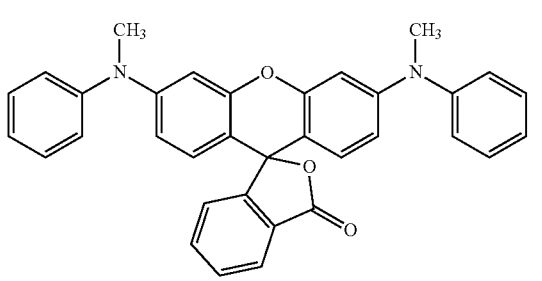

S-2

[Water-Soluble Polymer]
PVA-1: Mowiol 4-88 (registered trademark) manufactured by Sigma-Aldrich CO. LLC, 4-88
PVA-2: Mowiol 8-88 (registered trademark) manufactured by Sigma-Aldrich CO. LLC, 8-88
WP-1: compound having the following structure (polyvinylpyrrolidone, weight-average molecular weight 45,000)

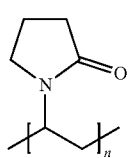

WP-1

[Hydrophobic Polymer]
P-1: compound having the following structure (polyvinylidene chloride resin, weight-average molecular weight 40,000)
P-2: compound having the following structure (styrene-methyl acrylate copolymer, n=0.3, m=0.7, weight-average molecular weight 40,000)

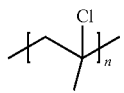

P-1

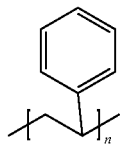

P-2

[Acid Generator]
Int-1: compound having the following structure, Ph represents a phenyl group.

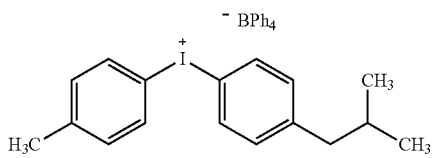

Int-1

[Oil Sensitizing Agent]
A-1: compound having the following structure

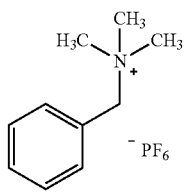

A-1

As is evident from the results described in Table 3 and Table 4, the lithographic printing plate precursors of Examples 22 to 32 that are the lithographic printing plate precursor according to the present disclosure have excellent on-press developability and make it possible to obtain a lithographic printing plate which exhibit excellent printing durability even in a case where a UV ink is used.

Furthermore, as is evident from the results described in Table 3 and Table 4, the lithographic printing plate precursors of Examples 22 to 32 that are the lithographic printing plate precursor according to the present disclosure excellently suppress UV plate missing and are also excellent in visibility (color developability), temporal visibility (temporal color developability), temporal on-press developability, and scratch resistance.

The entire disclosure of Japanese Patent Application No. 2019-180623, filed Sep. 30, 2019, is incorporated into the present specification by reference.

All of documents, patent applications, and technical standards described in the present specification are incorporated into the present specification by reference to approximately the same extent as a case where it is specifically and respectively described that the respective documents, patent applications, and technical standards are incorporated by reference.

EXPLANATION OF REFERENCES

18: aluminum plate
ta: anodic reaction time
tc: cathodic reaction time
tp: time taken for current to reach peak from 0
Ia: peak current on anodic cycle side
Ic: peak current on cathodic cycle side
AA: current of anodic reaction of aluminum plate
CA: current of cathodic reaction of aluminum plate
10: lithographic printing plate precursor
12a, 12b: aluminum support
14: undercoat layer
16: image-recording layer
20a, 20b: anodic oxide film
22a, 22b: micropore
24: large diameter portion
26: small diameter portion
D: depth of large diameter portion
50: main electrolytic cell
51: alternating current power source
52: radial drum roller
53a, 53b: main pole
54: electrolytic solution supply port
55: electrolytic solution
56: auxiliary anode
60: auxiliary anode tank
W: aluminum plate
A1: solution supply direction
A2: electrolytic solution discharge direction

What is claimed is:

1. A lithographic printing plate precursor, comprising:
a support; and
an image-recording layer on the support,
wherein the image-recording layer contains an infrared absorber, a polymerization initiator, a polymerizable compound 1, a polymerizable compound 2, and a polymerizable compound 3,
a molecular weight of the polymerizable compound 1 is less than 1,000,
a weight-average molecular weight of the polymerizable compound 2 is 1,000 or more and 3,000 or less,
a weight-average molecular weight of the polymerizable compound 3 is more than 3,000 and 15,000 or less, and
wherein the polymerizable compound 3 is a compound represented by Formula (I),

 Formula (I)

in Formula (I), $A^P$ represents an nP-valent organic group having a hydrogen bonding group, $B^P$ represents a group having two or more polymerizable groups, and nP represents an integer of two or more.

2. The lithographic printing plate precursor according to claim 1,
wherein the number of functional groups of an ethylenically unsaturated group in one molecule of at least one kind of polymerizable compound included in the polymerizable compound 2 is larger than the number of functional groups in one molecule of a polymerizable compound included in the polymerizable compound 1.

3. The lithographic printing plate precursor according to claim 1,
wherein a ratio of a content M3 of the polymerizable compound 3 to a total content M1+M2+M3 of the polymerizable compound 1, the polymerizable compound 2, and the polymerizable compound 3 (M3/(M1+M2+M3)) is 0.1 to 0.8.

4. The lithographic printing plate precursor according to claim 1,
wherein a ratio of a content M2 of the polymerizable compound 2 to a total content M1+M2 of the polymerizable compound 1 and the polymerizable compound 2 (M2/(M1+M2)) is 0.05 to 0.4.

5. The lithographic printing plate precursor according to claim 1,
wherein an ethylenically unsaturated bond valence of the polymerizable compound 3 is 3.0 mmol/g or more.

6. The lithographic printing plate precursor according to claim 1,
wherein the polymerizable group in $B^P$ includes a (meth)acryloxy group.

7. The lithographic printing plate precursor according to claim 1,
wherein the polymerizable group in $B^P$ is a group having 3 or more a (meth)acryloxy groups.

8. The lithographic printing plate precursor according to claim 1,
wherein the hydrogen bonding group in the polymerizable compound 3 is at least one kind of group selected from the group consisting of a urethane group, a urea group, an imide group, an amide group, and a sulfonamide group.

9. The lithographic printing plate precursor according to claim 1,
wherein the image-recording layer is an outermost layer.

10. The lithographic printing plate precursor according to claim 1,
wherein the image-recording layer further contains polymer particles.

11. The lithographic printing plate precursor according to claim 10,
wherein the polymer particles have a hydrophilic group, and
wherein the hydrophilic group is a hydrophilic group represented by Formula Z,

in formula Z, Q represents a divalent linking group, W represents a divalent group having a hydrophilic structure or a divalent group having a hydrophobic structure, Y represents a monovalent group having a hydrophilic structure or a monovalent group having a hydrophobic structure, either W or Y has a hydrophilic structure, and * represents a bonding site with other structures.

12. The lithographic printing plate precursor according to claim 1,
wherein the polymerization initiator includes an electron-donating polymerization initiator, and wherein HOMO of the infrared absorber—HOMO of the electron-donating polymerization initiator is 0.70 eV or less.

13. The lithographic printing plate precursor according to claim 1,
wherein the image-recording layer further contains a color developing agent.

14. The lithographic printing plate precursor according to claim 1, further comprising:
a protective layer containing a discoloring compound on the image-recording layer.

15. The lithographic printing plate precursor according to claim 14,
wherein the protective layer contains a water-soluble polymer and a hydrophobic polymer.

16. A lithographic printing plate precursor comprising:
a support; and
an image-recording layer on the support,
wherein the image-recording layer contains an infrared absorber, a polymerization initiator, a polymerizable compound 1, a polymerizable compound 2, and a polymerizable compound 3,
a molecular weight of the polymerizable compound 1 is less than 1,000,
a weight-average molecular weight of the polymerizable compound 2 is 1,000 or more and 3,000 or less,
a weight-average molecular weight of the polymerizable compound 3 is more than 3,000 and 15,000 or less,
wherein the polymerizable compound 3 has at least one kind of structure selected from the group consisting of an adduct structure, a biuret structure, and an isocyanurate structure.

17. A lithographic printing plate precursor comprising:
a support; and
an image-recording layer on the support,
wherein the image-recording layer contains an infrared absorber, a polymerization initiator, a polymerizable compound 1, a polymerizable compound 2, and a polymerizable compound 3,
a molecular weight of the polymerizable compound 1 is less than 1,000,
a weight-average molecular weight of the polymerizable compound 2 is 1,000 or more and 3,000 or less,
a weight-average molecular weight of the polymerizable compound 3 is more than 3,000 and 15,000 or less,
wherein the polymerizable compound 3 has a structure represented by any of Formula (A-1) to Formula (A-3),

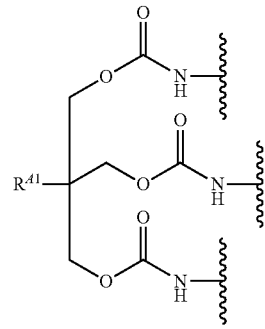

(A-1)

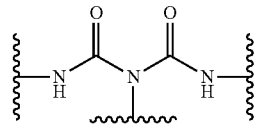

(A-2)

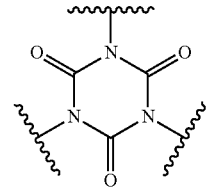

(A-3)

in Formula (A-1), $R^{41}$ represents a hydrogen atom or an alkyl group having 1 to 8 carbon atoms, and a portion of a wavy line represents a bonding position with other structures.

18. A method for preparing a lithographic printing plate, comprising:
a step of exposing the lithographic printing plate precursor according to claim 1 in the shape of an image; and
a step of supplying at least one material selected from the group consisting of a printing ink and dampening water on a printer so as to remove an image-recording layer in a non-image area.

19. A lithographic printing method, comprising:
a step of exposing the lithographic printing plate precursor according to claim 1 in the shape of an image;
a step of supplying at least one material selected from the group consisting of a printing ink and dampening water so as to remove the image-recording layer in a non-image area on a printer and to prepare a lithographic printing plate; and
a step of performing printing by using the obtained lithographic printing plate.

* * * * *